US010388176B2

(12) United States Patent
Wallace et al.

(10) Patent No.: US 10,388,176 B2
(45) Date of Patent: Aug. 20, 2019

(54) SIMULATOR FOR SKILL-ORIENTED TRAINING

(71) Applicants: Matthew Wallace, South Windsor, CT (US); David Zboray, Trumball, CT (US); Alejo Fudge, Manchester, CT (US); Brian Burke, Manchester, CT (US); Chris Groot, Vernon, CT (US); Paul Ong, Hartford, CT (US); Shawn Kennedy, Vernon, CT (US); Zach Lenker, Vernon, CT (US); Frank Bignone, Beijing (CN); Leslie Brooks Solomon, New York, NY (US)

(72) Inventors: Matthew Wallace, South Windsor, CT (US); David Zboray, Trumball, CT (US); Alejo Fudge, Manchester, CT (US); Brian Burke, Manchester, CT (US); Chris Groot, Vernon, CT (US); Paul Ong, Hartford, CT (US); Shawn Kennedy, Vernon, CT (US); Zach Lenker, Vernon, CT (US); Frank Bignone, Beijing (CN); Leslie Brooks Solomon, New York, NY (US)

(73) Assignee: VRSim, Inc., East Hartford, CT (US)

( * ) Notice: Subject to any disclaimer, the term of this patent is extended or adjusted under 35 U.S.C. 154(b) by 198 days.

(21) Appl. No.: 14/093,284

(22) Filed: Nov. 29, 2013

(65) Prior Publication Data
US 2014/0162224 A1 Jun. 12, 2014

Related U.S. Application Data

(60) Provisional application No. 61/842,150, filed on Jul. 2, 2013, provisional application No. 61/730,824, filed on Nov. 28, 2012.

(51) Int. Cl.
*G09B 5/06* (2006.01)
*G09B 19/24* (2006.01)
(Continued)

(52) U.S. Cl.
CPC .............. *G09B 5/06* (2013.01); *E02F 9/2008* (2013.01); *G06F 17/5009* (2013.01); *G06T 19/00* (2013.01); *G09B 19/24* (2013.01)

(58) Field of Classification Search
CPC ....... G09B 5/06; G09B 19/24; G06F 17/5009; B23K 9/095; B23K 9/0953
(Continued)

(56) References Cited

U.S. PATENT DOCUMENTS 5,844,392 A * 12/1998 Peurach ................. B25J 9/1689
                                                           318/561
6,227,862 B1 * 5/2001 Harkness ................. G09B 9/05
                                                           434/238

(Continued)

OTHER PUBLICATIONS

Office Action issued in Canadian Patent Application No. 2,892,974 dated Sep. 8, 2016, 4 pages.
(Continued)

*Primary Examiner* — Robert J Utama
(74) *Attorney, Agent, or Firm* — MKG, LLC

(57) ABSTRACT

A skill-based training system includes a processing system having a processor, memory coupled to the processor with executable instructions stored therein, and an input-output controller coupled to the processor and to input and output devices. The memory includes lesson plans that outline skill-based tasks and activities, and predetermined performance criteria. The processor is configured by the instructions to present interfaces on the output devices simulating a virtual training environment. The processor is configured to receive input signals representative of performing the tasks and activities in the virtual environment, and to evalu-
(Continued)

ate the performance by comparing the performed tasks and activities to the criteria, to determine a score and to present the score on the output devices. The system includes work orders categorized by the lesson plans and defining within an increasing progression of a degree of skill, knowledge, critical thinking and problem solving needed to complete the tasks and activities.

29 Claims, 73 Drawing Sheets

(51) Int. Cl.
  *G06F 17/50* (2006.01)
  *G06T 19/00* (2011.01)
  *E02F 9/20* (2006.01)
(58) Field of Classification Search
  USPC .......................................................... 434/219
  See application file for complete search history.

(56) References Cited

U.S. PATENT DOCUMENTS

| | | | | |
|---|---|---|---|---|
| 6,244,987 | B1* | 6/2001 | Ohsuga | A63B 24/00 434/247 |
| 7,409,392 | B2* | 8/2008 | Greer | G06F 17/30321 |
| 7,814,041 | B2 | 10/2010 | Caporale et al. | |
| 7,817,162 | B2 | 10/2010 | Bolick et al. | |
| 7,839,416 | B2* | 11/2010 | Ebensberger | G09B 9/00 345/592 |
| 8,473,852 | B2* | 6/2013 | Russell | G05B 15/02 715/757 |
| 8,512,043 | B2* | 8/2013 | Choquet | A61B 5/1124 219/50 |
| 8,560,482 | B2 | 10/2013 | Miranda et al. | |
| RE45,132 | E | 9/2014 | Caporale et al. | |
| 9,159,151 | B2 | 10/2015 | Perez et al. | |
| 9,224,303 | B2* | 12/2015 | Colvin | G09B 5/00 |
| 2002/0106622 | A1* | 8/2002 | Osborne | G09B 5/12 434/350 |
| 2003/0197700 | A1* | 10/2003 | Tanaka | G06T 13/00 345/419 |
| 2004/0121295 | A1* | 6/2004 | Stuart | G09B 23/28 434/262 |
| 2004/0166484 | A1* | 8/2004 | Budke | G09B 19/00 434/433 |
| 2004/0180315 | A1* | 9/2004 | Toohey | G09B 5/06 434/307 R |
| 2004/0224294 | A1* | 11/2004 | Heininger | A61B 6/00 434/262 |
| 2006/0004555 | A1* | 1/2006 | Jones | G06F 19/327 703/6 |
| 2007/0209585 | A1* | 9/2007 | Ebensberger | G09B 11/10 118/682 |
| 2007/0209586 | A1* | 9/2007 | Ebensberger | G09B 9/00 118/682 |
| 2007/0238085 | A1* | 10/2007 | Colvin | G09B 5/00 434/365 |
| 2008/0268418 | A1* | 10/2008 | Tashner | G09B 7/00 434/365 |
| 2009/0112538 | A1* | 4/2009 | Anderson | G06Q 10/06 703/6 |
| 2010/0077959 | A1* | 4/2010 | Treloar | G09B 11/10 118/681 |
| 2011/0137844 | A1* | 6/2011 | Miranda | G06N 5/02 706/47 |
| 2011/0216185 | A1* | 9/2011 | Laws | H04N 7/18 348/121 |
| 2012/0122062 | A1* | 5/2012 | Yang | G09B 9/00 434/219 |
| 2012/0123758 | A1* | 5/2012 | Kevan | G09B 19/00 703/6 |
| 2013/0189656 | A1* | 7/2013 | Zboray | G06F 3/011 434/219 |
| 2013/0323695 | A1* | 12/2013 | Zboray | G09B 19/24 434/219 |
| 2015/0079565 | A1* | 3/2015 | Miller | G09B 23/281 434/252 |
| 2015/0310758 | A1* | 10/2015 | Daddona | G09B 9/02 434/62 |
| 2016/0267806 | A1* | 9/2016 | Hsu | G09B 19/24 |
| 2016/0358383 | A1* | 12/2016 | Gauglitz | G06T 19/006 |
| 2018/0090029 | A1* | 3/2018 | Fisher | A61B 34/20 |

OTHER PUBLICATIONS

Skills2Learn Video Library—The UK's premier developer of interactive e-learning, virtual reality and creative multimedia programmes. Skills2Learn. Jun. 8, 2011 (Jun. 8, 2011). Retrieved on Apr. 21, 2014 (Apr. 21, 2014). Retrieved from the Internet: URL <http://skills2learnvideo.wordpress.com/> entire documents.

\* cited by examiner

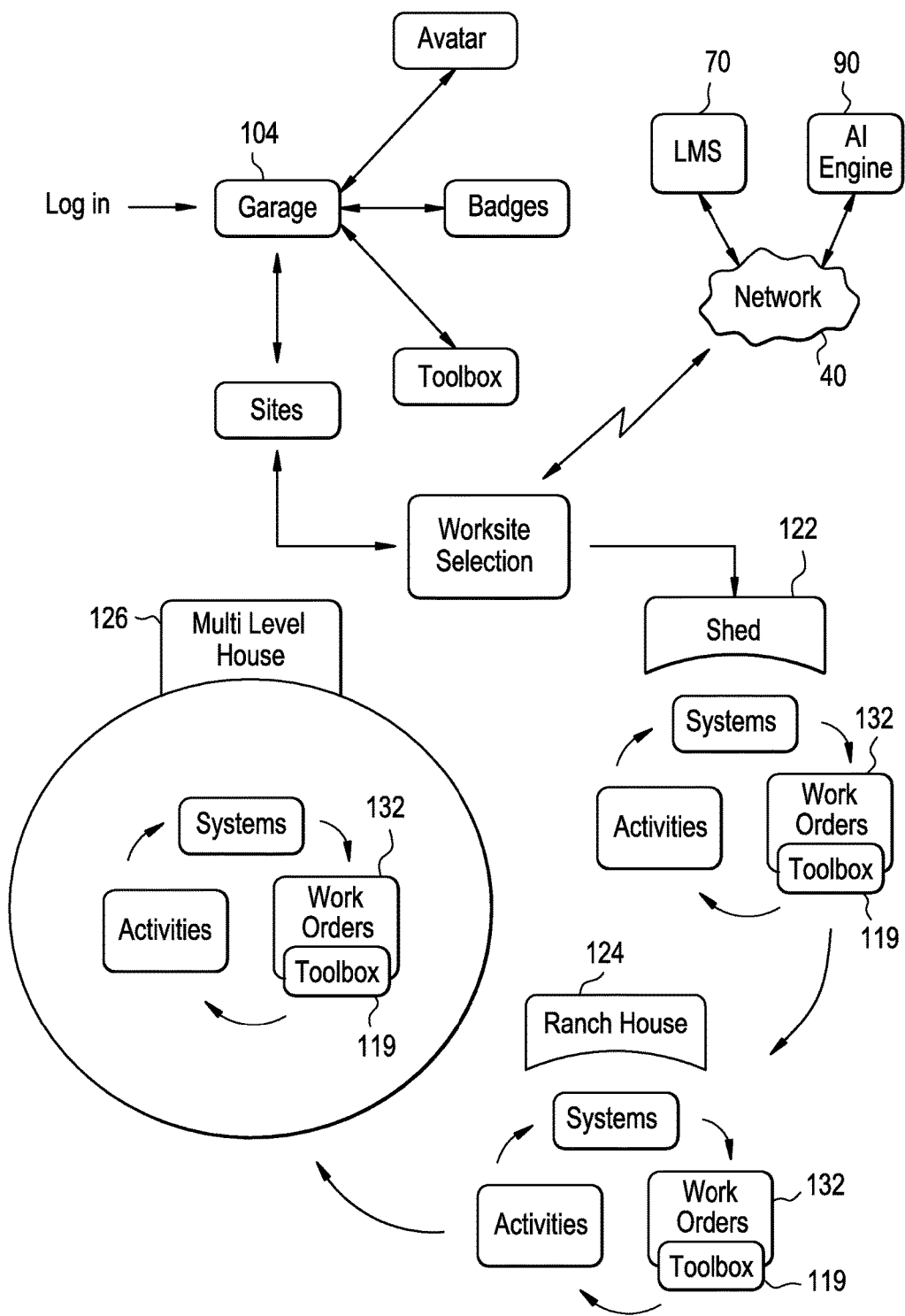

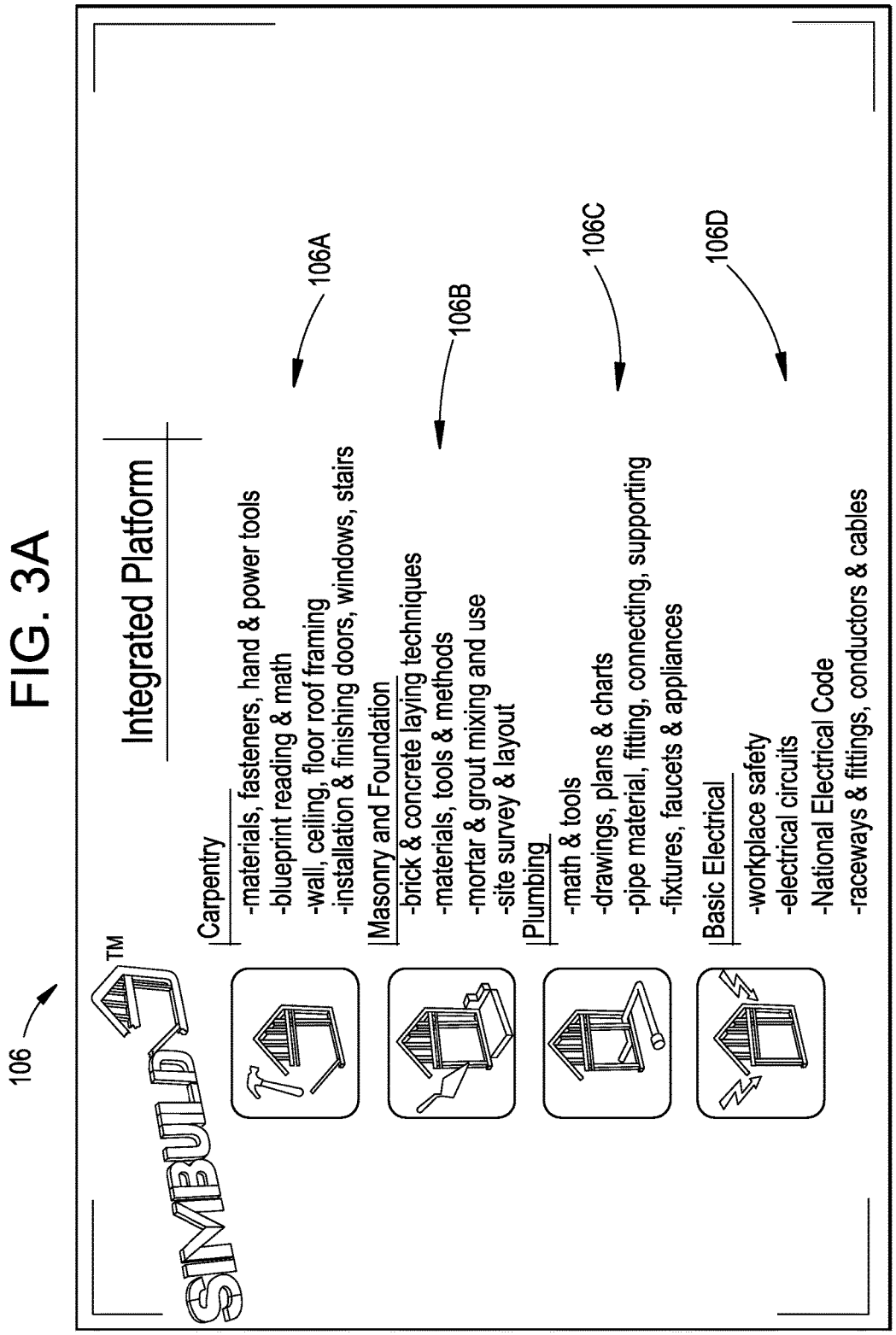

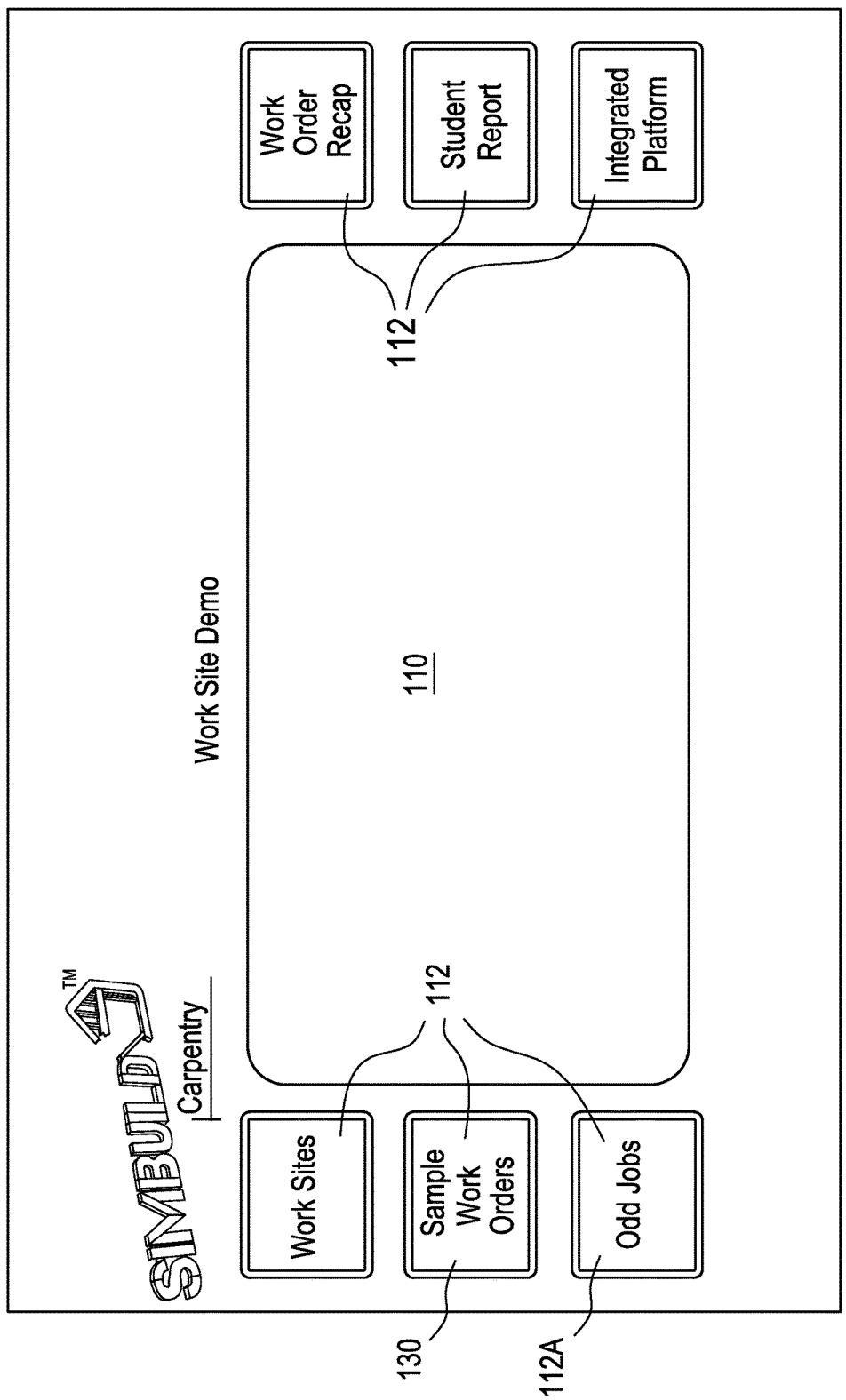

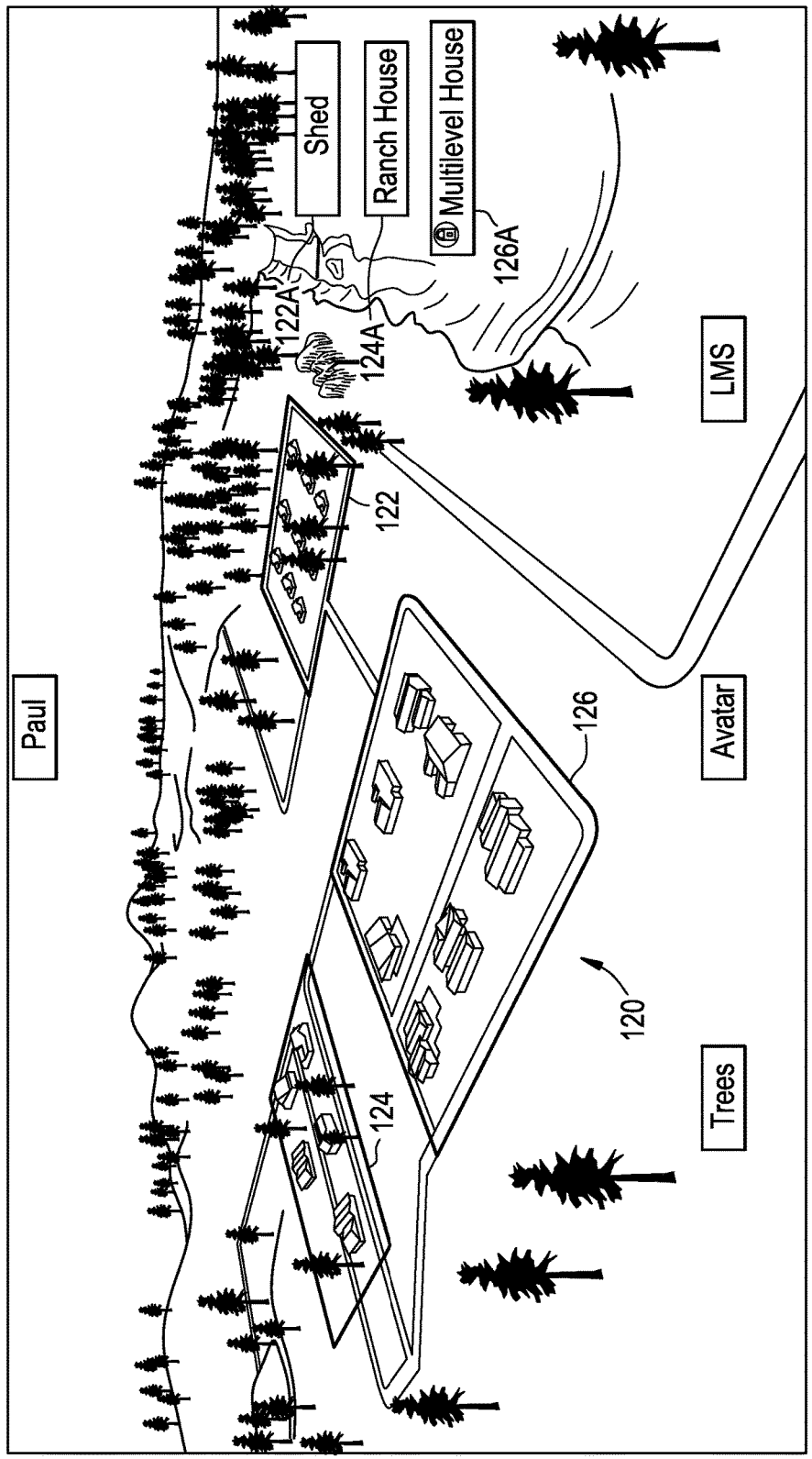

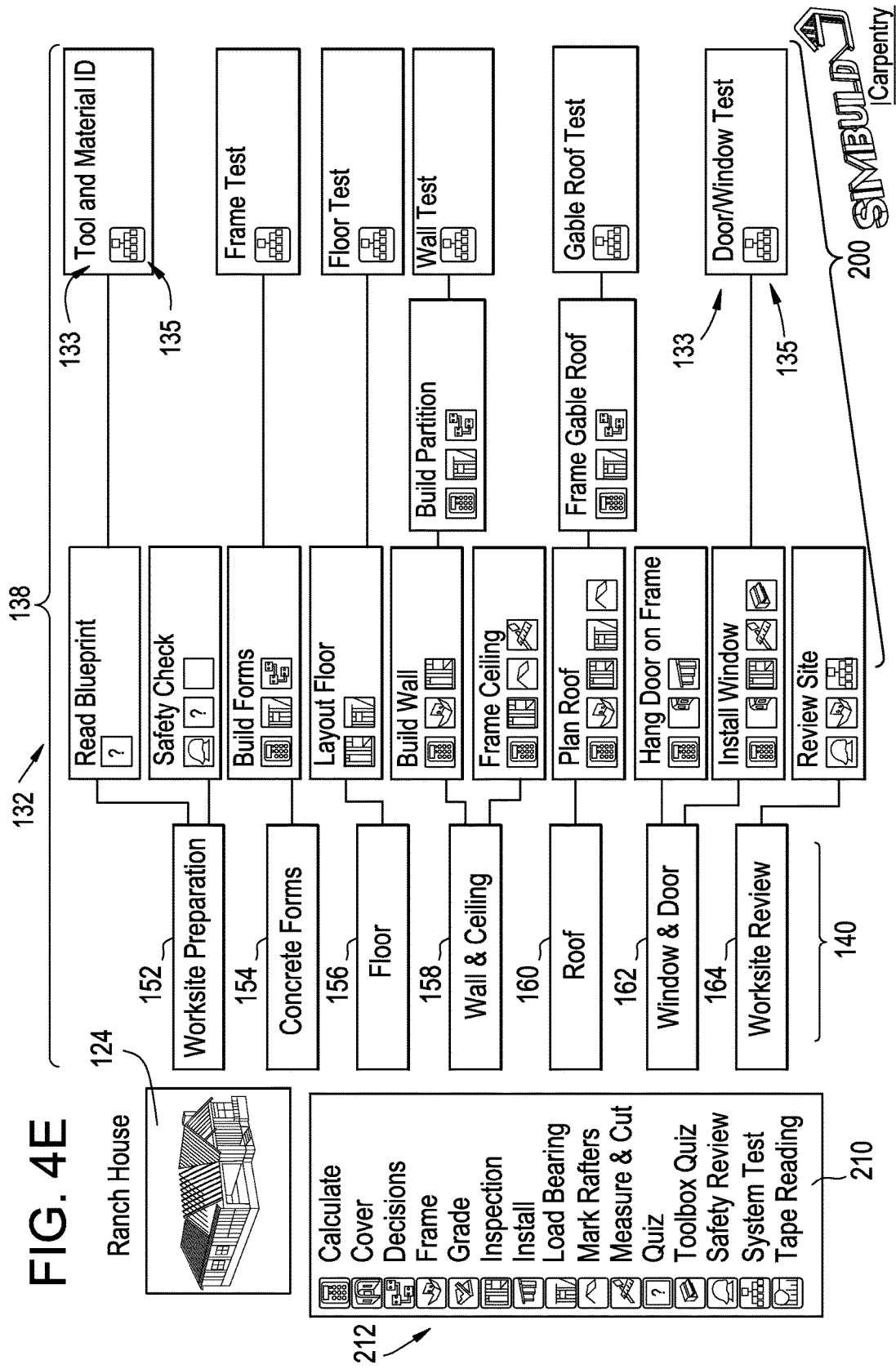

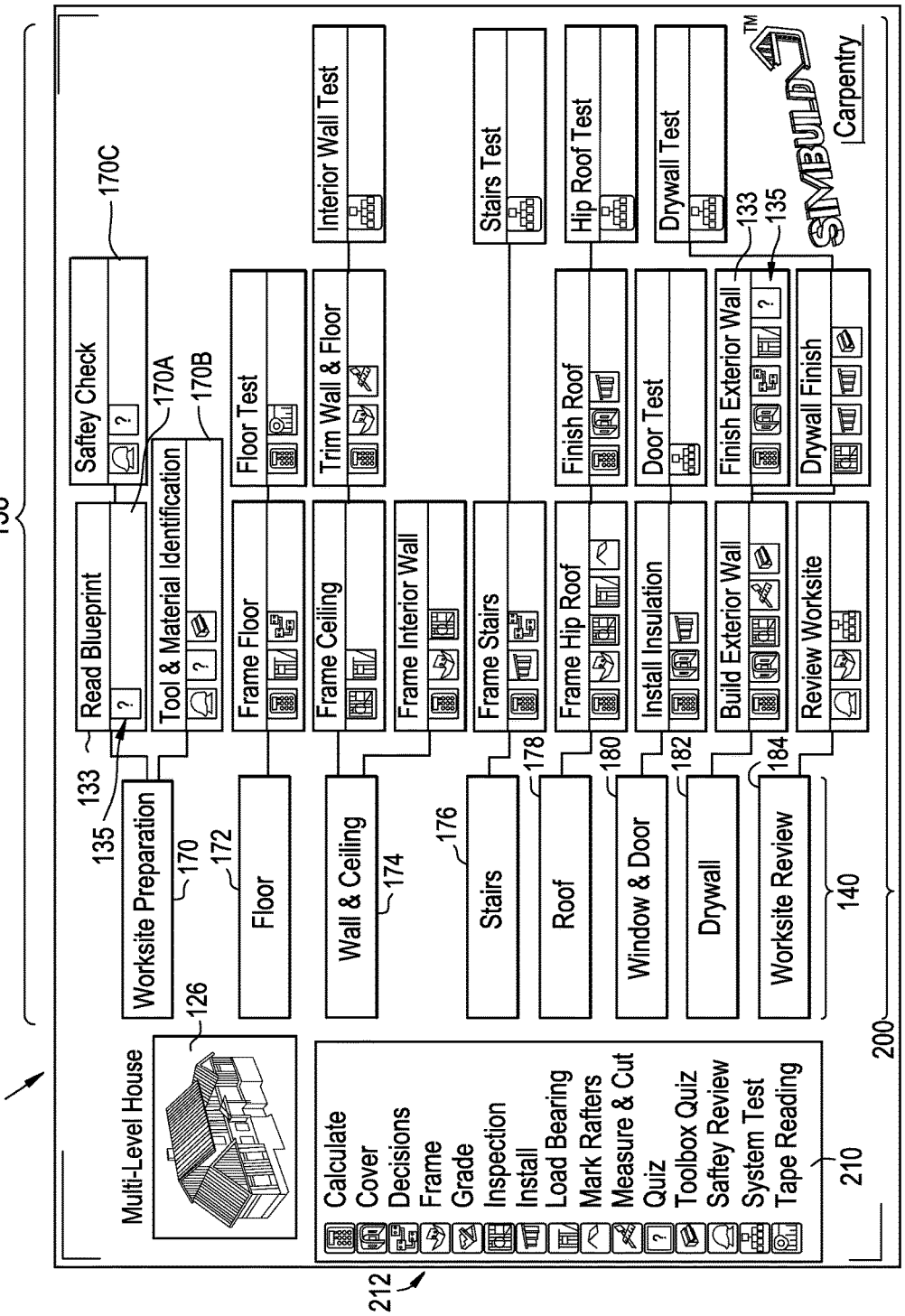

FIG. 5

SIMBUILD™  Shed
Carpentry   S.II-Construct Exterior Wall

Shed Blueprint 71 1/4"   63 1/4"
33 1/2"   33 1/2"
Header
194B
Trimmer Studs
84' 24'
194
12-0'

132
192

Activities   196   194A

1. Review Blueprint
   -Calculate lumber needed
2. Measure & cut lumber to lengths as required by blueprint
3. Mark sole plate with correct symbology for assembly
4. Select location for wall section on shed (correct position & orientation)
5. Place studs, headers cripple studs and jack studs following the blueprint
6. Nail the components together
7. Inspect your work, evaluate your score

190

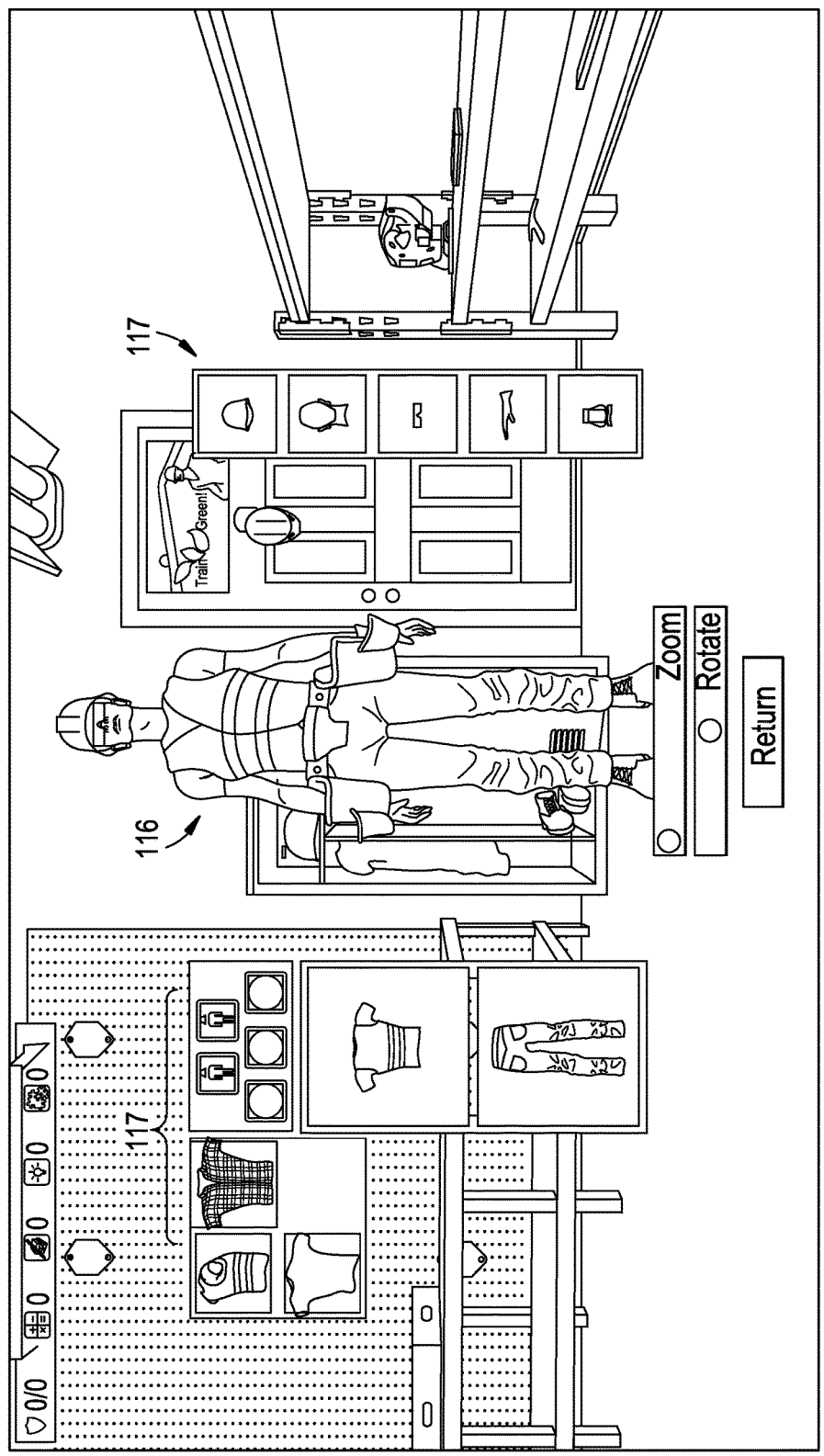

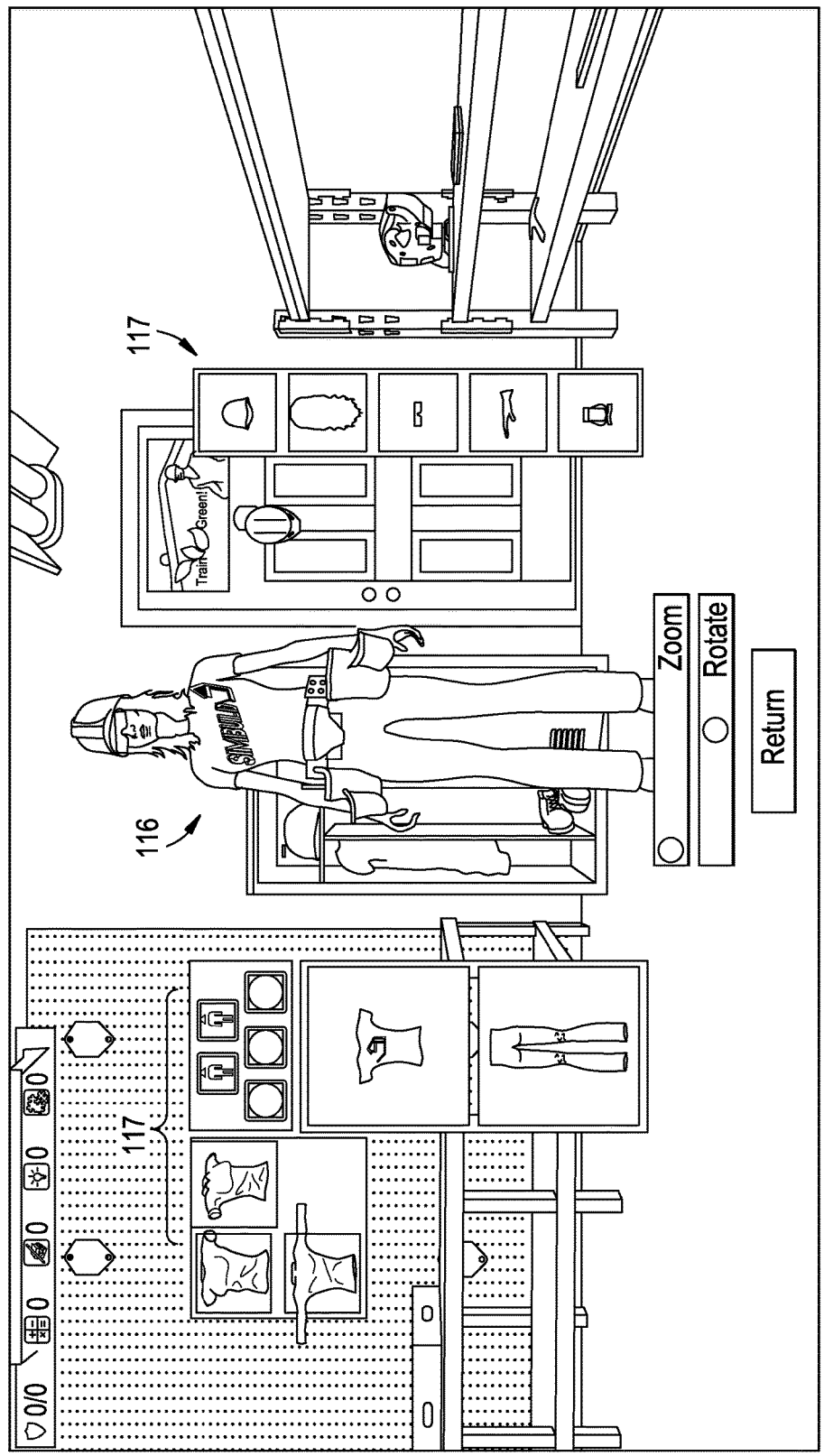

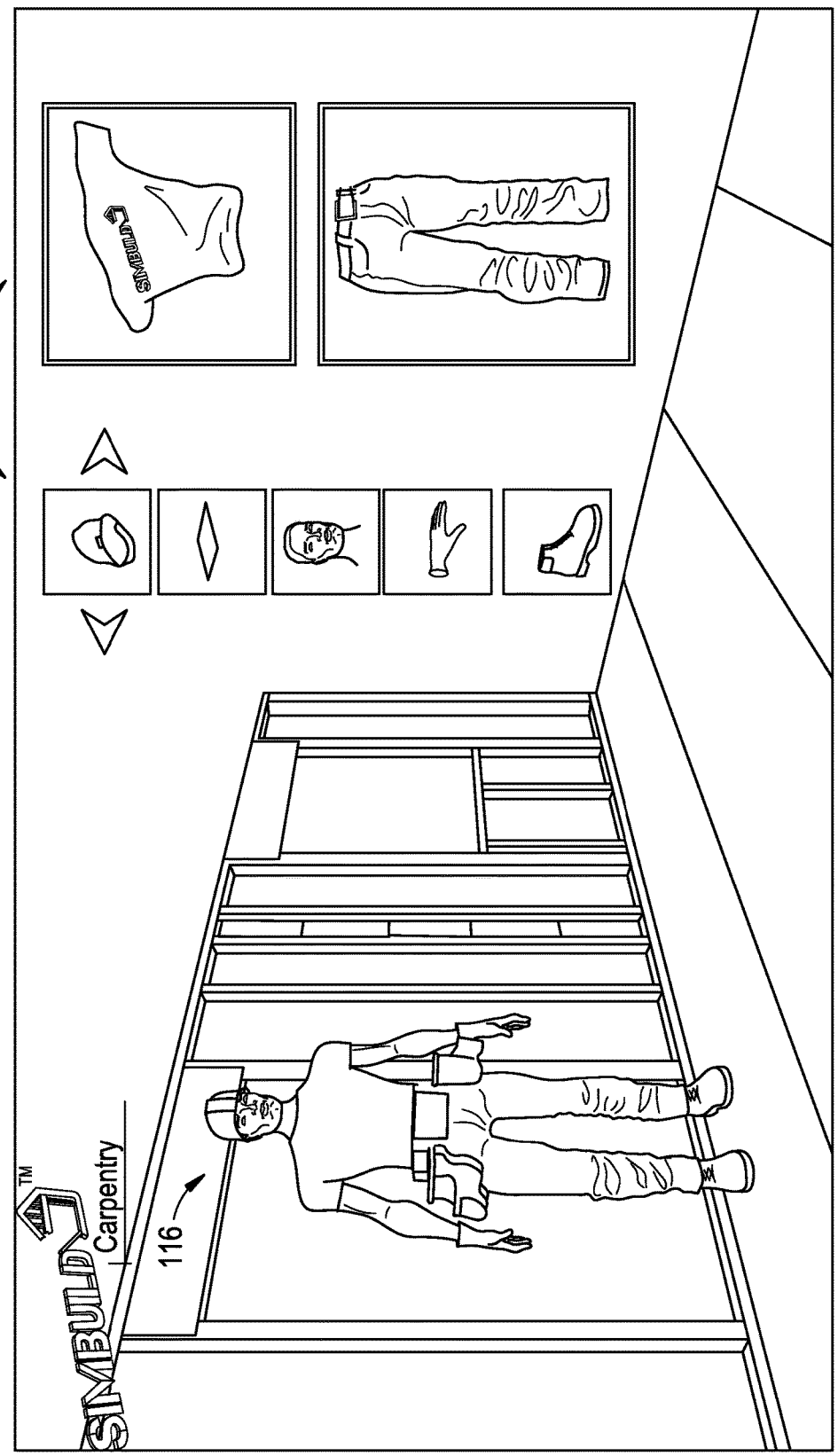

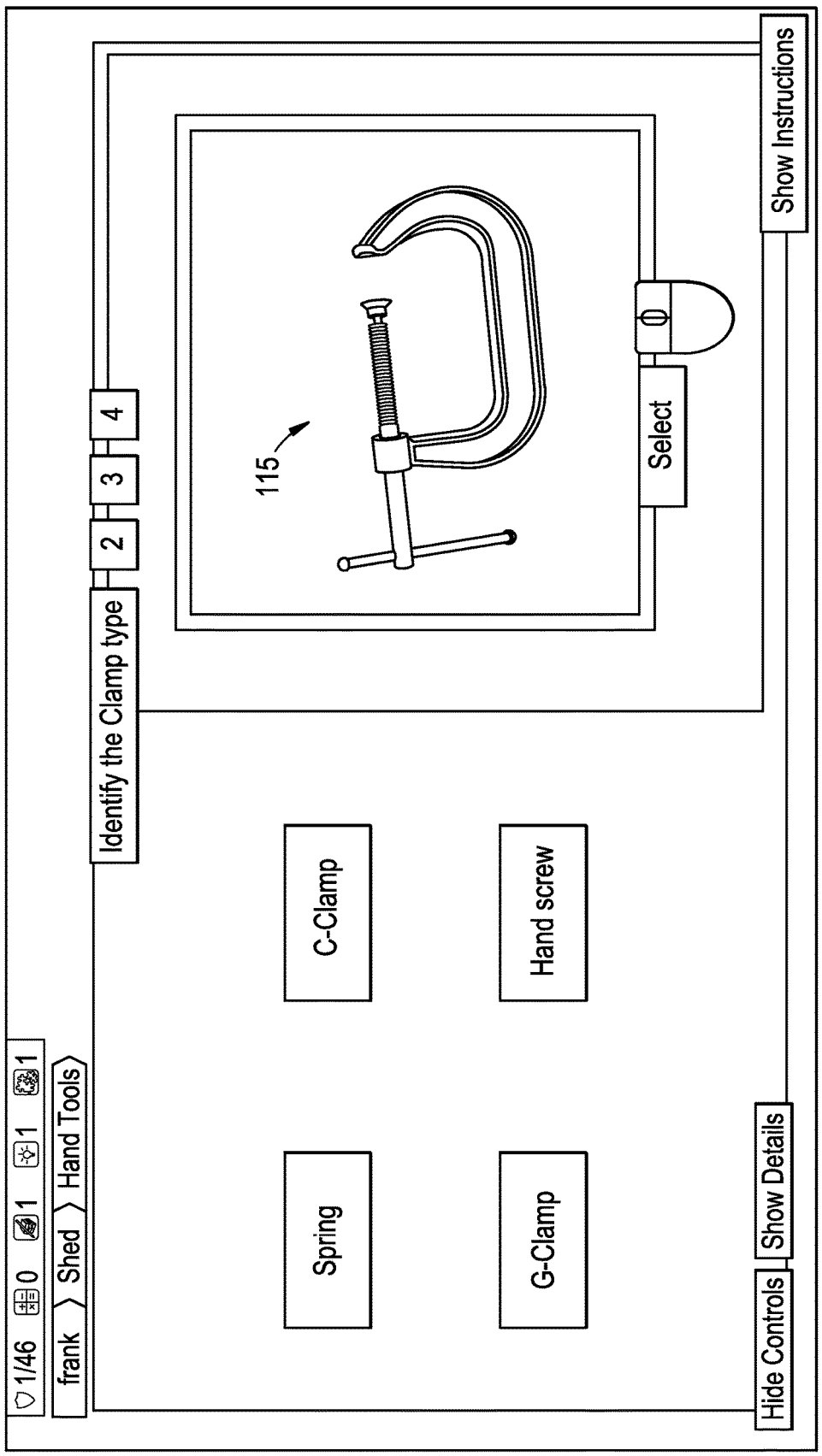

FIG. 17B

Student Report

Profile
Nathan Report
member since 5-1-2013

SIMBUILD Carpentry
Projects

Shed  Completed  12/12
Ranch House  8/28

-R2- Basic Flooring System ★☆☆☆☆
-R8- Install Ceiling Joists ★★☆☆☆
-R17- Build Entry Door with Frame ★★★☆☆
-R25- Install Floor Board and
Plywood Panel Multi - Level House  0/20

Commendations
Perfect Cutting Score  7/18/2012
Fastest Site Cleanup  6/18/2012

410A

National Skills Standards

| Category | Units Required | Progress |
|---|---|---|
| Safety | 6 | |
| Construction Math | 9 | |
| Hand & Power Tools | 6 | |
| Blueprint Reading & Interpretation | 9 | |
| Building Materials, Fasteners and Adhesives | 3 | |
| Floor Systems | 6 | |
| Wall and Ceiling Framing | 6 | |
| Roof Framing | 6 | |
| Concrete, Reinforcing Materials & Forms | 3 | |
| Window and Exterior Doors | 3 | |
| Basic Stair Layout | 3 | |

Progress Graph

Score
4
3
2
1

R3 R5 R8 R8 R11R20R15R20
Work Order

413

412

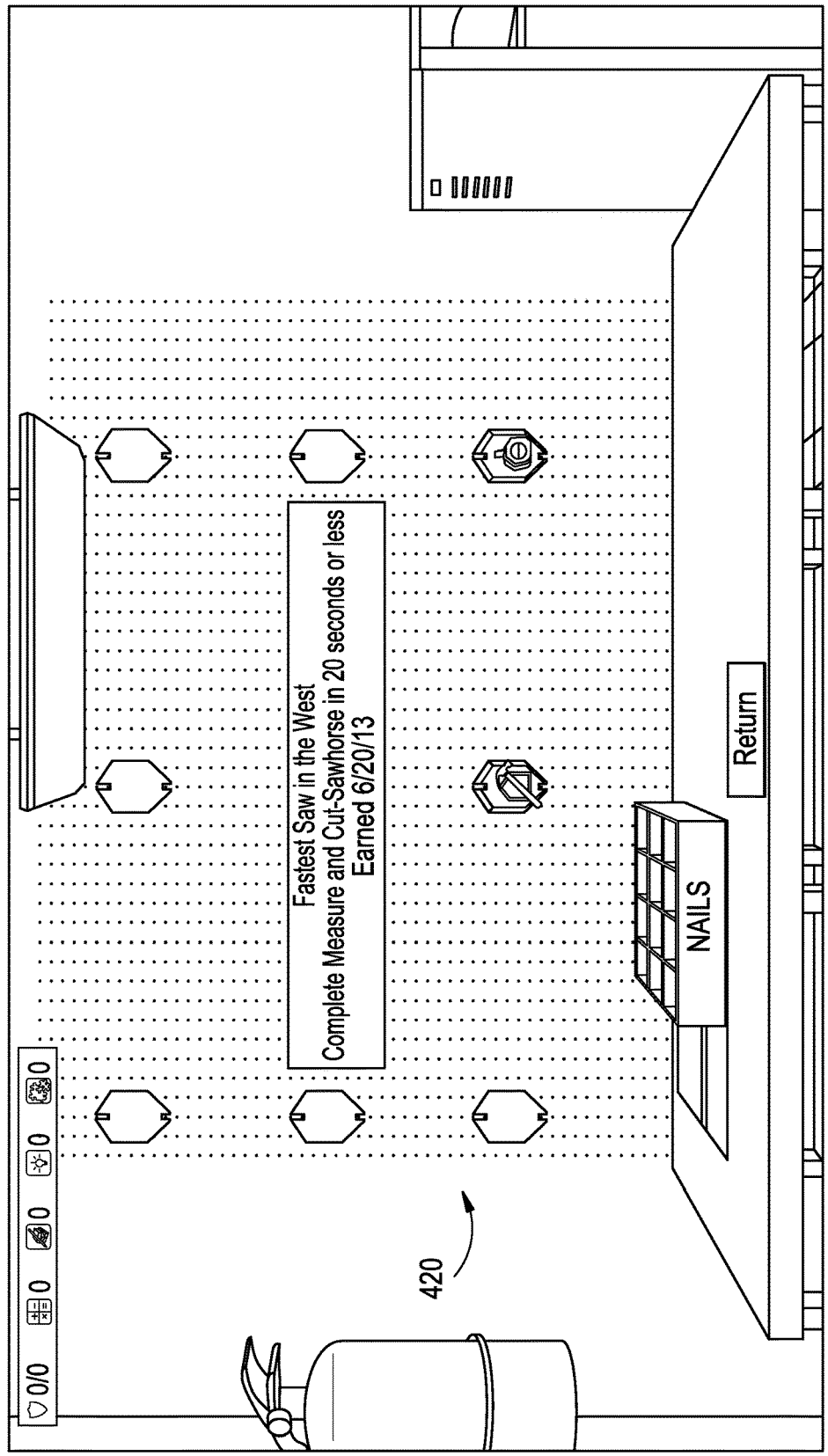

FIG. 17E
| | |
|---|---|
| 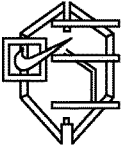 | Perfect Choices |
| 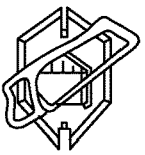 | Perfect Cuts |
| 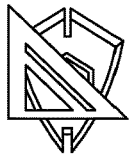 | Perfect Accuracy |
|  | Least Amount of Waste |
| 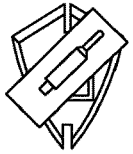 | Efficient Coverage |
| 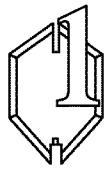 | Completing on the First Try |
| 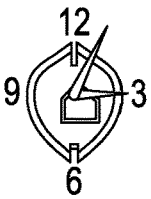 | Completing in the Allotted Time |
422

FIG. 17F
← 424
Math
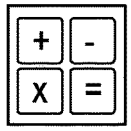 Estimate·Model·Reason·Measure·Formulas· Precision
Reading
 Vocabulary·Research·Instructions· Comprehend·Analyze·Interpret
Knowledge
 Building Systems·Regulations·Saftey·Tools Terminology
Problem Solving
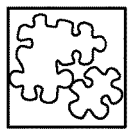 Procedures·Process·Inspect·Assemble·Integrate ·Identify·Outcomes

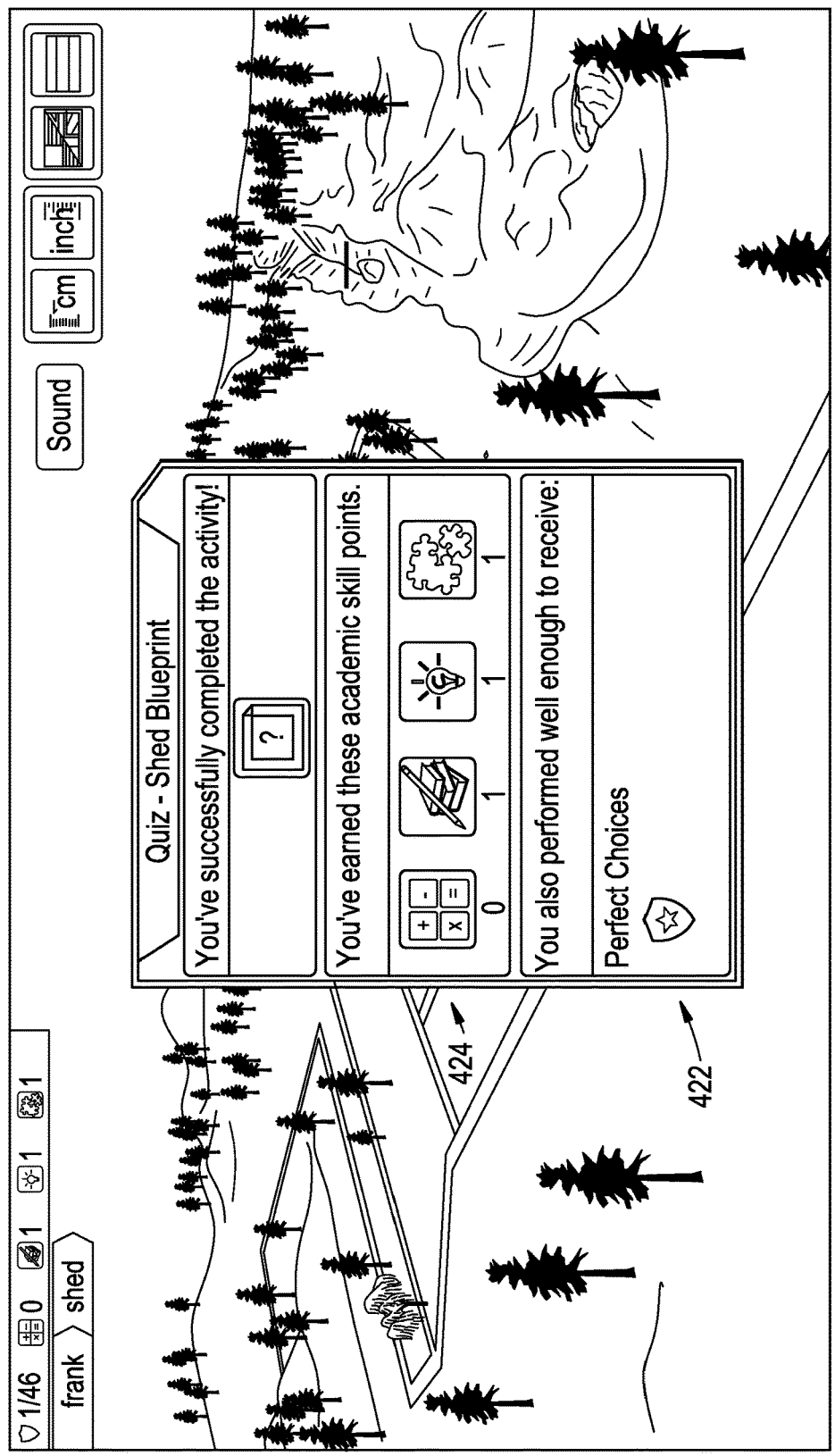

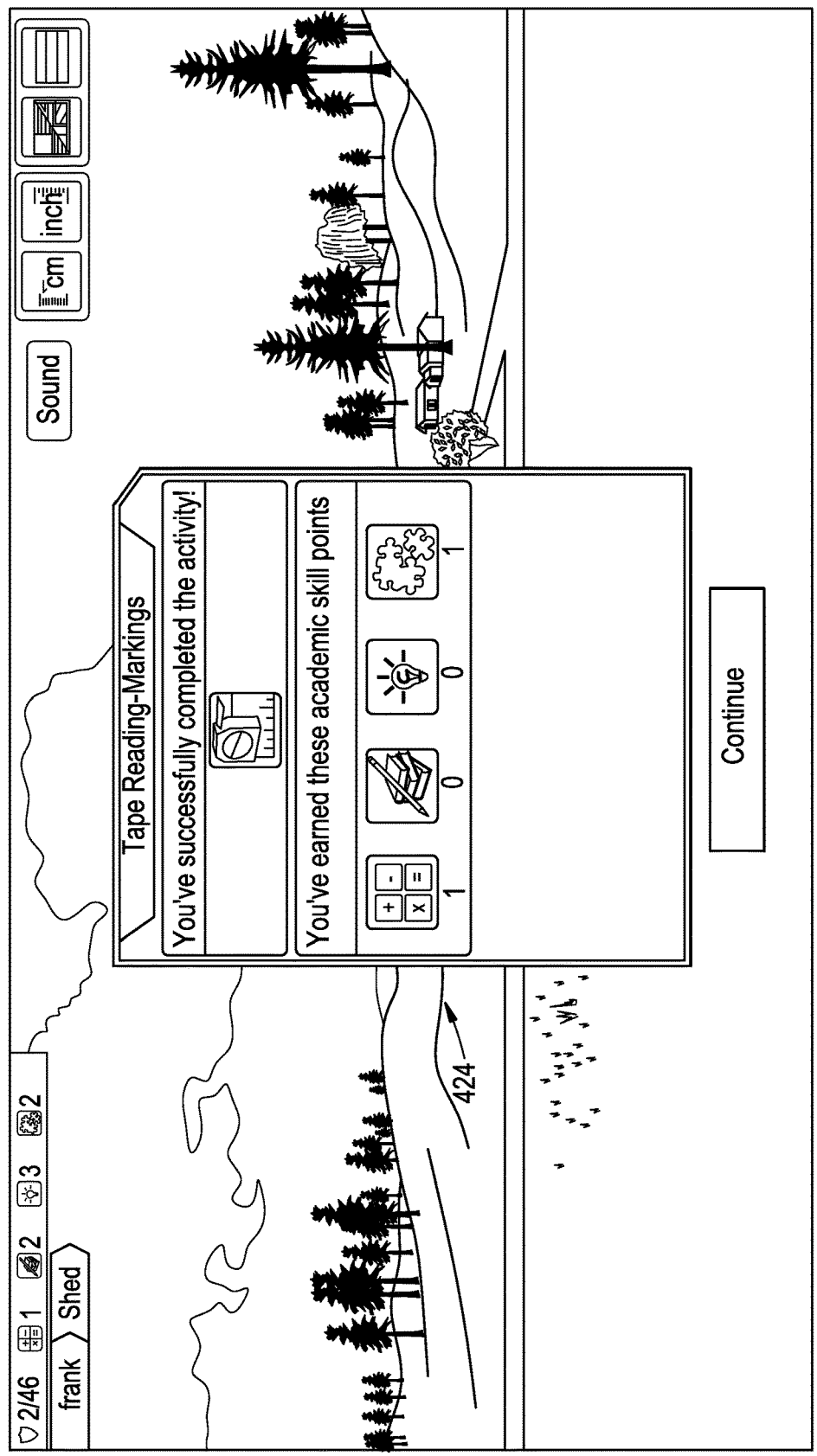

FIG. 19A

SIMBUILD™
Home | Carpentry | Progress Reports | Knowledge Center | Resources | Search | View Profile | Logout

Student Test
Neville, Florida

Hello everone, I am a new student in the online course for carpentry. I hope to meet a lot of new classmates the coming school year.

☐ View Profile
☐ See Messages    [Logout]

My Activity
- 🔍 10 Materials Reviewed
- 📹 5 Skill Videos watched
- 📖 25 Vocabulary Reviewed

Badges Earned 8 of 25

- Perfect Safety
- Fastest Saw in the West
- Handyman
- Sawing Wood
- Red Toolbox
- Extreme Caution
- Blue Circle
- The Green Award

SimBuild Overview
Overall site Progress

| Class Rank | 24 | 30 | 10 |
| 15 | Order Complete | Activities Passed | Tools Unlocked |

Construction Skills Progress
50% Site Systems Complete

- 45% Floor
- 40% Walls
- 30% Drywall
- 65% Concrete Forms
- 57% Windows & Doors
- 50% Ceiling
- 45% Roof
- 67% Stairs

Academic Skills Progress
✏️ 38% Math skills complete

Skill Knowledge 100% / 100% / 0%
Skill Progress of Activities & Designs 502, 504, 500, 506, 508, 570, 512

SIMBUILD™ | Carpentry

⇧ Home | Progress Reports | Knowledge Center | Resources

Search    View Profile    Logout

Teachers Test
Neville, Florida

I am one of the teachers for SimBuild Carpentry. Please let me know if you have any questions and I'll be available to help you.

☐ View Profile
☐ See Messages

[Logout]

Choose Report: Overview ▷
Choose Class: Class A ▷
Choose View: Class ▷

Academic Class Report

| Student Name ▶ | SimBuild Completion ▶ | Learning Momentum ▶ |
|---|---|---|
| Nathan Drake | | |
| Jack Daniels | | |
| Lili Jones | | |
| John Smith | | |
| Tina Turner | | |
| Don Johnson | | |
| Steve Dion | | |
| Ray Todd | | |
| Taylor Swift | | |
| Justin Bieber | | |
| Bill Joel | | |
| Brian Dunn | | |

SIMULATOR FOR SKILL-ORIENTED TRAINING

CROSS-REFERENCE TO RELATED APPLICATIONS

This patent application claims priority benefit under 35 U.S.C. § 119(e) of U.S. Provisional patent application Ser. No. 61/730,824, filed on Nov. 28, 2012, and Ser. No. 61/842,150, filed on Jul. 2, 2013. The disclosures of these patent documents are incorporated herein by reference in their entirety.

COPYRIGHT NOTICE

A portion of the disclosure of this patent document may contain material, which is subject to copyright protection. The copyright owner has no objection to the facsimile reproduction by anyone of the patent document or the patent disclosure, as it appears in the United States Patent and Trademark Office files or records, but otherwise reserves all copyright rights whatsoever.

BACKGROUND OF THE INVENTION

1. Field of the Invention

The present invention relates generally to a training system employing computer simulation and immersive virtual reality for instructing and evaluating the progress of a person performing a skill-oriented task and, more particularly, to a simulator for instructing and evaluating performance of a skill-oriented task of a process such as, for example, a component manufacture, construction, assembly and/or finishing process performed by a tradesman.

2. Description of Related Art

Generally speaking, training is needed for a person to acquire and/or maintain skills necessary for performing a skill-oriented task such as, for example, manufacturing, constructing, assembling and/or finishing one or more components. There have been efforts to simulate skill-oriented tasks to improve training and minimize costs. Some efforts have included the use of computer simulation and virtual reality. However, the inventors have found that conventional systems are seen to be too expensive and/or lack the accuracy and "look and feel" of real life tasks. Moreover, conventional systems are not seen to provide valuable feedback on performance to the trainee and/or others monitoring or evaluating the trainee's performance. Similarly, conventional systems are not seen to motivate trainees to seek continuing improvement of skills. As such, conventional simulation systems are of limited use within, and of limited benefit to, the industry. Accordingly, there is a need for improved training systems and methods using computer simulation and immersive virtual reality and which permit evaluation of the progress of a person learning new skills and/or reinforcing existing skills in skill-oriented tasks such as, for example, manufacturing, constructing, assembling and/or finishing one or more components.

SUMMARY OF THE INVENTION

The present invention is directed to a simulator for skill-oriented training of a task. The skill-based training system includes a processing system having a processor, memory operatively coupled to the processor with executable program instructions stored therein, and an input-output controller operatively coupled to the processor and to one or more input and output devices. The memory includes lesson plans outlining the skill-based tasks and activities therein, and predetermined performance criteria for the skill-based tasks and activities. The input and output devices facilitate input and output of data and information to and from the processor. The processor is configured, by the executable program instructions, to present a plurality of graphical user interfaces (GUIs) on at least one of the output devices simulating a virtual training environment, to receive input signals from at least one of the input devices, the input signals representative of performing within the virtual training environment one of the skill-based tasks and activities, to evaluate the performance of the one skill-based tasks and activities by comparing the performed tasks and activities to the predetermined performance criteria and determining a score, and to present the score on the at least one of the output devices.

In one embodiment, the performance criteria include acceptable standards for accuracy, elapsed time, material usage, personal safety and work area safety measures. In another embodiment, the performance criteria further includes at least one of a predetermined or calculated budget for the performance of the one of the skill-based tasks and activities.

In one aspect of the invention the skill-based training system includes a work order system having a plurality of work orders categorized by the lesson plans. The work orders include the skill-based tasks and activities defined within an increasing progression of a degree of at least one of skill, knowledge, critical thinking and problem solving needed to complete the tasks and activities. In one embodiment, the work order system is implemented within a plurality of work areas exhibited on one or more of the plurality of GUIs including a basic-skills work area, an intermediate-skills work area and an advanced-skills work area. In one embodiment, the work areas are defined within a residential construction environment. In one embodiment, the work orders, and the skill-based tasks and activities included therein, demonstrate, teach and reinforce skills within at least one of a carpentry, plumbing, electrical, masonry, heating, cooling and air conditioning (HVAC), flooring, painting, roofing, and other skill-based trade disciplines. In another embodiment, the work orders further include tools to be used in performing the skill-based tasks and activities. In still another embodiment, the work orders and the skill-based tasks and activities included therein, reinforce general academic skills including reading comprehension, mathematics, knowledge interpretation and retention, complex thinking.

In one embodiment, the skill-based training system further includes a plurality of odd job activities as supplements to the plurality of work orders. The odd job activities teach skills directed to at least one of personal and work area safety, basic terminology of a discipline of interest, and building teamwork skills.

In still another embodiment, the predetermined performance criteria of the skill-based training system include a standard set by at least one of an industry, a company, an educational institution, and a municipal or governmental certification authority.

In yet another embodiment of the skill-based training system, the score includes an indication of progress in at least one of lesson completion, learning momentum and in successfully obtaining the set standard. In one embodiment, when the score at least one of meets or exceeds one or more predetermined thresholds, the processor is further configured, by the executable program instructions, to issue at least one of an award, a commendation and a badge. In one embodiment, the at least one award, commendation and badge is exhibited in an area on one or more of the plurality of GUIs associated with a user of the training system. In another embodiment, the score and the award, commendation and badge are published by the user on a social networking website operatively coupled to the training system.

In yet another embodiment, the skill-based training system further includes a learning management system. The learning management system includes a data store for storing the lesson plans, predetermined performance criteria, and work orders including the skill-based tasks and activities within the lesson plans. In one embodiment, the learning management system further includes data and information associated with a user of the training system and the user's performance of the work orders including an indication of the number of lesson plans and work orders completed by the user, an indication of the number of lesson plans and work orders completed for which an acceptable score was received by the user, an indication of learning momentum of the user performing the work orders, an indication of the number and types of tools used by the user in performing the work orders, and an indication in progress of the user toward receiving an accreditation for successfully completing the work order.

In one embodiment, during the performance of one of the skill-based tasks and activities, the processor is further configured, by the executable program instructions, to exhibit on one of the plurality of GUIs at least one of a visual aid and a tip to guide and instruct a user of the training system as the user performs the one of the skill-based tasks and activities. In one embodiment, the visual aid and tip includes at least one of a proper placement of a component, a proper alignment in terms of height, pitch and angle of the component, a proper speed and angle of a tool used in performance of the one of the skill-based tasks and activities, and a movement of the component being worked. In still another embodiment, the visual aid includes at least one of a phantom and a shaded representation of the component or tool exhibited on one of the plurality of GUIs, and the tip includes a message exhibited on one of the GUIs. In one embodiment, the tip message includes audio, video, text, graphics, one or more hyper-links, or like means for communicating information to a user.

BRIEF DESCRIPTION OF THE DRAWINGS

The features and advantages of the present invention will be better understood when the Detailed Description of the Preferred Embodiments given below is considered in conjunction with the figures provided.

FIG. 1C illustrates an exemplary work flow through the virtual training environment, in accordance with one embodiment of the present invention.

FIGS. 3A to 3C depict exemplary GUIs exhibiting a family of virtual training environments and learning and navigation tools implemented on the system of FIG. 2, in accordance with one embodiment of the present invention.

FIGS. 4A to 4G depict exemplary GUIs implemented on the system of FIG. 2 and exhibiting a plurality of work sites and work orders outlining tasks to be performed on the work sites by a user to develop, reinforce, monitor, and/or evaluate the skills of the user in performing the skill-oriented tasks, in accordance with one embodiment of the present invention.

FIG. 5 illustrates a work order of the system of FIG. 2, in accordance with one embodiment of the present invention.

FIGS. 6A to 6C depict exemplary GUIs implemented on the system of FIG. 2 exhibiting functions for creating user defined avatars operable within the system, in accordance with one embodiment of the present invention.

FIGS. 6D to 6G depict exemplary GUIs implemented on the system of FIG. 2 exhibiting characteristics and/or functions of various tools operable within the system, in accordance with one embodiment of the present invention.

FIGS. 17A and 17B depict exemplary GUIs implemented on the system of FIG. 2 exhibiting reports providing results of an evaluation of the user's performance of skill-oriented tasks and activities on work orders, in accordance with one embodiment of the present invention.

FIGS. 17C to 17F, and 18A to 18D depict exemplary GUIs implemented on the system of FIG. 2 exhibiting awards, commendations and/or badges indicating one or more levels of achievement attained by a user of the system, in accordance with one embodiment of the present invention.

FIGS. 19A to 19C depict exemplary GUIs implemented on the system of FIG. 2 exhibiting a user/student's portion of a Learning Management System, in accordance with one embodiment of the present invention.

FIGS. 19D to 19I depict exemplary GUIs implemented on the system of FIG. 2 exhibiting a teacher's portion of the Learning Management System, in accordance with one embodiment of the present invention.

In these figures like structures are assigned like reference numerals, but may not be referenced in the description of all figures.

DETAILED DESCRIPTION OF PREFERRED EMBODIMENTS OF THE INVENTION

Figure 1A:
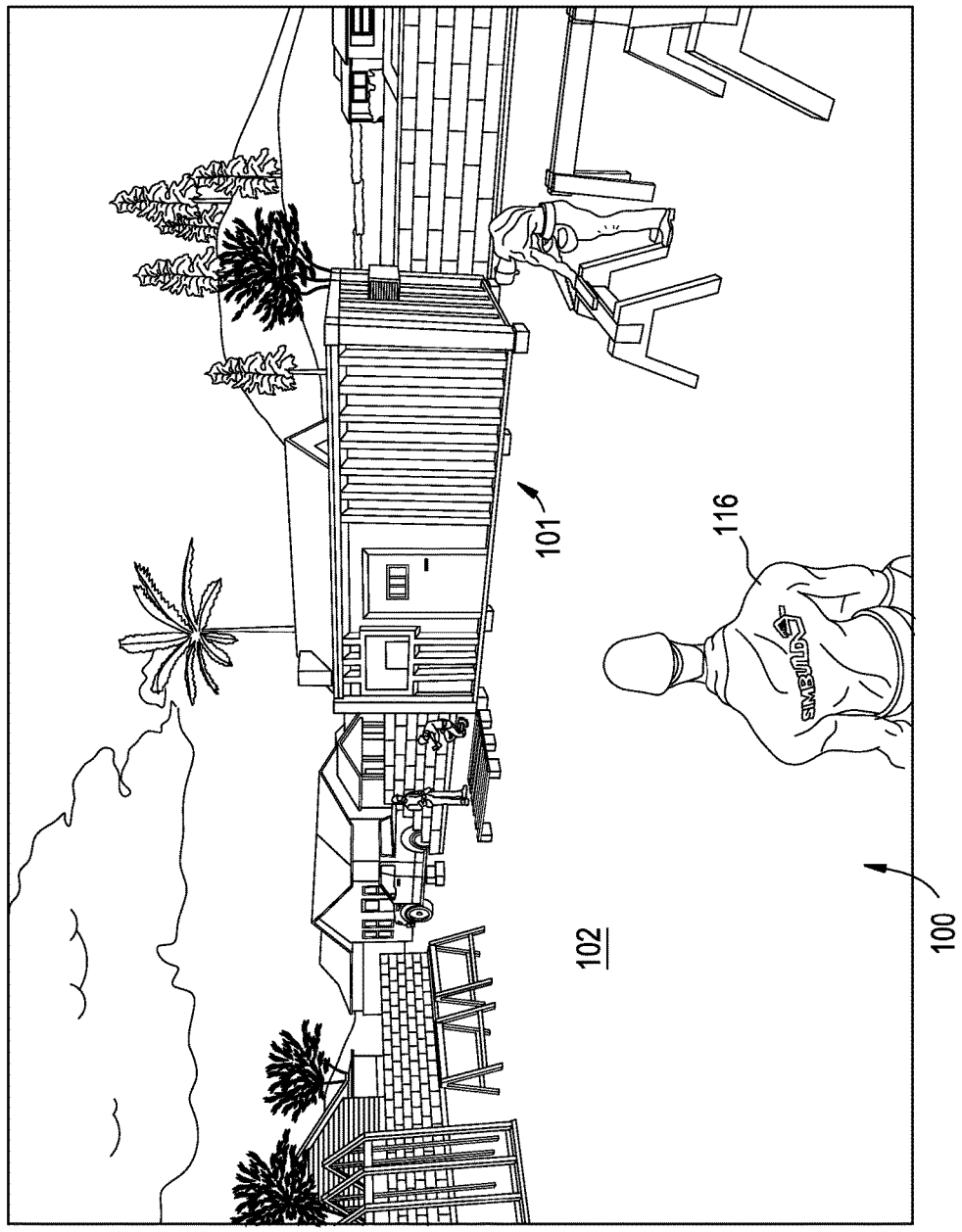
FIGS. 1A and 1B depict exemplary graphical user interfaces (GUIs) exhibiting virtual training environments operable to demonstrate and/or perform skill-oriented tasks such that a user may acquire and/or reinforce skills of the task, in accordance with embodiments of the present invention.

The present invention provides a virtual training environment 100 for skill-based training. In one embodiment, the training environment 100 includes a construction site 102 (FIG. 1A) or a workshop or garage 104 (FIG. 1B) provided on a plurality of graphical user interfaces (GUIs), described herein, where skills are demonstrated, acquired and/or reinforced in skill-oriented tasks such as, for example, tasks within a carpentry discipline. A person of ordinary skill in the art and being familiar with this disclosure understands that the present invention is not limited to demonstrating, developing and maintaining only carpentry skills including structural framing and finish carpentry skills, and that it can also be applied to other disciplines, including, but not limited to, plumbing including installing drains, supply and waste lines, fixtures and the like, electrical including installing services boxes, breakers, wiring, outlets, fixtures and the like, masonry including forming foundations and installing tile and the like, heating, venting and air conditioning (HVAC) including running duct work, installing equipment and the like, flooring including laying wood, vinyl or other sheet materials, carpeting and the like, tradesmen installing wallboard, taping compound, painting, and like finishes, roofing including installing flashing, water proofing membranes, laying shingles and the like, and other skilled-based disciplines. For example, as is illustrated in FIG. 3A, the present invention includes a SIMBUILD™ Product family 106 of virtual training environment and learning tools including a Carpentry module 106A, a Masonry and Foundation module 106B, a Plumbing module 106C and a Basic Electrical module 106D. Accordingly, the simulator, as described herein, is used for training, developing and improving other skills required in skill-oriented tasks performed by tradesman. It should also be appreciated that the simulator may be implemented as a project based system wherein an individual instructor, certification agent, or the like, may define their own performance characteristics (e.g., accuracy, elapsed time, material usage, personal and jobsite safety, and the like) and/or criteria including those unique to the instructor, agent and a given project or application, and/or which incorporate industry or company-specific performance criteria, standards and/or inspection protocols.

In one embodiment, the virtual training system 100 including the Carpentry module 106A is referred to as a SimBuild: Carpentry system (hereinafter the "SBC system 100"). SIMBUILD, SIMBUILD: CARPENTRY and SBC are trademarks of VRSim, Inc. (East Hartford, Conn. USA). As illustrated in FIG. 3A, the SBC system 100 is one chapter in a SimBuild Product family 106 of virtual training environment and learning tools that provide a user (referred to hereinafter as a student, trainee, operator or the like) with an immersive experience for instructing, monitoring and evaluating performance of skill-oriented tasks of a process such as, for example, a component manufacture, construction, assembly and/or finishing process performed by a tradesman. The SimBuild Product Family 106 allows the user to acquire a skill and/or have skills reinforced in, for example, a discipline such as, for example, the aforementioned carpentry, plumbing, electrical, masonry, and other skilled-based disciplines as the user progresses from an entry level, semi-skilled level to a skilled professional level. For example, the SBC system 100 provides a virtual training environment and learning tool that provides the user with an immersive experience that teaches skills of carpentry from entry level to semi-skilled to skilled, as per National Association of Home Builders (NAHB) standards. As described herein, the skills may include the safe operation of power tools, blue print reading, identification of building materials and tools, measuring and cutting, placement and installation of common residential building materials (e.g. plywood, lumber such as 2×4s, 2×8s, etc., gypsum, paint, roofing, wiring, fixtures and outlet, pipes, drains, tile, brick, plaster, cement and the like), and reinforces preferred practice in the construction and/or assembly of structural components within, for example, foundations, floors, walls, ceilings, roofs and the like. In addition, the SBC system 100 allows the user to acquire and/or reinforce workplace and personal safety skills, skills in cooperating with other tradesmen working to complete a common task or project, and the like. In one embodiment, the SBC system 100 permits interaction between multiple participants, in some cases, system generated participants, and in some cases, other students undergoing training. The skills preferably include practices employing "green technology" (e.g., environmentally responsible and resource-efficient throughout a structure's life-cycle) in terms of material identification and waste reduction. An observer (e.g., an instructor or teacher, agent, or the like) can monitor user progress both in terms of lesson completion, and/or learning momentum and progress towards an objective educational or other academic standard as set by an educational institution, municipal/governmental or Industry Recognized Certification standards and assessment tools.

Figure 2:
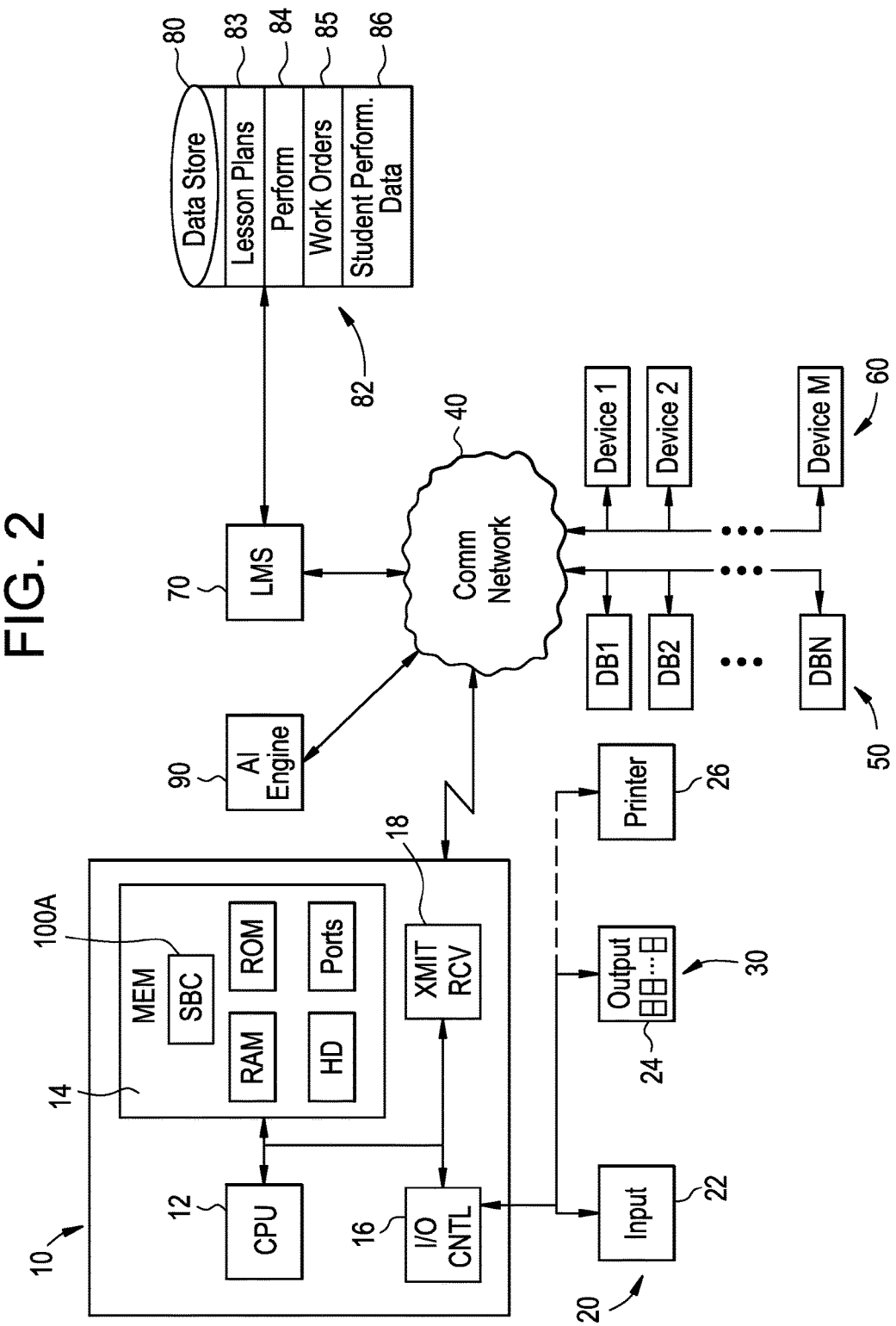
FIG. 2 is a schematic block diagram of an exemplary system for training of skill-based tasks, in accordance with one embodiment of the present invention.

In one embodiment, illustrated in FIG. 2, the SBC system 100 is implemented on a standalone, networked or portable computing device 10 such as workstation, laptop, tablet, notebook, iPad® (Apple Inc.) or a mobile communication device, Internet-enabled mobile radiotelephone or like portable computing devices, or any other suitable processing device having processing capabilities and executing a Microsoft® Windows® (Microsoft Corporation) or equivalent operating system. It should be appreciated that the scope of the present invention broadly applies to any standalone or networked computing device. As described herein, the SBC system 100 is configured and operates in accordance with one embodiment of the present invention to implement techniques, as described herein, for collecting, storing, computing, displaying and distributing data and information related to instructing, monitoring and evaluating performance of a skill-oriented task. As shown in FIG. 2, the computing device 10 includes a processor such as a microprocessor or CPU 12, computer-readable medium or memory (MEM) 14 that can include random access memory (RAM), read only memory (ROM), a hard drive (HD), optical disk drive, ports for connection to CD-ROM, DVD, flash and thumb drives and like portable memory media, and like storage devices, an input-output controller (I/O CNTL) 16 operatively coupled to input and output devices, shown generally at 22 and 24, respectively, including input devices 22 for facilitating input of data and information to the SBC system 100 such as a keyboard, a mouse, light pen, joy stick or other pointing device, document, card or other reader or scanner, or other input device, and output devices 24 for displaying inputted and/or processed data and other information such as a pixel-oriented display device, touch screen, printer 26 or the like. In one embodiment, a plurality of GUIs 30, as described herein, is exhibited on the output devices 24. In one embodiment, the computing device 10 includes a transceiver (XMIT/RCV) 18 operatively coupled to a communications network (COMM NETWORK) 40 such as the Internet, an intranet, an extranet, or like distributed communication platform for accessing one or more storage devices (e.g., DB1 to DBN) shown generally at 50, and/or sending and receiving data, information, commands, and otherwise communicating with one or more external computing devices (DEVICE 1 to DEVICE M) shown generally at 60 over wired and wireless communication connections. In one embodiment, the one or more external computing devices 60 are similarly configured as the computing device 10 and are operated by one or more other students training within the SBC system 100 as multiple participants, thus enabling real-time team building and cooperation skills between students. In one embodiment, one or more of the external computing devices 60 are operated by a person monitoring the user's progress in acquiring skills of the skill-oriented task. It should be appreciated that the one or more external computing devices 60 may be located in a same facility as the computing device 10 or at a location remote thereto.

As shown in FIG. 2, the processor 12 executes computer-implemented instructions or steps 100A including the SIM-BUILD™ Product family 106 and the SBC system 100 thereof stored in the memory 14 such that a user (e.g., a student, trainee, operator) operating the system 10 may invoke and execute the training/lesson plans of the SBC system 100, review results exhibited on the display device 24 and make decisions regarding various steps/processes presented in the training/lesson plans. It should be appreciated that while described as residing in the memory 14 of the computing device 10, it is within the scope of the present invention to provide the computer-implemented instructions or steps 100A to the processor 12 and memory 14 from a server computer operating remotely from the computing device 10 such as the server being one of the one or more external computing devices 60. It should also be appreciated that the computer-implemented planning methods 100A of the SBC system 100 generally require manipulation of data and information in the form of electrical, magnetic and/or optical signals that may be inputted, stored, transferred, combined, compared, or otherwise manipulated to provide a desired result. In one embodiment, a desired result includes visual representations of one or more data and information for instructing, performing and evaluating performance of a skill-oriented task of a process such as, for example, a component manufacture, construction, assembly and/or finishing process performed by a tradesman. For example, the lesson planning methods 100A of the SBC system 100 may direct the processor 12, input-output controller 16 and display 24 to exhibit one or more user interfaces, e.g., application generated user interfaces, web pages, and the like, such as the aforementioned GUIs 30, to illustrate preferred or required steps for performing a task, to illustrate operator controlled performance of the steps of the lesson plan, to illustrate, compare or evaluate operator performance, and/or to provide feedback to the operator, an instructor or teacher, agent, or the like, monitoring the user's progress both in terms of lesson completion, and/or learning momentum and progress towards an objective educational or other academic standard as set by an industry, company, an educational institution, municipal/governmental or Industry Recognized Certification standards. One embodiment of the user interfaces 30 depicting the SBC system 100 and computer-implemented SBC training/lesson planning methods is described below.

In one embodiment, the operating environment of the SimBuild® (VRSim, Inc.) and the SBC system 100 is developed using the Unity game engine (Unity Technologies, San Francisco, Calif.) and operates on the Windows® 7 (Microsoft Corporation) platform. Where preferred, an implementation of the SBC system 100 may include an ability to interface to the internet (e.g., via the network 40) using Internet Explorer® (Microsoft Corporation), Chrome® (Google Inc.), Firefox® (Mozilla Foundation) or like web browser software. The SBC system 100 is capable of synchronous (e.g., near real time) and asynchronous connection with the Internet/network 40. In one embodiment, the SBC system 100 is operatively coupled to a Learning Management System (LMS) 70. The LMS 70 includes a data store (DB) 80 that stores data and information 82 used within the SBC system 100. The data and information 82 includes, for example, training/lesson plans 83 including the skill-oriented tasks, steps or activities of the skilled-based disciplines presented in the SBC system 100, performance criteria 84 set by, for example, the instructor or teacher, agent, or the like monitoring the user's progress both in terms of lesson completion and/or learning momentum and progress towards an objective educational or other academic standard as set by an industry, company, an educational institution, municipal/governmental or Industry Recognized Certification standards, work orders 85 to be used as a means for presenting the training/lessons plans to students, student performance data and information 86 including, for example, an indication of a number of lesson plans and/or work orders completed, an indication of a number of lesson plans and/or work orders passed, learning momentum (e.g., frequency and/or regularity of activity in the system 100, knowledge retained by the student and the like), an indication of the number and/or types of tools used, progress toward achieving accreditation, and the like. The SBC system 100 and the LMS 70 interact (via 2-way communication) to do updates, in addition to receiving the updates through a USB thumb drive such that the data and information 82 stored in the data store 80 of the LMS 70 may be shared and/or supplemented by students and other authorized persons, e.g., teachers, administrators of the SBC system 100 and the like.

In one embodiment, the SBC system 100 is operatively coupled to an Artificial Intelligence (AI) engine 90. The AI engine 90 is operatively coupled, directly or through the network 40, to the computing device 10 and/or the LMS 70. In one embodiment, the AI engine 90 accesses and analyzes performance data 86 from one or more of the students and identifies, for example, deficiencies in performance by individual and/or groups of students. In one embodiment, the AI engine 90 determines common and/or trends in deficiencies and recommends modifications to existing and/or new lesson plans and skill-oriented tasks and activities therein, with an aim of minimizing and/or substantially eliminating the identified and/or determined deficiencies through performance of the improved and/or new lesson plans. It should be appreciated that the AI engine 90 may access and analyze performance data 86 on-demand or iteratively to provide continuous learning improvements over predetermined and/or prolonged periods.

As described in one exemplary embodiment herein, the SBC system 100 teaches and reinforces fundamental skills used in residential construction. In accordance with the present invention the SBC system 100 reinforces general academic skills such as, for example, reading comprehension and mathematics, knowledge interpretation and retention, and complex thinking and problem solving, as well as construction-specific skills like blueprint reading, use of a tape measure, and safe use of power and/or pneumatic tools such as, for example, saws, drills, nail gun, and the like, as well as the steps to be performed to complete the particular task at hand. As should be appreciated, the concepts taught and/or reinforced in the SBC system 100 align with national, state, municipal codes and standards. The SBC system 100 is an immersive interactive training environment, where students perform activities provided and/or assigned via one or more work orders, and complete the work orders to become familiar with basic competencies within the discipline being performed.

Figure 3C:
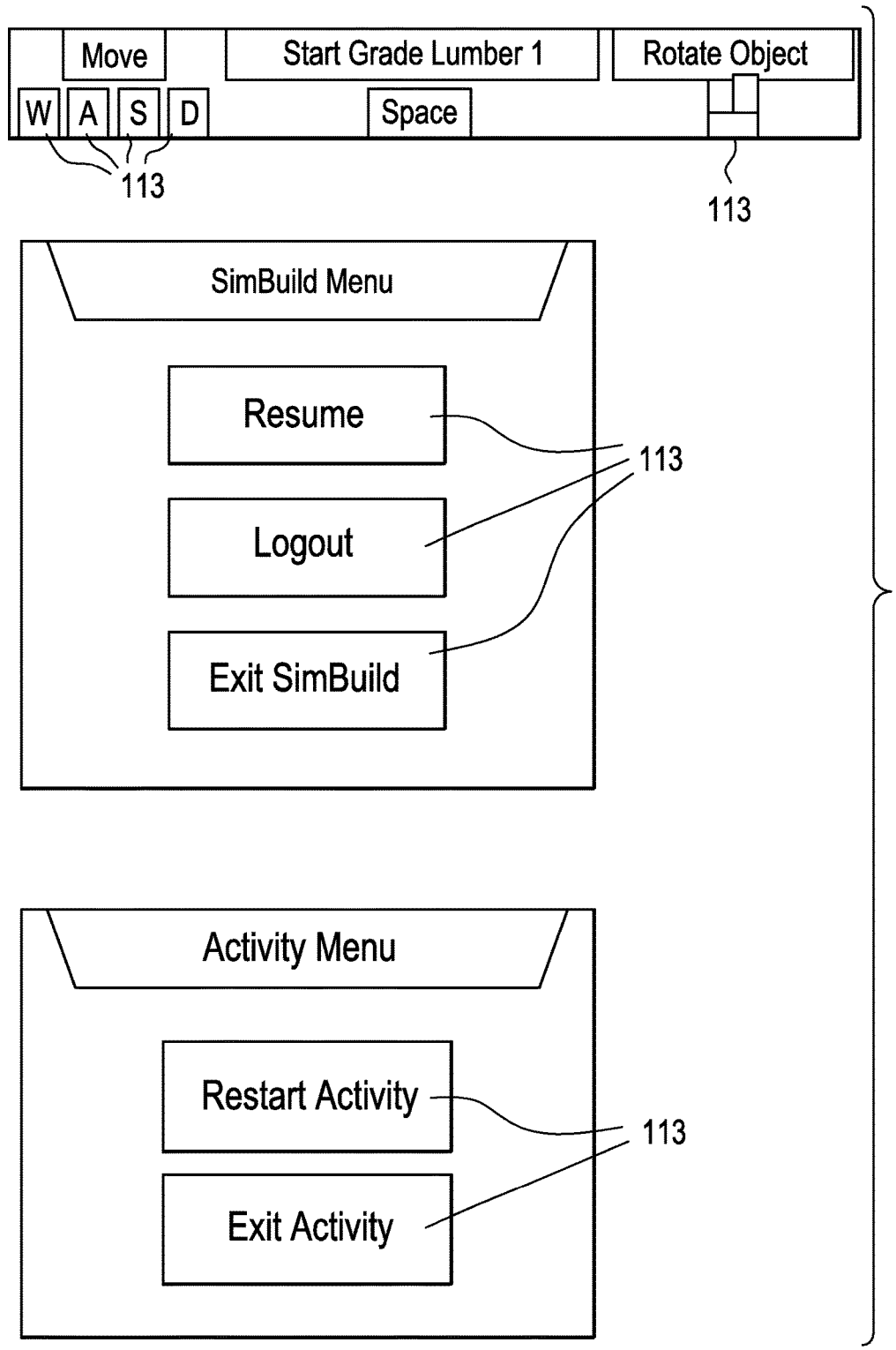

As described herein and shown in, for example FIGS. 1A to 20, the SBC system 100 presents the plurality of graphical user interfaces (GUIs) 30. Embodiments include, for example, FIG. 3B that illustrates one embodiment of an initial GUI 110 of the SBC system 100, upon which the user can access different menus represented in the GUI 110 by icons 112 and/or navigate between GUIs 30 and select activities with control keys 113 (FIG. 3C). The user can select the icons 112 and keys 113 using a controller (e.g., one of the input devices 22) to invoke one or more features and functions of the SBC system 100. As described herein, in some embodiments of the present invention, the position of the user is tracked, and the user can control his/her position and actions within the virtual training environment by employing an avatar 116 (FIGS. 1A to 1C, and 2). As one skilled in the art appreciates the avatar 116 is a graphical representation of the user, or a user-defined alter ego or character, employed within the SBC system 100.

Figure 4B:
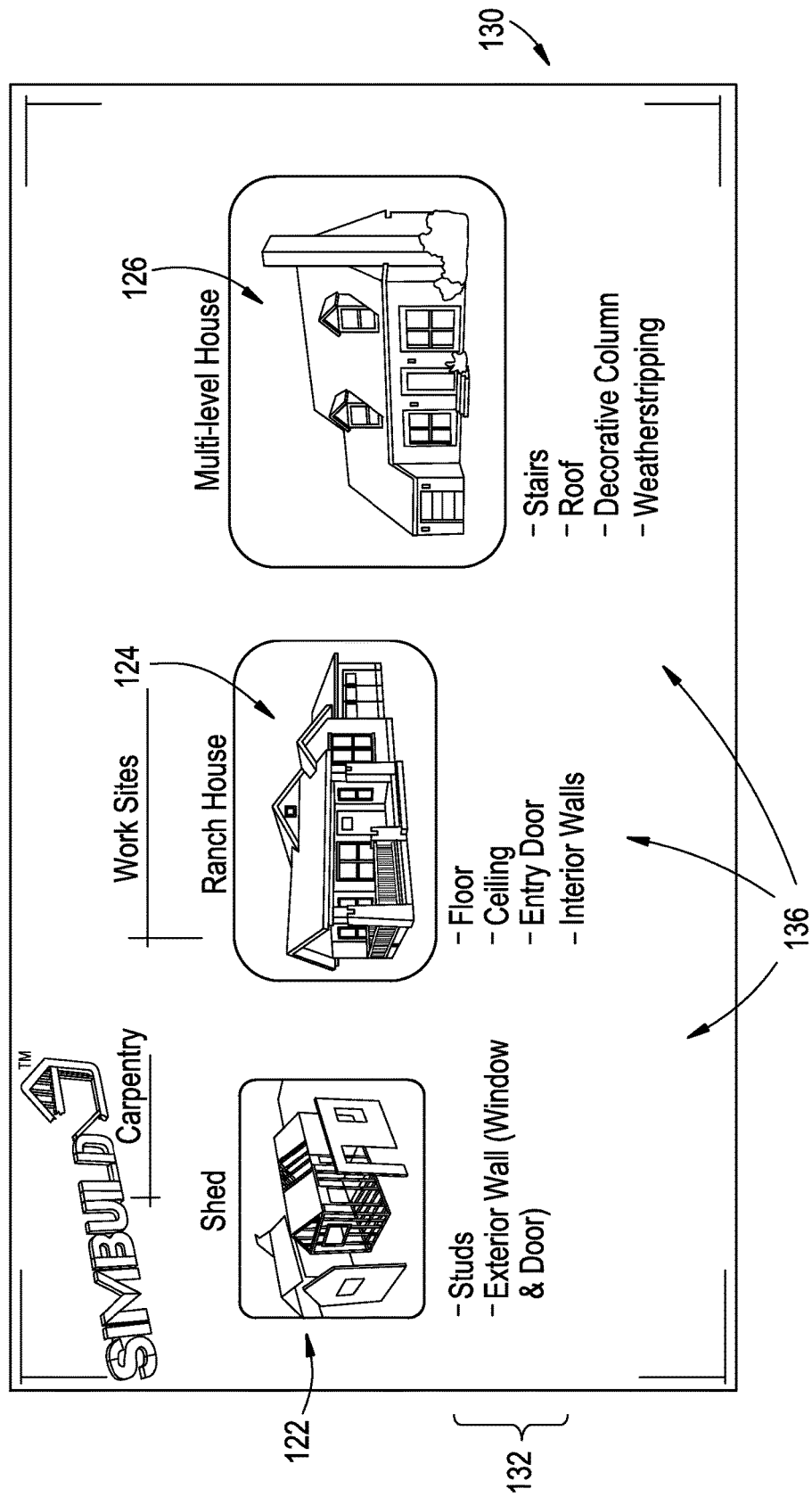
Figure 4C:
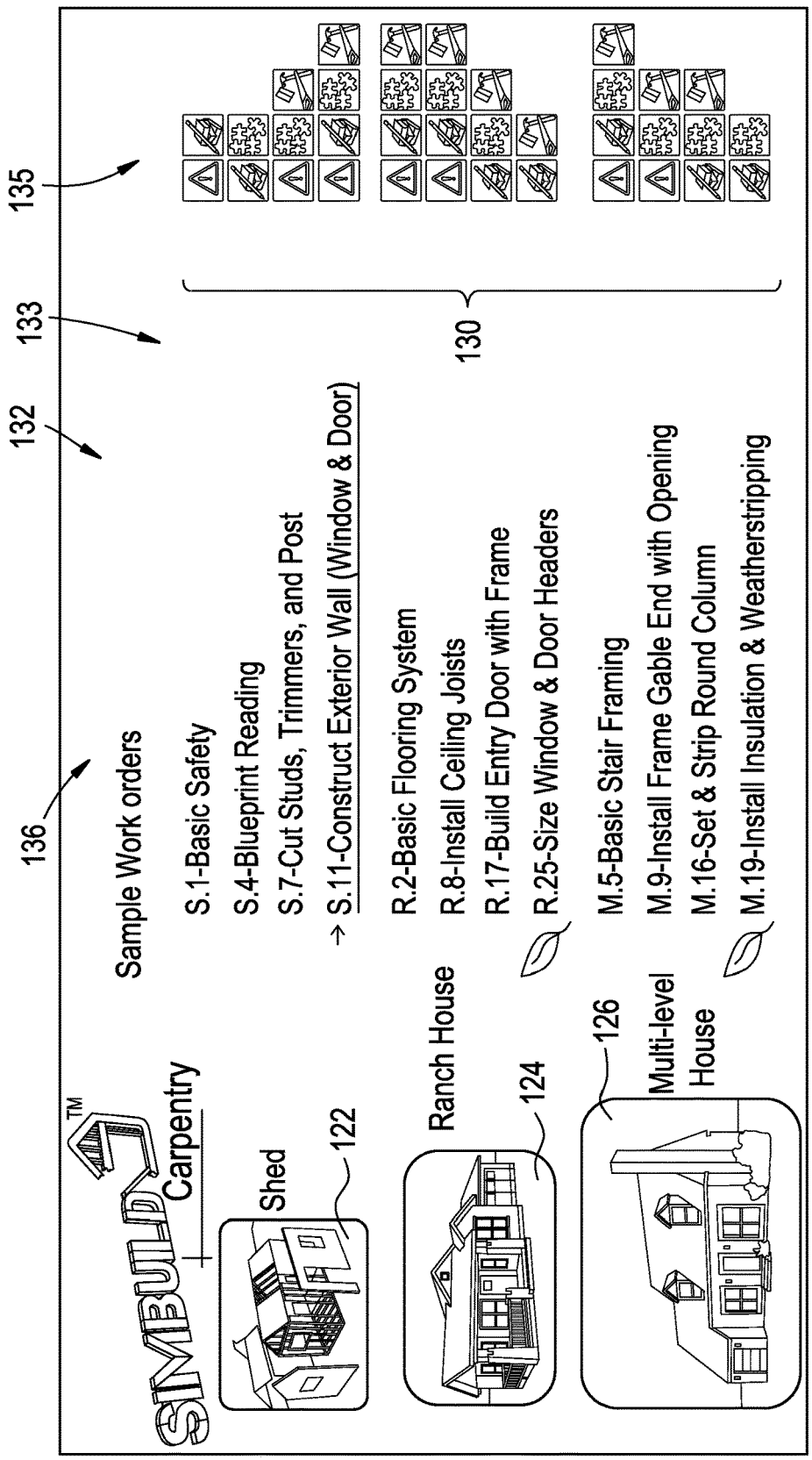
Figure 4D:
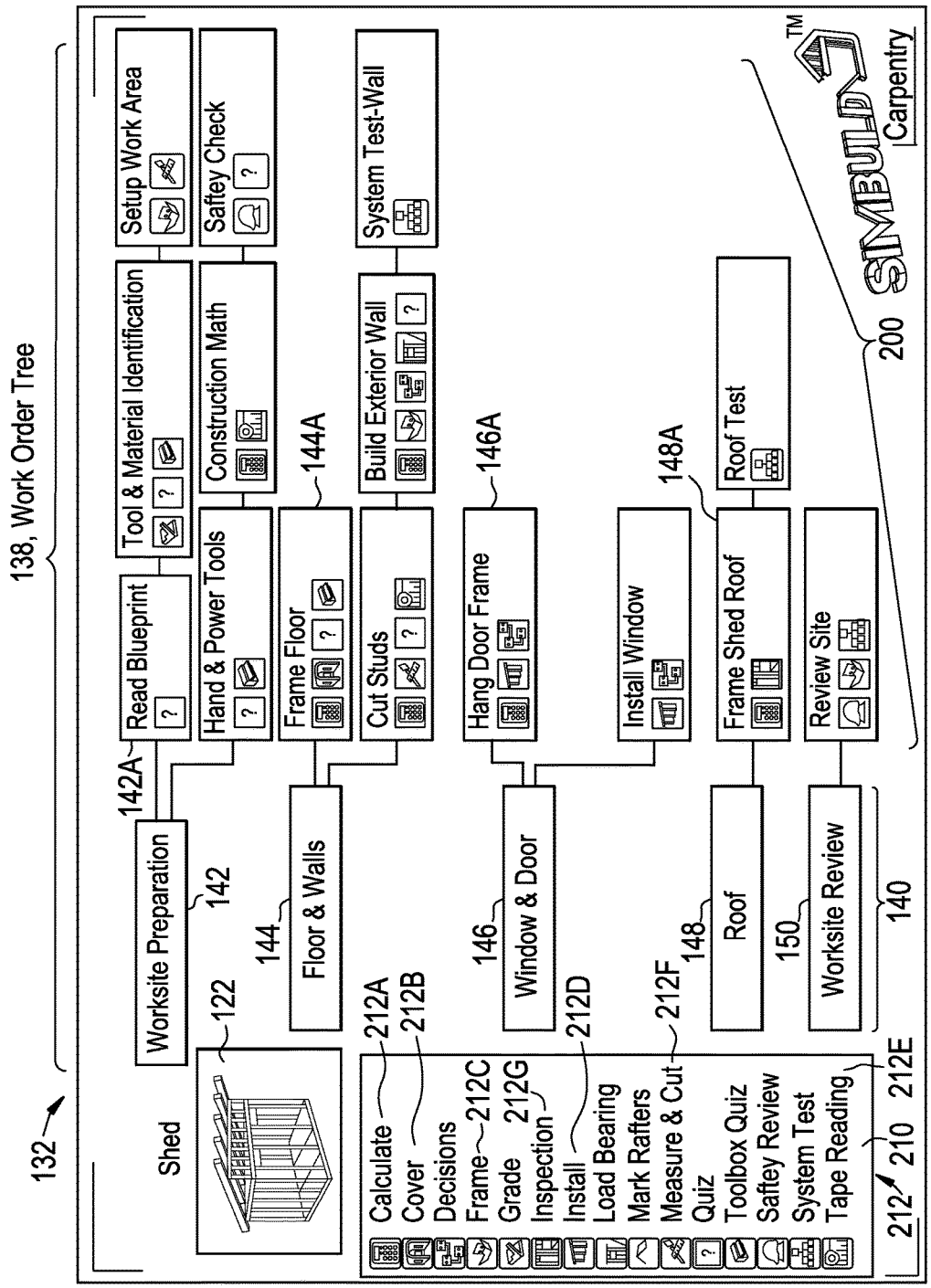
Figure 4G:
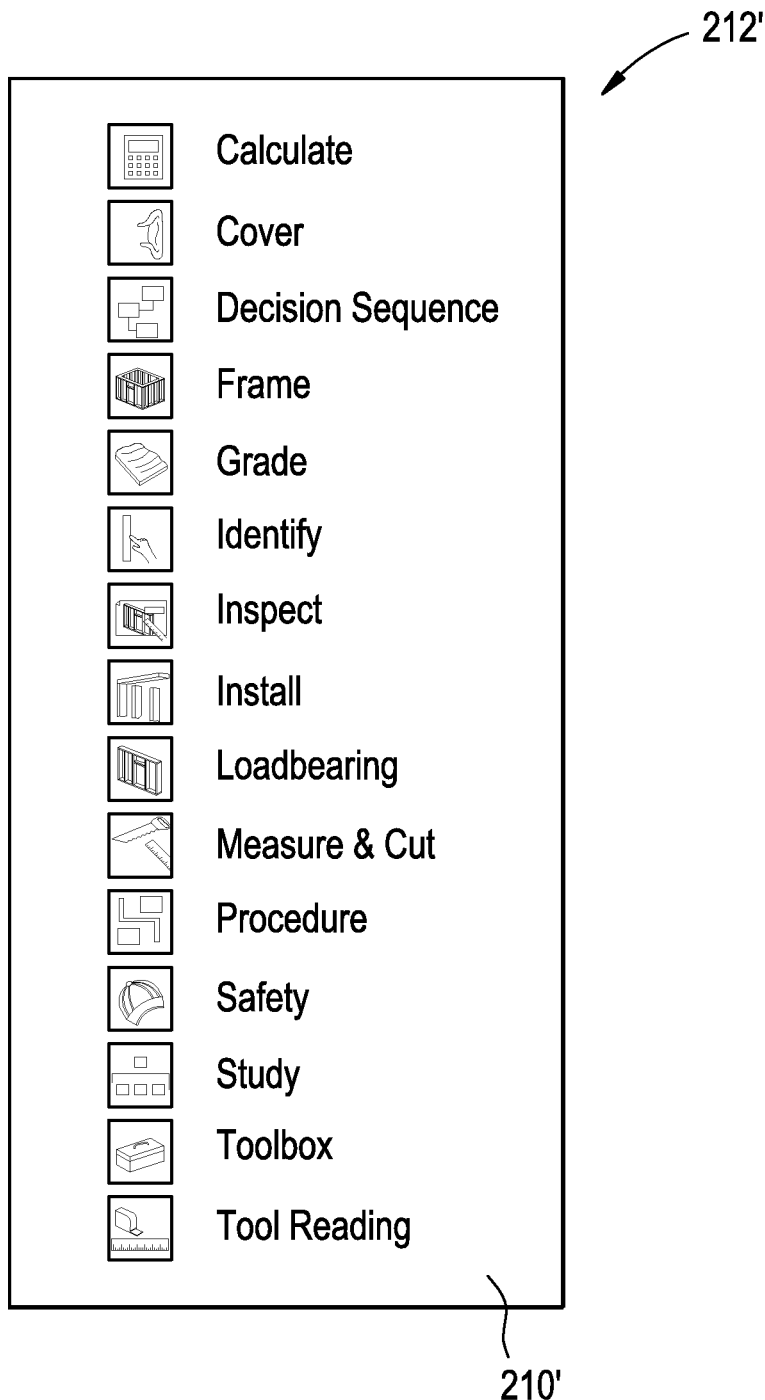
Figure 6D:
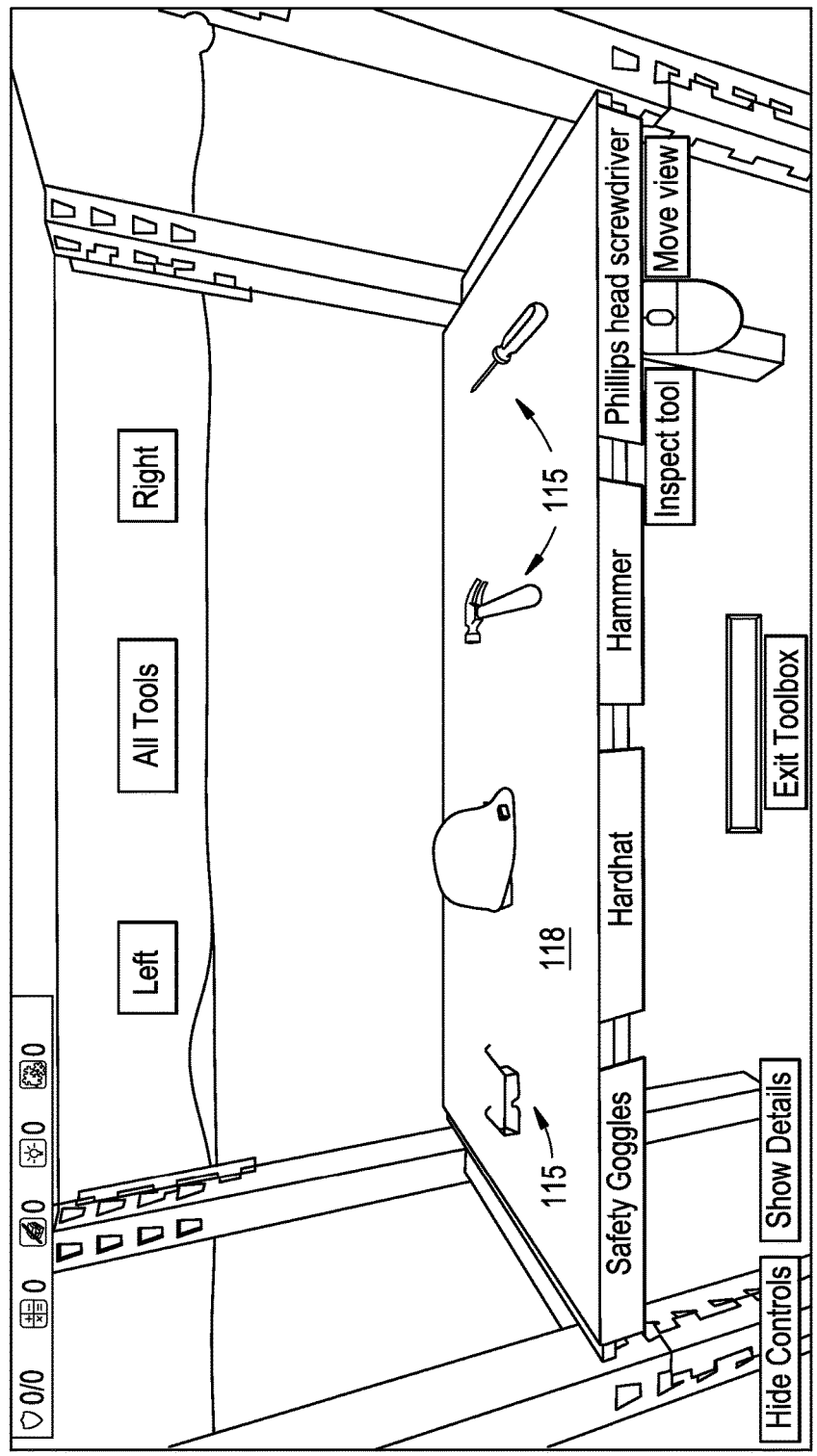
Figure 6E:
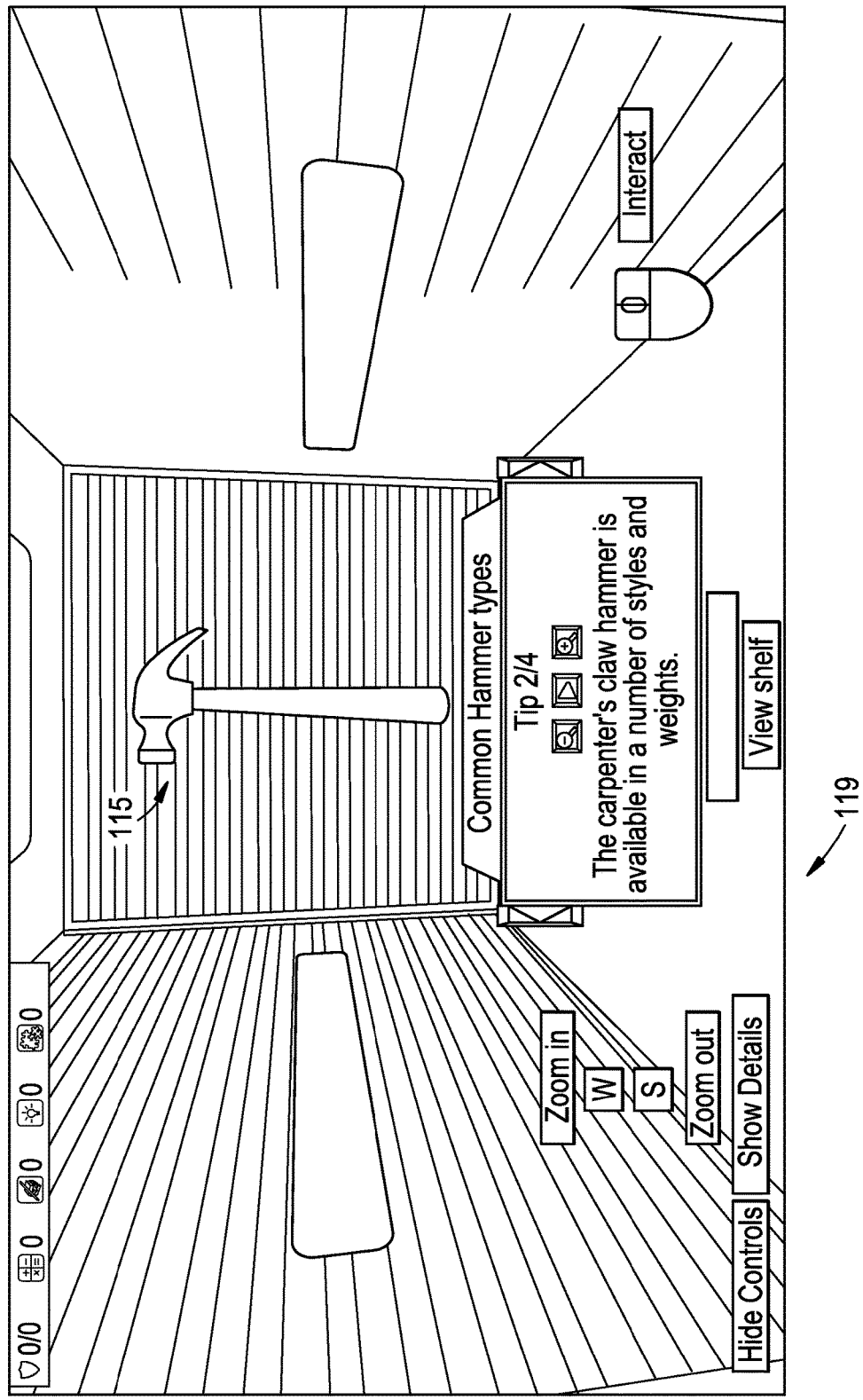
Figure 6G:
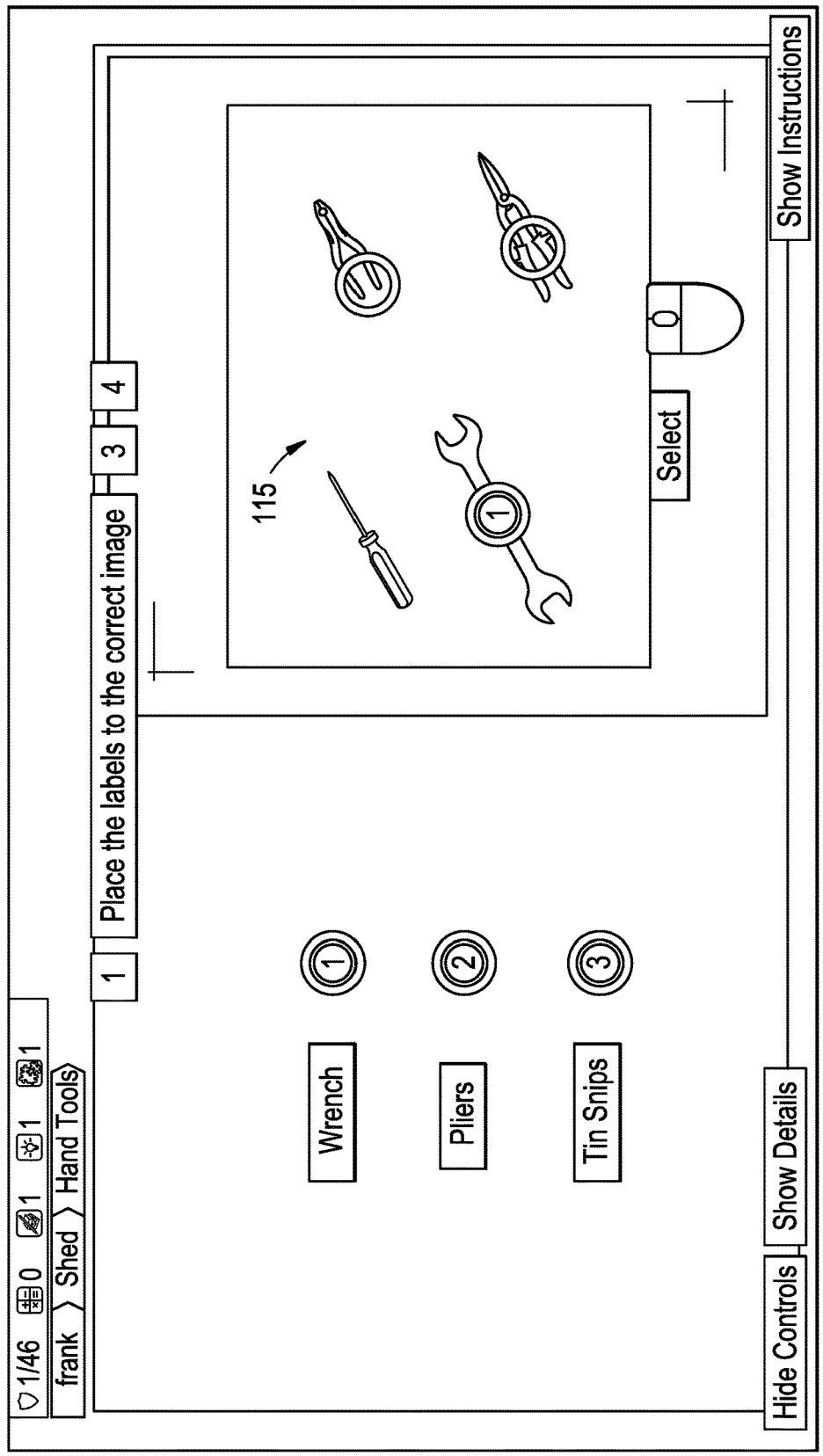

As shown in FIGS. 4A, 4B and 4C and also in 4D, 4E, 4F and 4G, in one or more embodiments the SBC system 100 presents a plurality of work sites 120, for example, three work sites 122, 124 and 126 are presented. The work sites 120 present different challenges for the user aimed at developing, reinforcing, monitoring, and/or evaluating skills of the user in performing skill-oriented tasks of typical work site process including, for example, component manufacture, construction, assembly and/or finishing processes performed by a tradesman, as well as personal and work site safety and cooperation skills involving multiple participants. As users navigates between worksites, e.g., by selecting an icon 122A, 124A, 126A, from a first, shed work site 122 to a second, ranch house work site 124, and on to a third, multi-level house work site 126, activities/skill-oriented tasks they perform require an increasing degree of skill, better integration of knowledge and process, and have a varied exposure of critical thinking and/or problem solving. As noted above, in one embodiment, a lesson plan in the SBC system 100 is driven by a work order system 130 that retrieves and stores the data and information 82 from the LMS 70. In one or more embodiments, work orders 132 within the work order system 130 are presented graphically in a list structure 136 (FIGS. 4B and 4C) or a tree structure 138 (FIGS. 4D, 4E, and 4F). Each work order 132 assigns a task that requires and, as needed, teaches a specific set of skills that builds toward a thorough exposure of all required competencies within the discipline being performed as set in accordance with, for example, an educational or other academic standard and/or as set by or in accordance with an industry, company, an educational institution, municipal/governmental or Industry Recognized Certification standards. In one embodiment, the tasks or activities to be performed within a work order 132 are illustrated in text 133 and/or as one or more icons 135 in the list structure 136 and the tree structure 138. In one embodiment, as illustrated in FIGS. 4D, 4E, 4F and 4G, the user may invoke features and functions of the SBC system 100 by selecting one of a plurality of actions 212 and 212' in an action menu 210 and 210', described in more detail below.

A user's performance as he/she completes the work order 132 is monitored and graded, scored or otherwise evaluated. In one embodiment, the user can repeat activities to improve their score and increase their learning. As users complete all work orders 132 assigned at a given work site, for example, two or more users may be "working" simultaneously to complete work orders at a work site to build teamwork, safety and cooperation skills, they obtain a comprehensive exposure to construction terms, basic hand and power tools, blueprints, and critical skills. As shown in FIGS. 4D, 4E and 4F, in one embodiment, the work sites 122, 124, 126 present work orders 132 within work order categories 140 and activities 200 within the categories 140. For example, in one embodiment, the shed work site 122 (FIG. 4D) includes the categories 140 of Worksite Preparation 142, Floor & Walls 144, Window & Door 146, Roof 148 and Worksite Review 150. The categories 140 of the shed work site 122 are geared to teach, monitor and evaluate relatively basic academic and construction-specific skills including, for example, the user's math, reading, and problem solving skills (e.g., basic academic skills), as well as blueprint reading, use of a measuring tape, knowledge of tools and their safe and effective use in assembling components of the shed structure (e.g., basic construction-specific skills).

As illustrated in FIG. 4E, as the user progresses in acquired skill, he/she may move to the ranch house work site 124, where the categories 140 include Worksite Preparation 152, Concrete Forms 154, Floor 156, Walls & Ceiling 158, Roof 160, Window & Door 162 and Worksite Review 164. The categories 140 of the ranch house work site 124 are geared to expand the user's knowledge and skill in relatively more advanced academic and construction-specific skills including, for example, the user's math, reading, and problem solving skills, as well as blueprint reading, load bearing calculations, measuring and cutting more critical components such as, for example, roof rafters, trusses, and the like, and more advanced knowledge of tools and their safe and effective use in assembling components of the ranch house structure. Similarly, as illustrated in FIG. 4F, as the user even further progresses in acquired skills, he/she may move to the multi-level house work site 126, where the categories 140 include Worksite Preparation 170, Floor 172, Walls & Ceiling 174, Stairs 176, Roof 178, Window & Door 180, Drywall 182, and Worksite Review 184. The categories 140 of the multi-level house work site 126 are geared to even further expand the user's knowledge and skill in relatively more advanced academic and construction-specific skills including, for example, the user's math, reading, and problem solving skills, as well as blueprint reading, load bearing calculations, measuring and cutting more critical components such as, for example, hipped roof rafters, stairs (rises, runs, and the like) and more advanced knowledge of tools and their safe and effective use in assembling components of the multi-level house structure. In one embodiment, the SBC system 100 may introduce, randomly for example, interruptions in activities to emphasize personal and work site safety. For example, when working on one or more of the work sites 122, 124 and 126, the SBC system 100 may introduce one or more work site safety issues such as, for example, a falling tool or piece of construction material, an unsafely placed (e.g., leaning) piece of construction material, a worker operating a tool in an unsafe manner, or the like, to test the student's reaction to the occurring or potentially occurring safety hazard.

As shown in FIGS. 4D, 4E and 4F, the work order categories 140 include one or more activities 200 that include consecutive and sequential or parallel tasks that are performed to complete the work order categories 140, for example, the work site preparation category 170 of the multi-level house site 126 (FIG. 4F) includes a Read Blueprint step 170A, a Tools & Materials Identification step 170B and a Safety Check step 170C.

In one embodiment, the user may view or print a work order 132 and the activities detailed therein to aid his/her performance. One embodiment of a displayed or printed work order 132 is shown in FIG. 5 as work order 190. As shown in FIG. 5, the work order 190 provides instructions or activities, shown generally at 192, for the completion of an exterior wall in the shed work site 122, depicted graphically at 194 in, for example, a finished form 194A and as would be presented on a blueprint 194B. As shown in FIG. 5, the work order 190 has one or more icons 196 that identify skill areas including safety, critical thinking, academic skills, and carpentry tasks within the activities 192 being performed under the work order 190. Once the work order is complete, the user and an instructor can review his or her performance and progress in attaining the academic and/or construction-specific skills employed within the work order 190.

In one embodiment, the SBC system 100 may include an Odd Job feature 112A (FIG. 3B). Odd Jobs 112A are intended to teach tasks like, for example, job site safety and critical thinking, and reinforce basic terminology and job skills within the discipline being performed. In one embodiment, as the user completes each work order 132, they are given the opportunity to perform side tasks, for example, one or more of the Odd Jobs 112A. While these tasks are not required, they are designed to reinforce skills and to instill the importance of teamwork and safety on the work site. Completion of Odd Jobs 112A is seen to improve work site morale and provide a positive impact on the user/student's overall performance.

With reference again to FIGS. 1A to 1C, in one embodiment, the training environment of the SBC system 100 includes a work site within a construction site 102 (FIG. 1A) or a workshop or garage 104 (FIG. 1B) where skills are acquired and/or reinforced in, for example, a carpentry discipline. The user controls the avatar 116 to indicate his/her position and actions taken within the virtual training environment 102 and 104, for example, of the SBC system 100. In one embodiment, illustrated in FIGS. 6A, 6B and 6C, the user may selectively vary characteristics of his/her avatar 116 including, for example, physical features such as gender, hair, skin tone and the like, clothing, footwear, gloves, hats and/or accessories of a male or female worker, selected from one or more toolbars 117. As shown in FIGS. 6D, 6E, 6F and 6G, the user also controls tools 115 that he/she will use to perform activities within the work sites (e.g., the construction site 102 (FIG. 1A) or the workshop or garage 104 (FIG. 1B)). In one embodiment, the SBC system 100 provides a tool shelf 118 (FIG. 6D) and tool shed or box 119 (FIG. 6E) where the user/student can learn and/or be tested on type (FIG. 6F), characteristics and/or functions or purpose of various tools 115 (FIG. 6E) such as, for example, how the tools safely operate, are safely maintained (e.g., cleaned, repaired, etc.), how attachments and/or new components (e.g., saw blades) are added, removed, etc. from the tools, should and should not be used, hints or tips for maximizing the effectiveness of the tools 115, and the like. In the tool box 119, the user may also learn about materials, fasteners and the like used on a typical worksite. In one embodiment, the hint or tip includes a message having audio, video, text, graphics, one or more hyper-links, or like means for communicating information to a user.

Figure 7A:
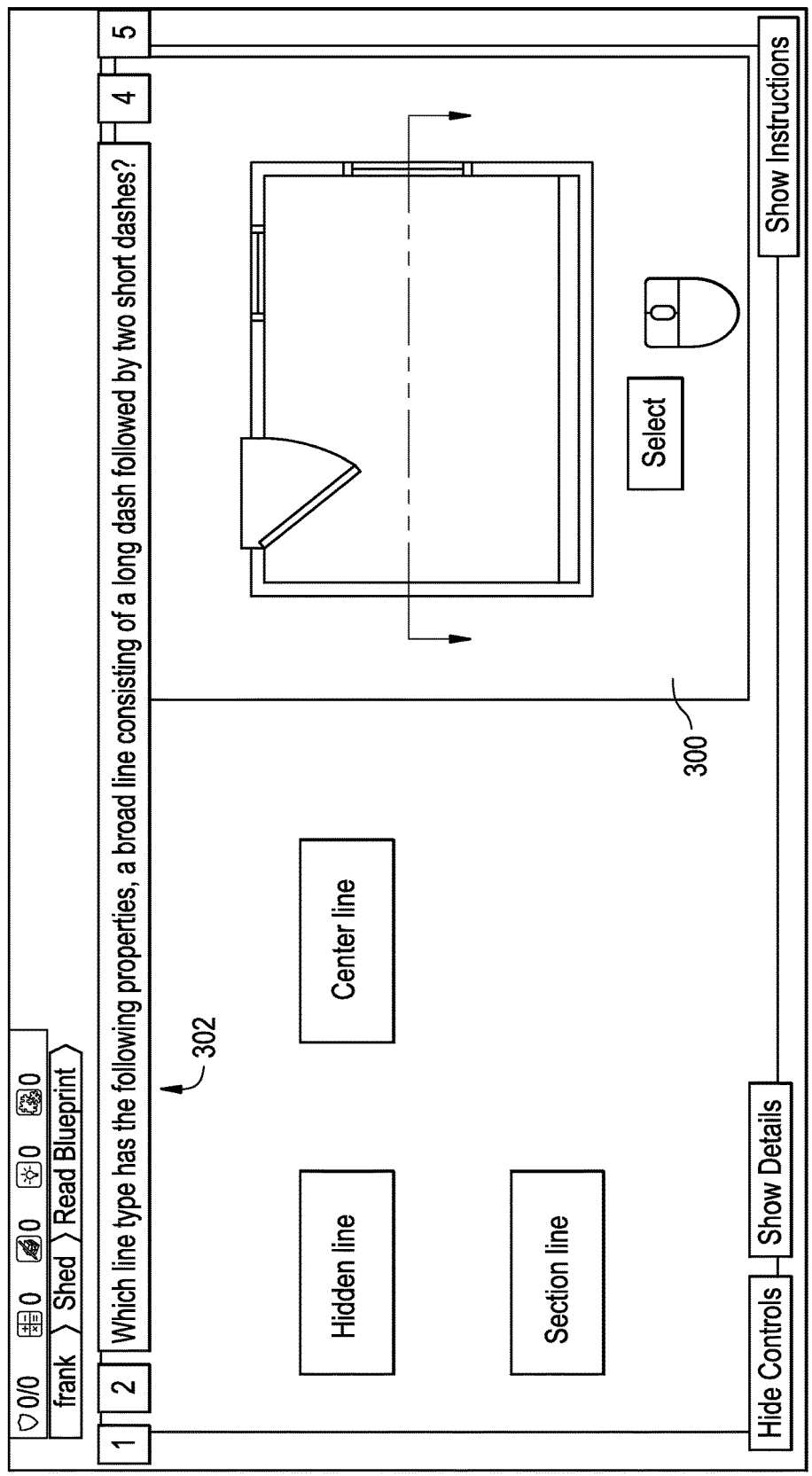
FIGS. 7A to 7C depict exemplary GUIs implemented on the system of FIG. 2 exhibiting a blueprint and evaluating a user's knowledge in identifying characteristics of the blueprint and information presented thereon, in accordance with one embodiment of the present invention.
Figure 7B:
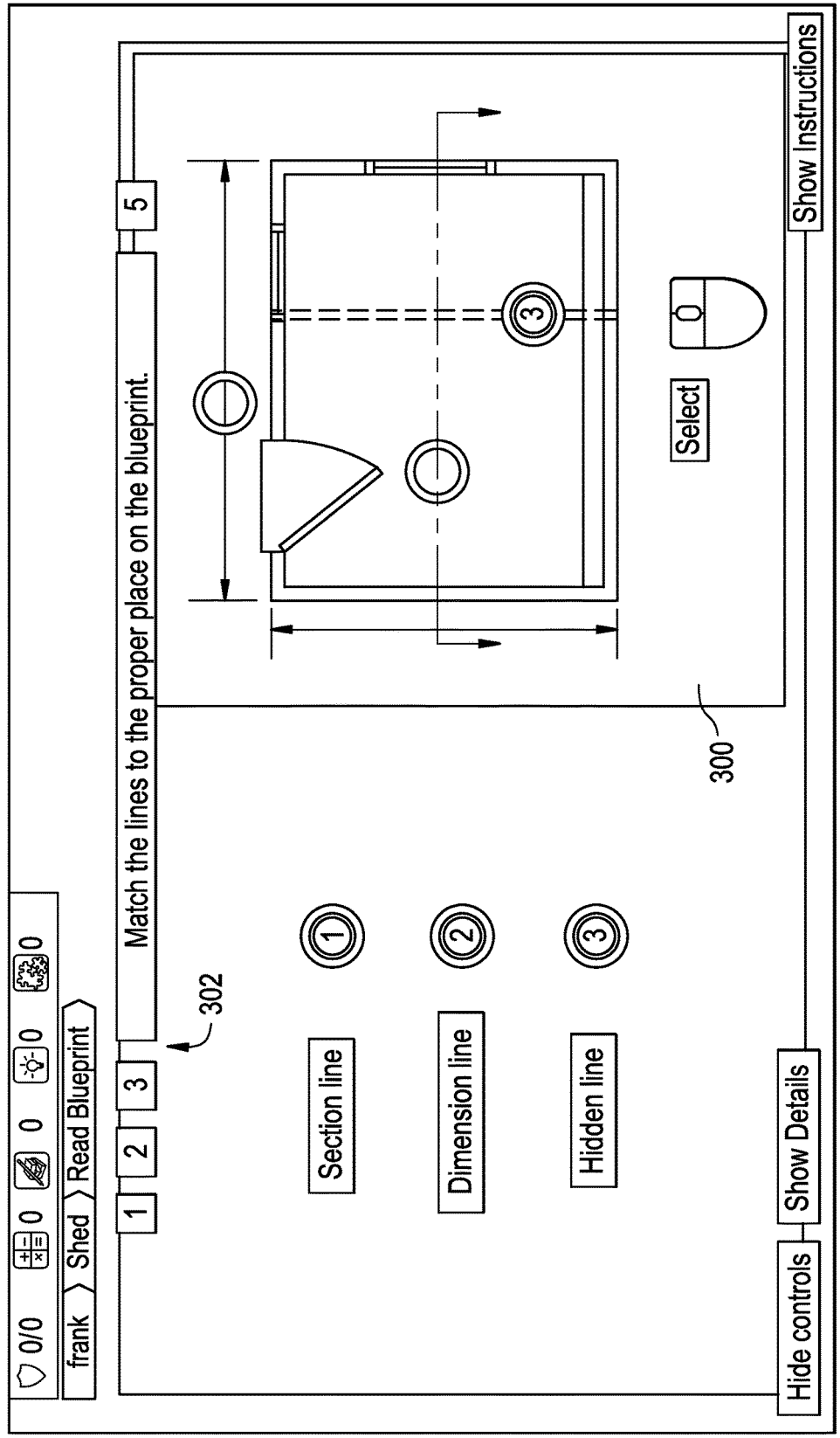
Figure 7C:
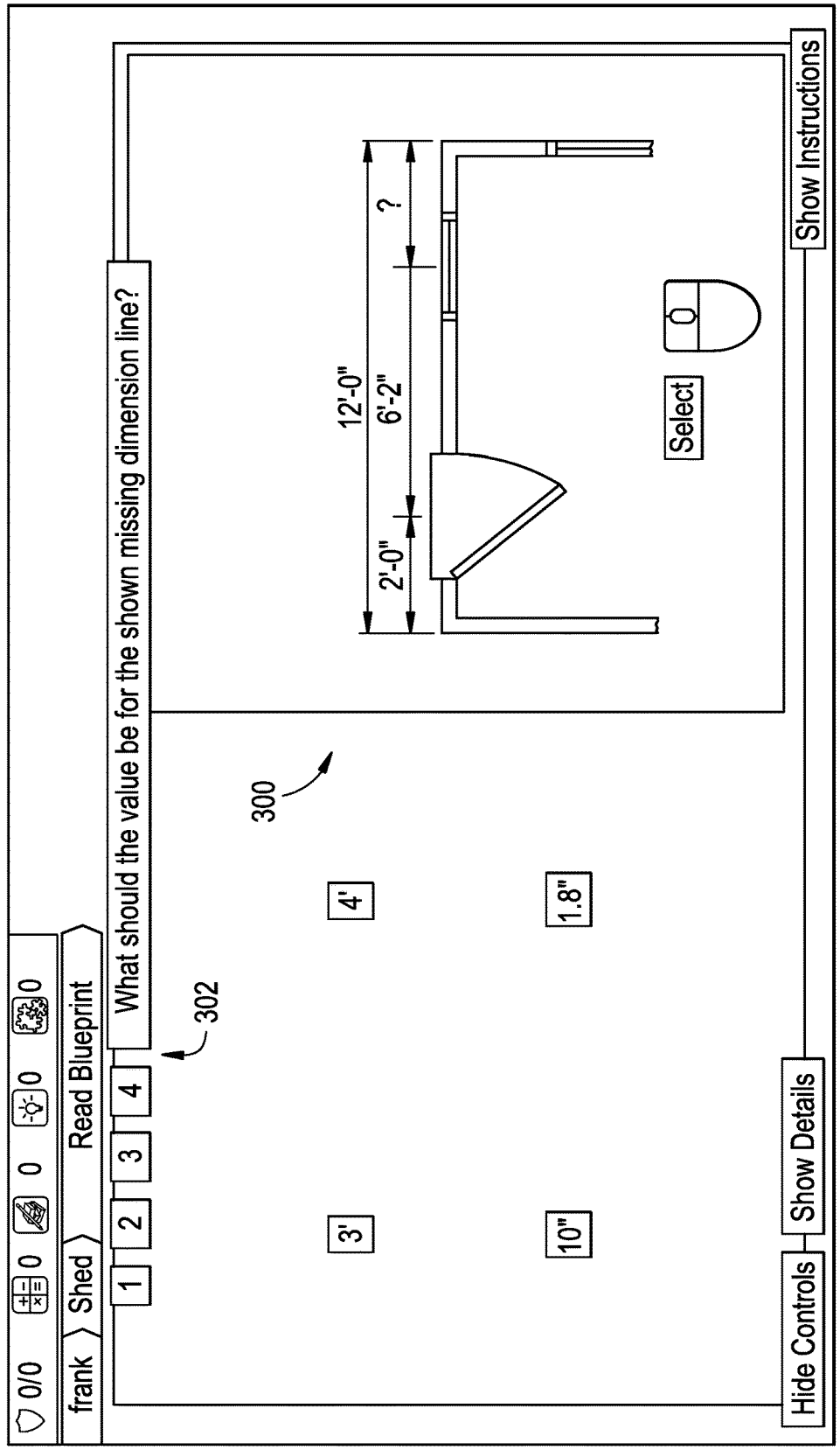
Figure 8A:
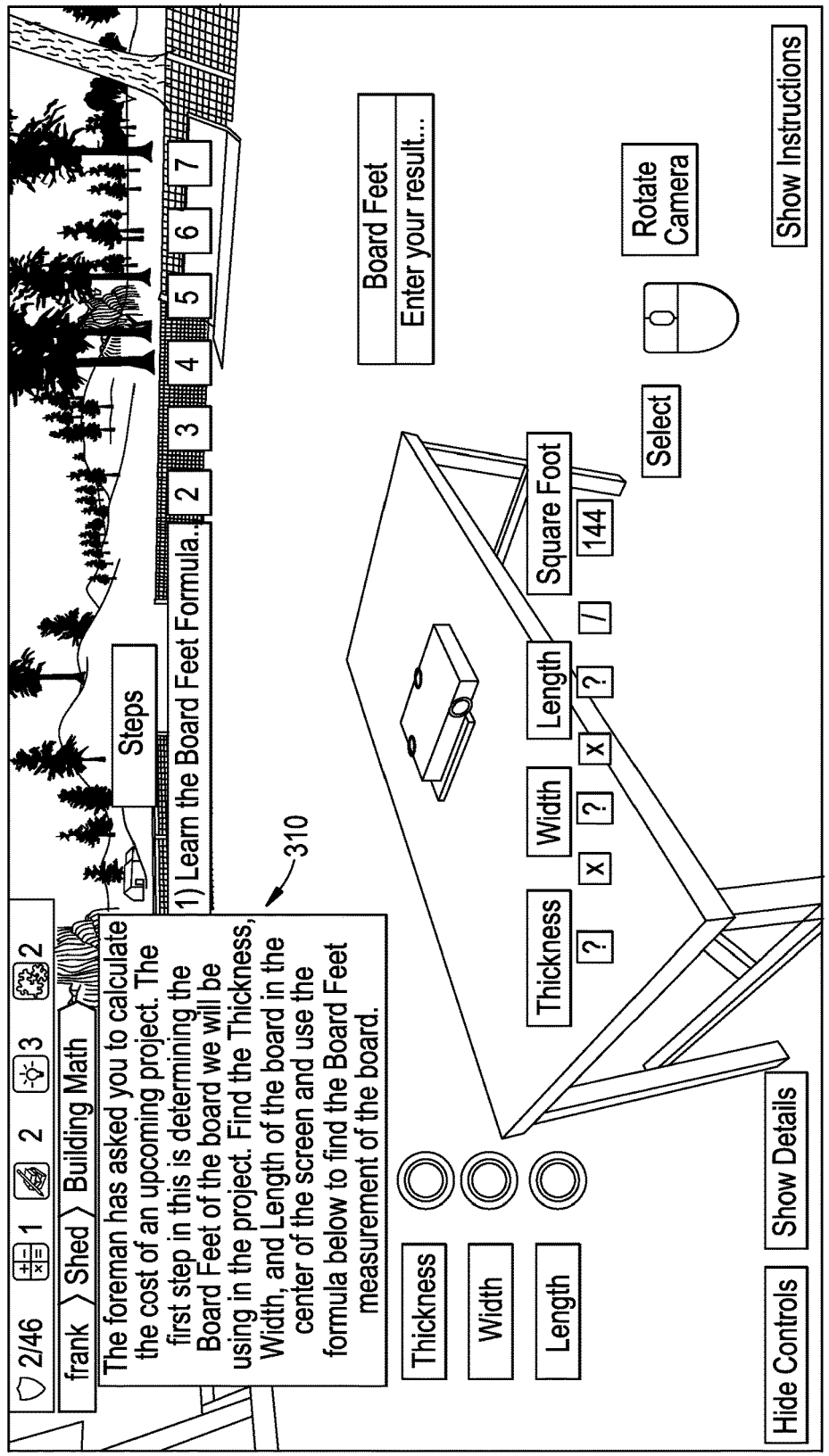
FIGS. 8A and 8B depict exemplary GUIs implemented on the system of FIG. 2 exhibiting activities within a work order and evaluating a user's knowledge of the activities and how to perform calculations required thereon, in accordance with one embodiment of the present invention.
Figure 8B:
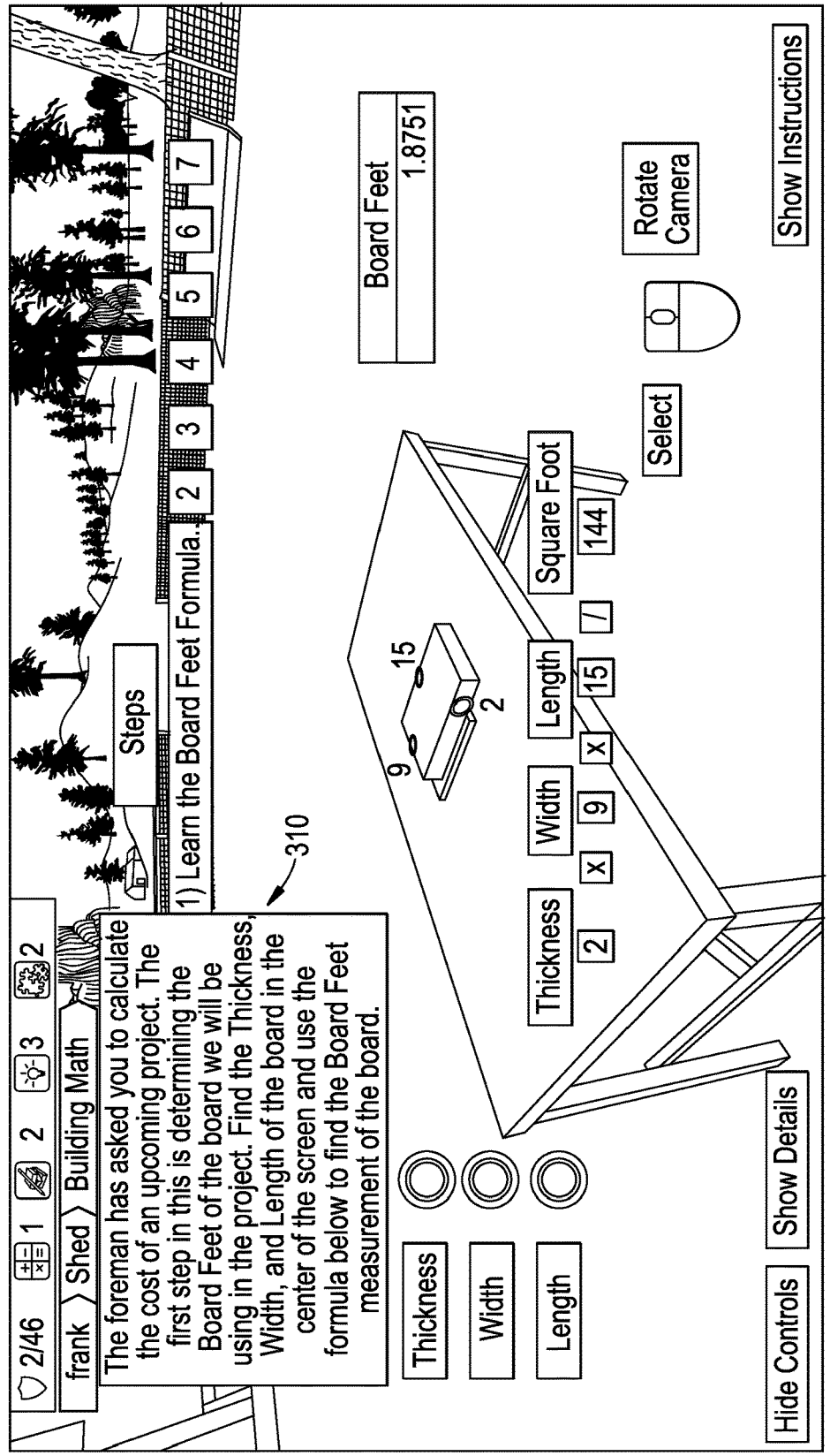
Figure 9A:
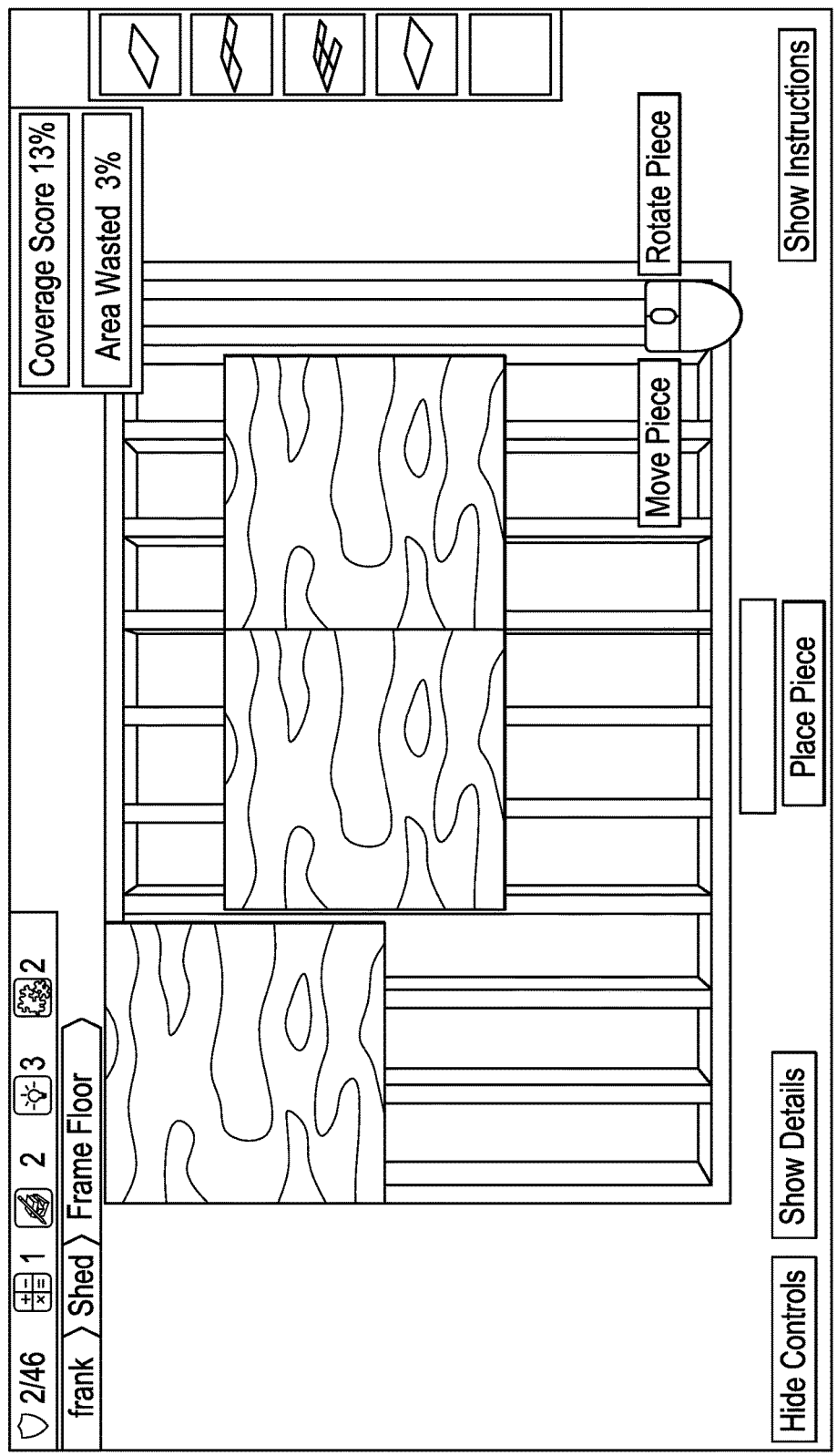
FIGS. 9A and 9B, 10A to 10C, 11A and 11B, 12A and 12B, 13A and 13B, 14A to 14H, 15A to 15C, and 16A to 16D depict exemplary GUIs implemented on the system of FIG. 2 exhibiting the user operating the system to perform various skill-oriented tasks and activities within work orders, in accordance with one embodiment of the present invention.
Figure 9B:
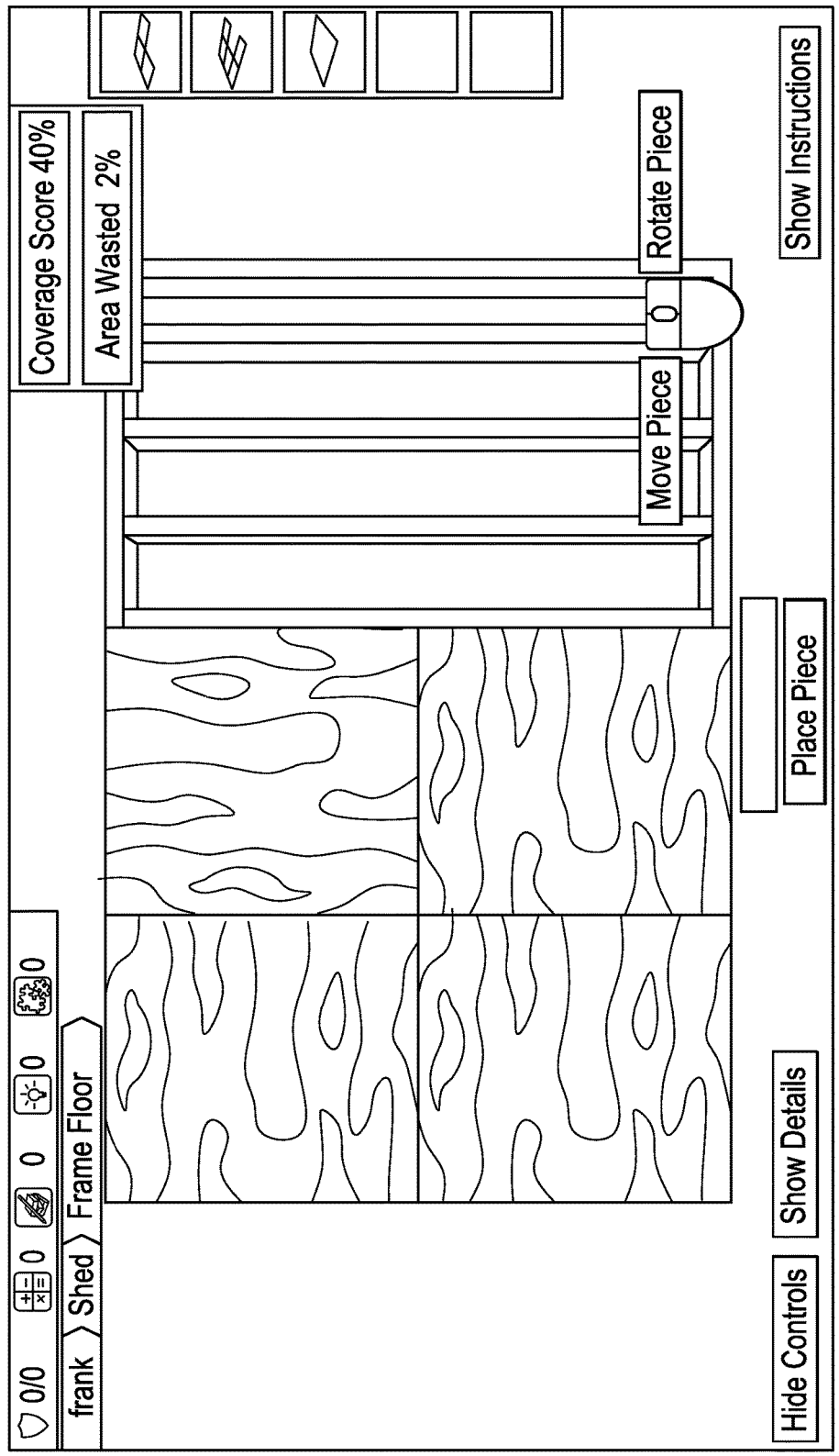

As noted above, the user/operator of the SBC system 100 is represented in the virtual training environment 100 with the avatar 116, which the operator can navigate (e.g., with one or more of the input devices 22) through the virtual environment and manipulate to cause certain actions in the environment. In one embodiment, the user begins his/her learning in a trailer 101 on the construction site 102 (FIG. 1A) or the work shop or garage 104 (FIG. 1B) by receiving a work order 132 in one of the plurality of work sites 120, for example, the shed work site 122, the ranch house work site 124, or the multi-level house work site 126. One exemplary work flow through the SBC system 100 and work sites 122, 124 and 126 is illustrated in FIG. 1C. Following the instruction/activities given on the work order 132, the user moves to the first activity. For example, with reference to FIG. 4D, a first activity under the Worksite Preparation 142 category is to Read Blueprint 142A. As shown in FIGS. 7A to 7C, the user is presented with a blueprint 300 and his/her skill in reading the blueprint is evaluated by one or more questions 302 aimed at evaluating the user/student's knowledge, e.g., in identifying characteristics of the blueprint, or in calculating values. As shown in FIGS. 8A and 8B, the work orders 132 may include common tasks requested by the SBC system 100 "acting" as a work site foreman. For example, as shown generally at 310, the SBC system 100 requests that the user/student calculate a cost associated with a project. A first step in determining the cost is to determine the amount (e.g., board feet) of material needed. In determining a result, the user may invoke one or more of the plurality of actions 212 available to him/her in the action menu 210, for example, a Calculate Action 212A as shown in FIG. 4D. As shown in FIGS. 8A and 8B, the Calculate Action 212A assists the user/student in determining the amount of material needed by, for example, calculating the square feet for a specified board based on the dimensions entered by the user for thickness, width and length of the board material.

Figure 10A:
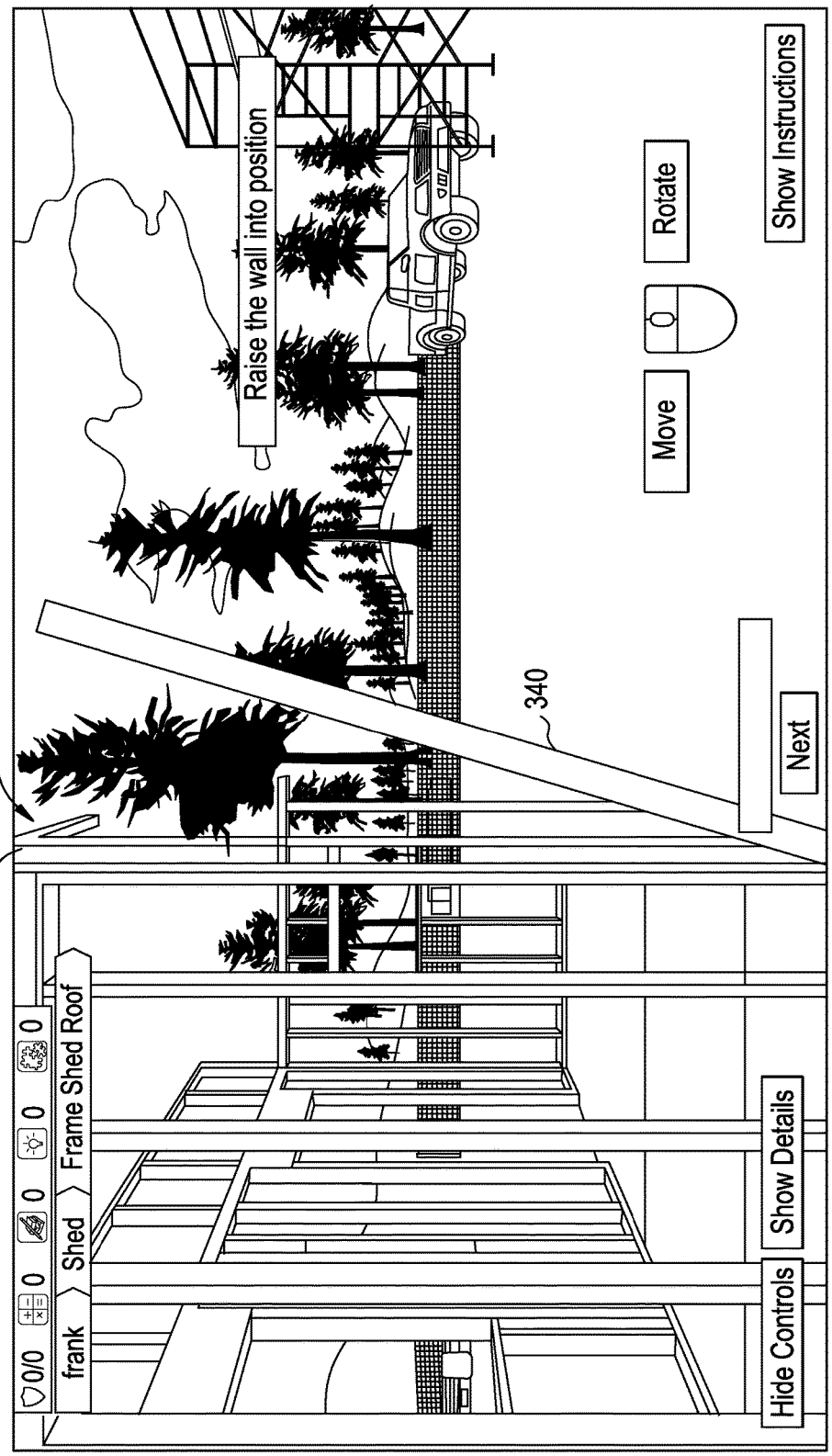
Figure 10B:
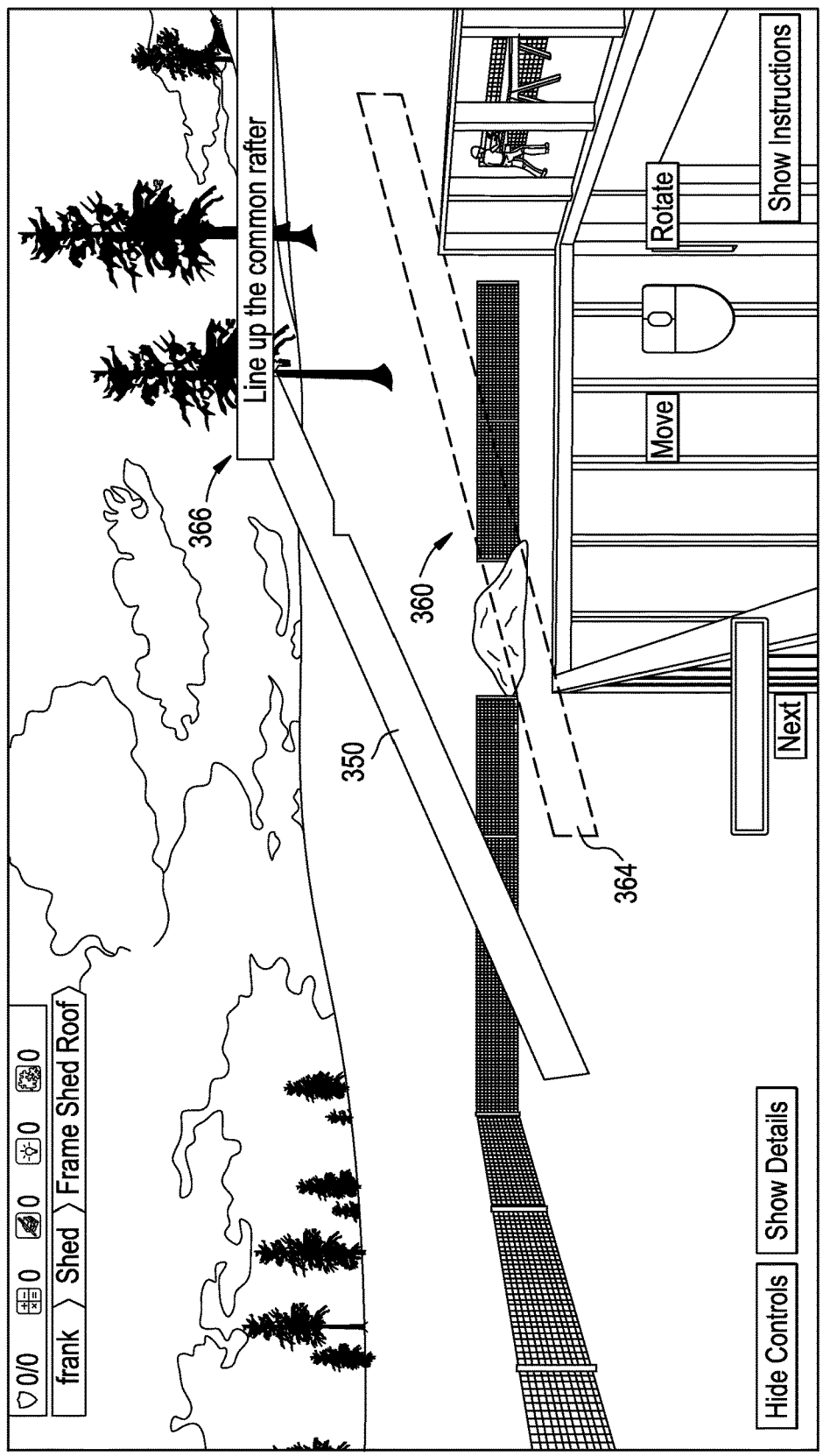
Figure 10C:
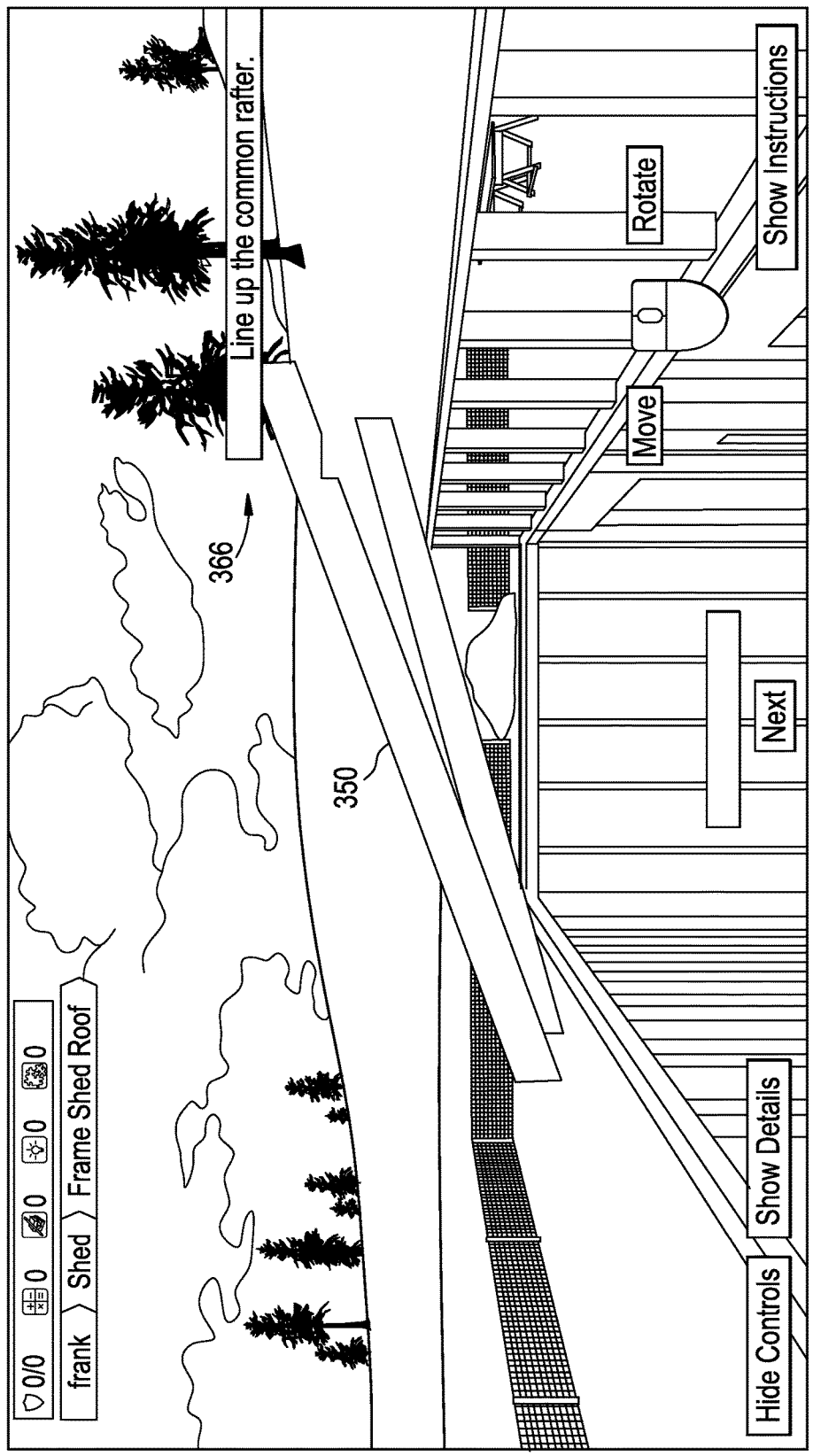
Figure 11A:
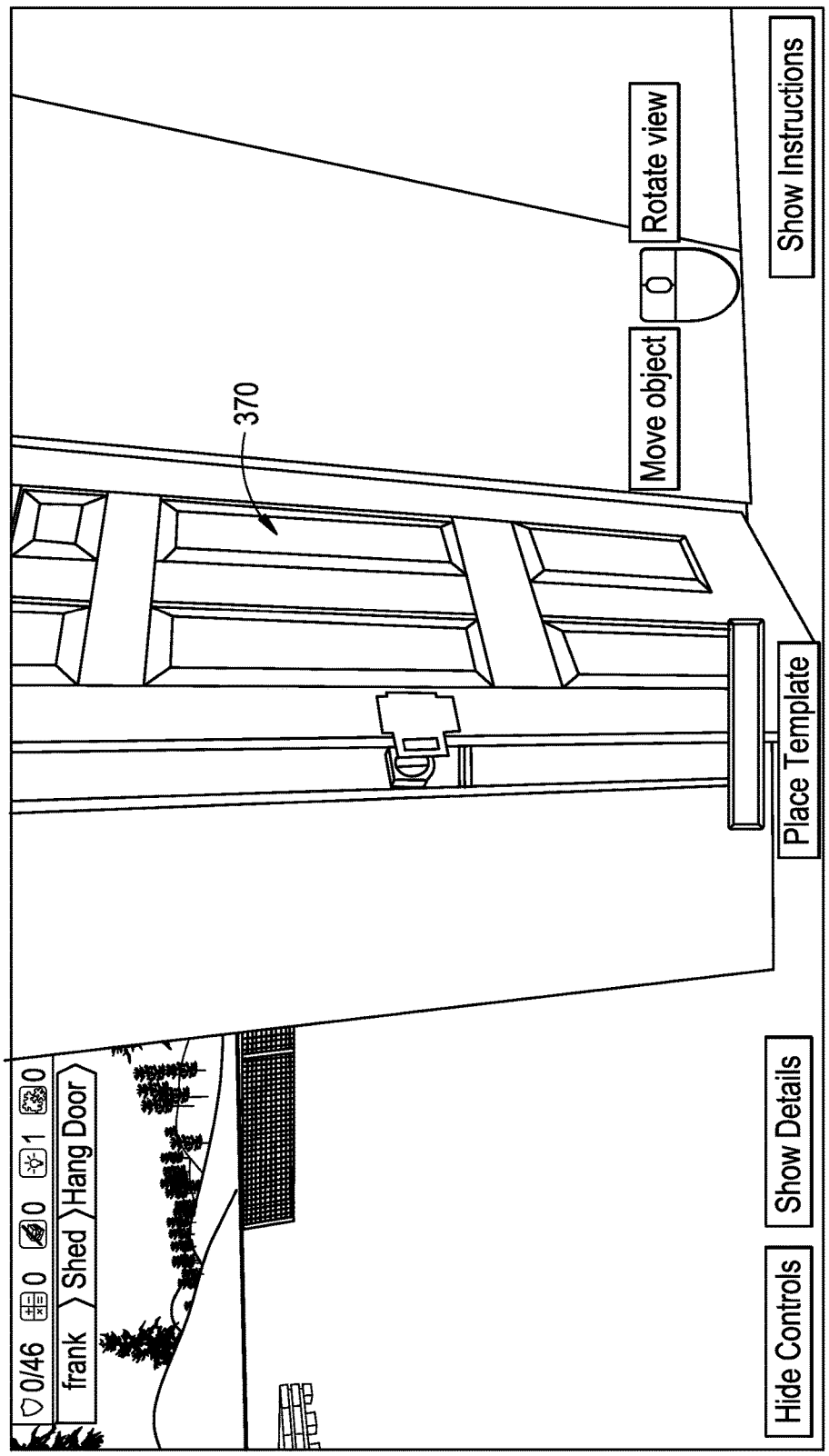
Figure 11B:
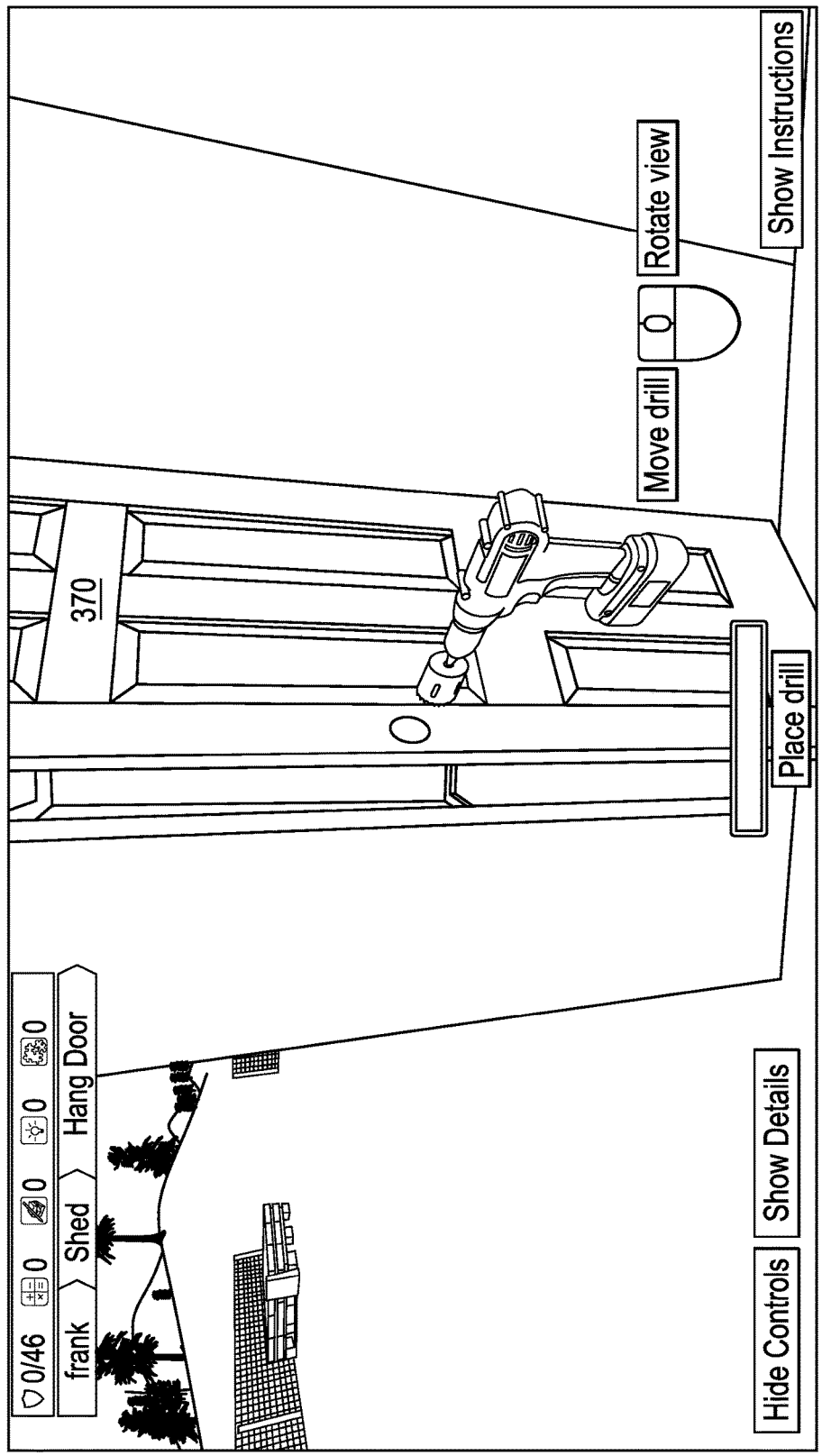

In accordance with the present invention, and as illustrated above, as the user performs activities within a work order 132, one or more of the plurality of actions 212 and 212' in the action menus 210 and 210' may be invoked. For example, in the shed work site 122 (FIG. 4D) in a Frame Floor activity 144A of the Floor & Walls 144 category a Cover Action 212B is invoked. The Cover Action 212B initiates the GUIs of FIGS. 9A and 9B that monitor and evaluate the user as he/she performs the activity to frame a portion of a floor of the shed. Similarly, in a Frame Shed Roof activity 148A of the Roof 148 category (FIG. 4D) a Frame Action 212C is invoked to initiates the GUIs of FIGS. 10A, 10B and 10C that monitor and evaluate the user as he/she performs the activity to raise a wall 340 in position (FIG. 10A) and to align and frame portions (e.g., rafters 350) of a roof of the shed (FIGS. 10B and 10C). In one embodiment, the SBC system 100 includes one or more visual aids 360 that may guide or instruct a user/student as they are performing a task, for example, to illustrate proper placement, alignment (e.g., height, pitch, angle or the like), and the like, of components, speed or angle of tools during operation, movement of materials being worked on (e.g., feed through a saw), and the like. For example, and as shown in FIGS. 10A and 10B, the visual aids 360 include a phantom or shaded representation 362 of the wall 340 being raised or a phantom or shaded representation 364 of the rafter 350 being installed in place on the roof, and as shown in FIG. 10B, helpful hints or tips 366 may be displayed to guide or instruct the student. Similarly, in a Hang Door Frame activity 146A of the Window & Door 146 category (FIG. 4D) an Install Action 212D is invoked to initiates the GUIs of FIGS. 11A and 11B that monitor and evaluate the user as he/she performs the activity to install a door 370 in position (FIG. 11A) and to drill a hole in the door 370 to accept a door knob (FIG. 11B). In one embodiment, the SBC system 100 includes one or more visual aids 360 that may guide or instruct a user/student as they are performing a task.

Figure 12A:
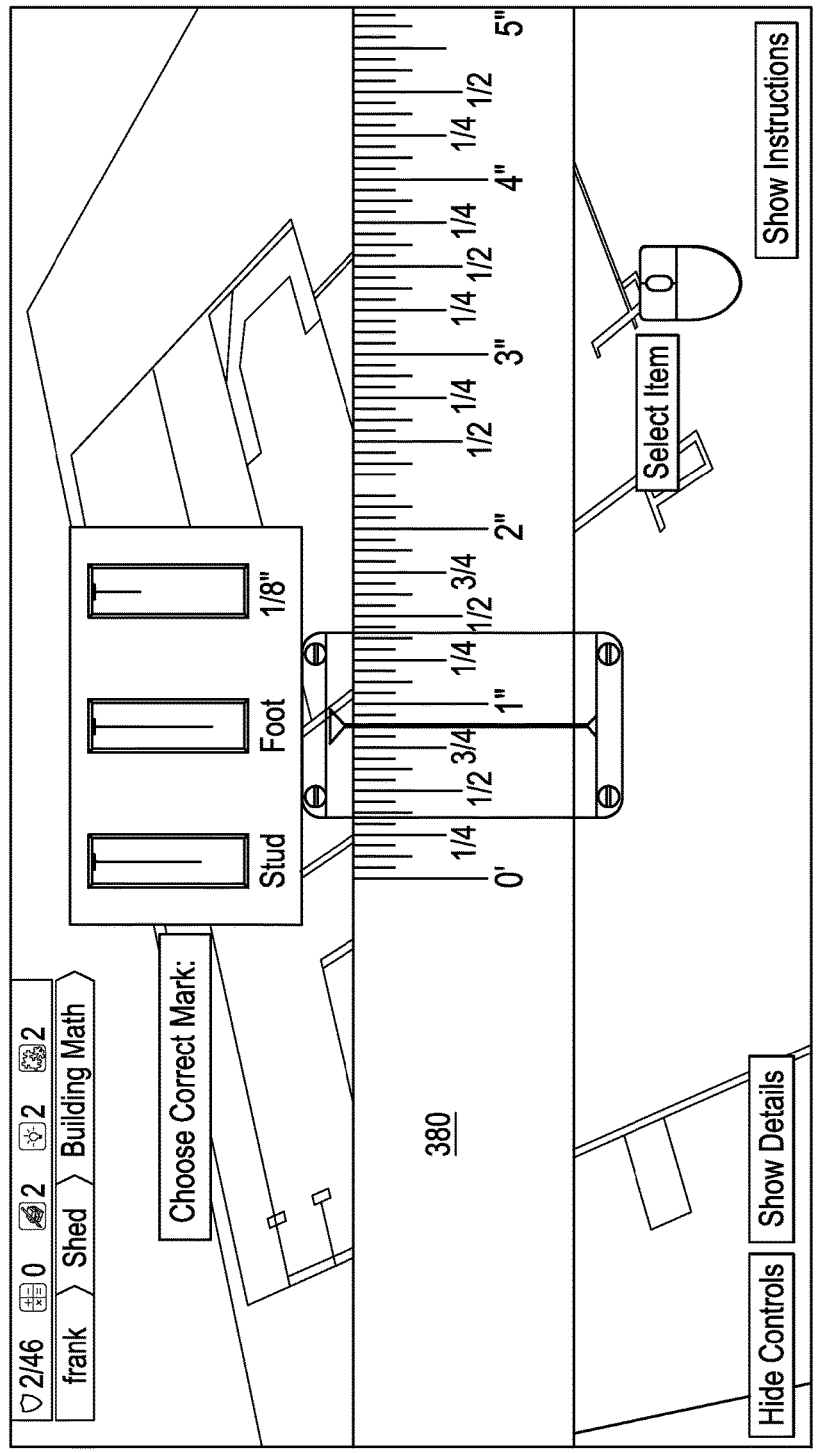
Figure 12B:
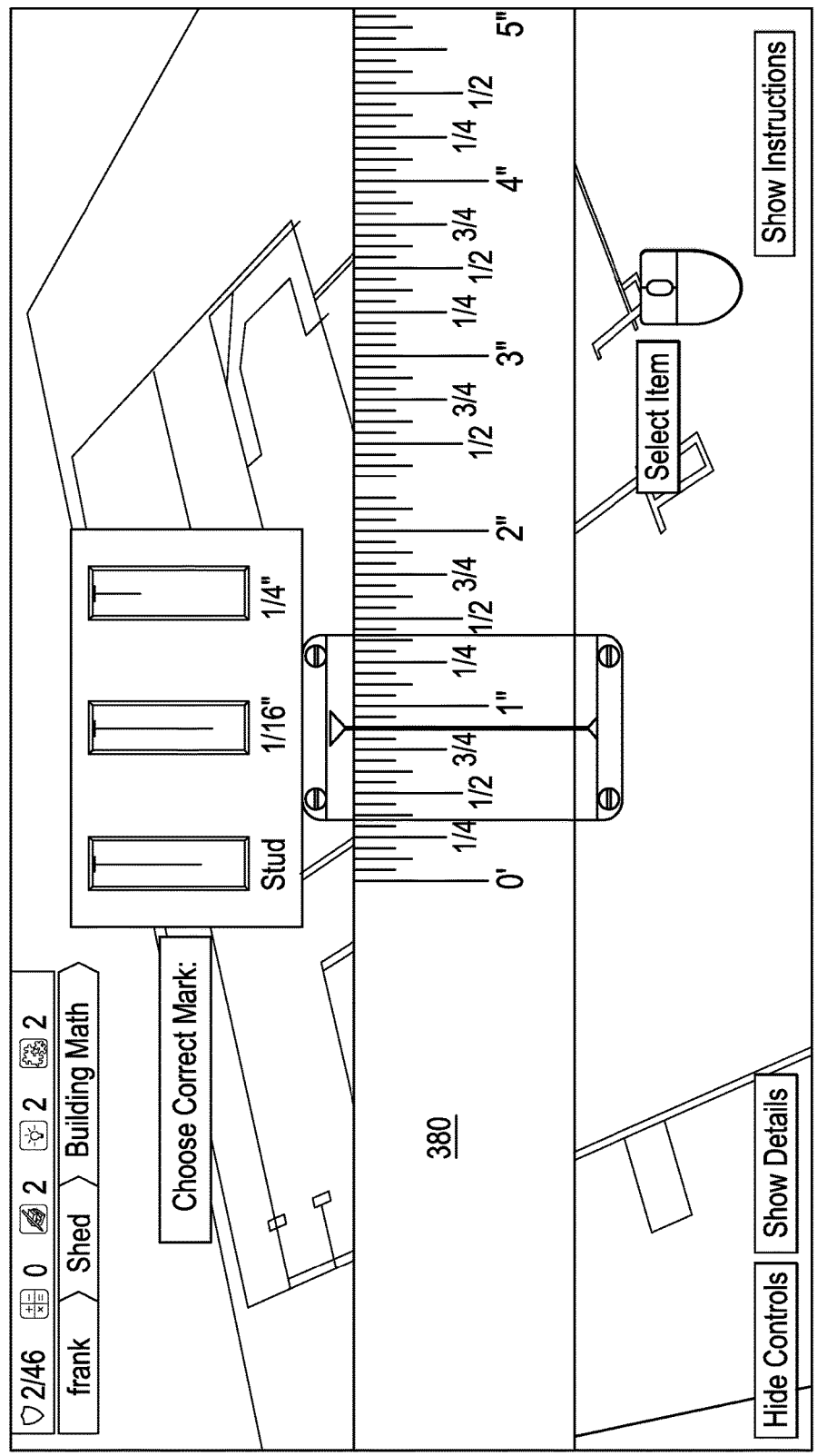
Figure 13A:
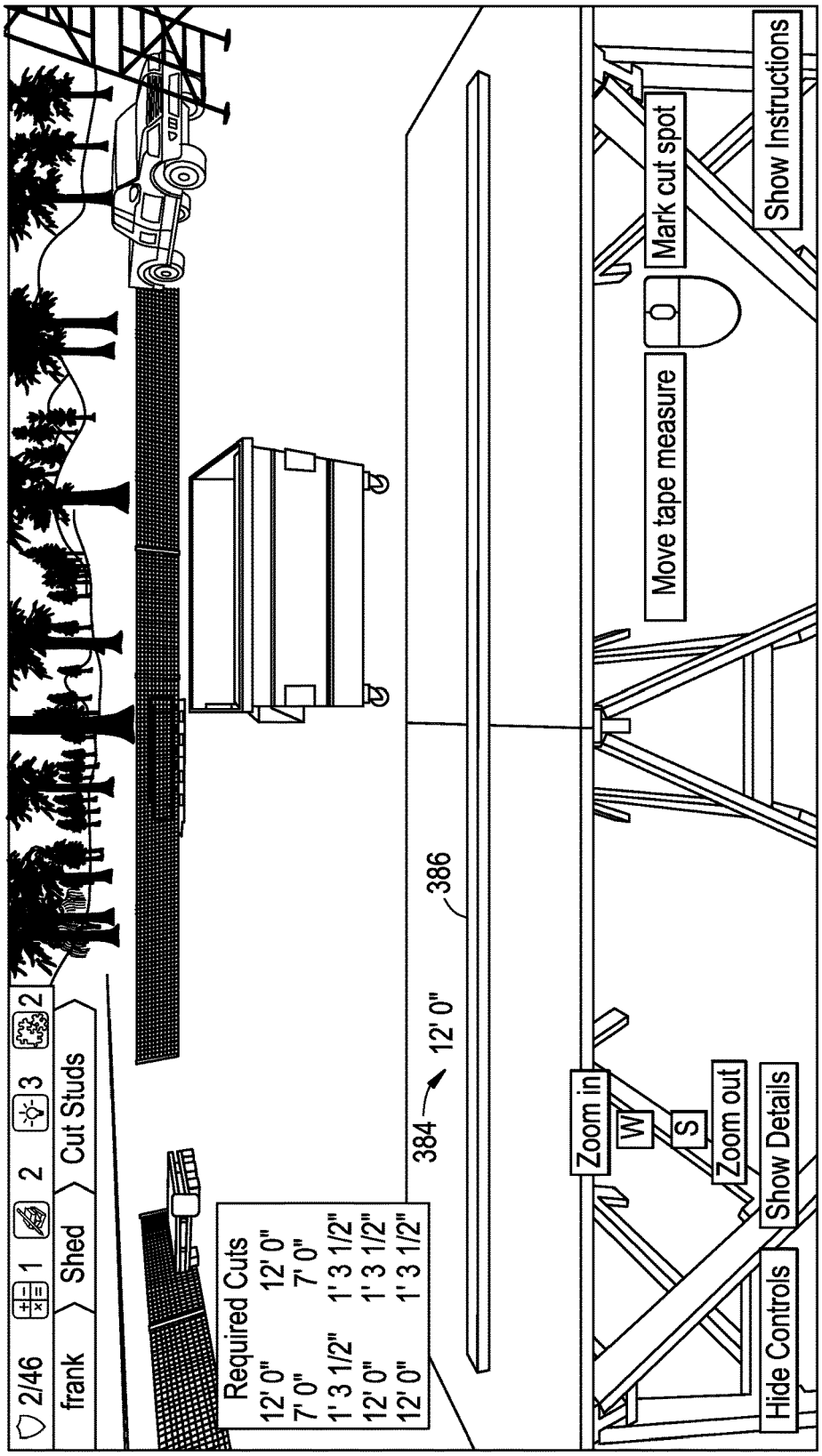
Figure 13B:
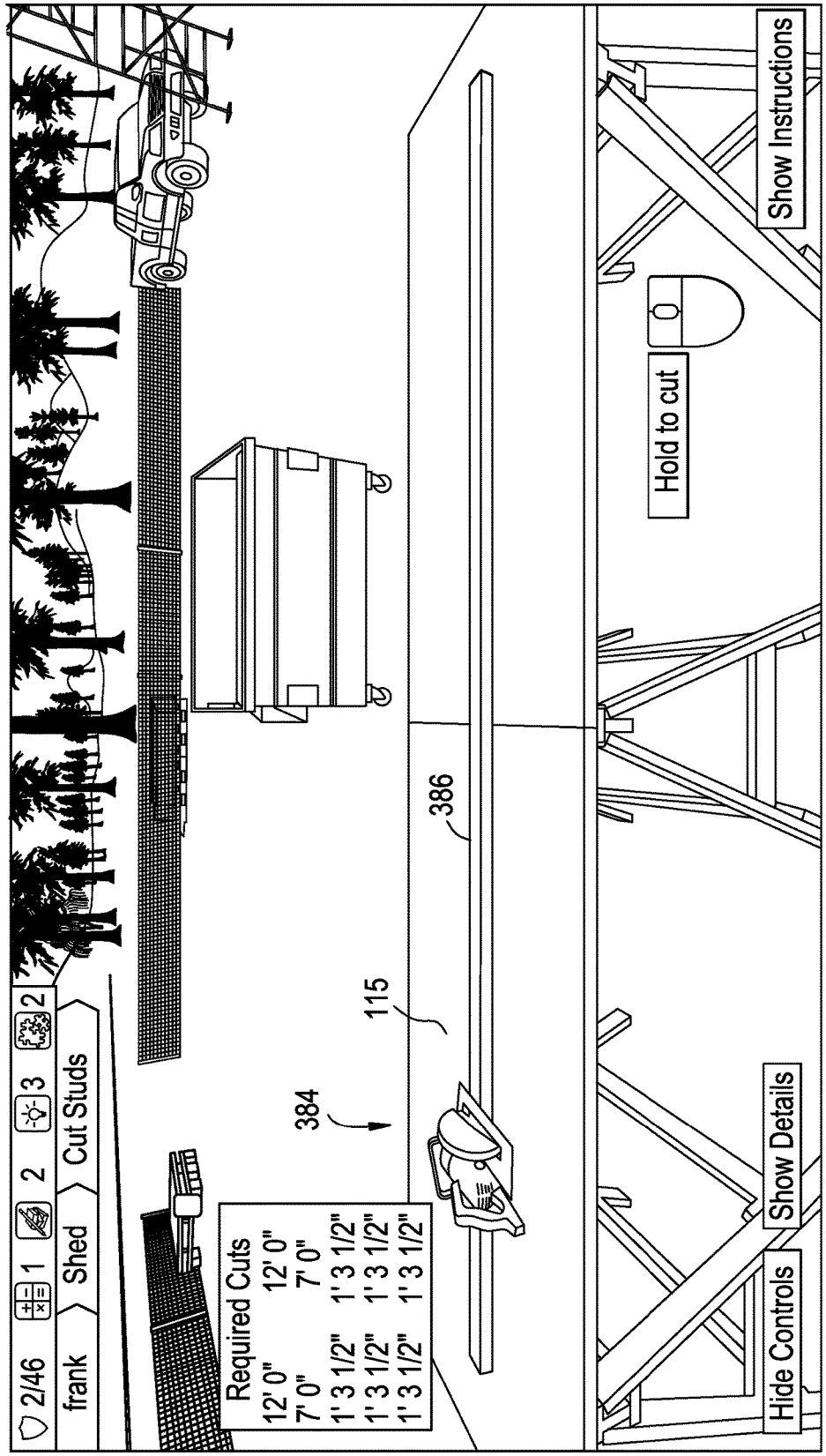

It should be appreciated that the SBC system 100 instructs and/or encourages the user/student to remember to always follow safe worksite practices and pay attention to minimizing waste and working efficiently to keep within the project budget. Doing so, improves their score. As illustrated above, many activities in the work site are performed in a sequence of successive actions. For example, in the first step in building the wall is to determine the amount of wood that is needed. The user/student estimates the type and number of logs needed to yield the required cuts of lumber. He/she does the math to calculate the most efficient use of materials to do the cuts, as those choices will affect the overall project budget. He/she may use a crane to collect the lumber needed. Performance is measured on the number of logs collected in the time permitted. Properly measuring and cutting lumber is a fundamental carpentry skill. The user/student needs to optimize each 14-foot plank to fill the required cuts. He/she decides whether to keep, trash, or re-cut the lumber. He/she will minimize waste by re-cutting the lumber to fill smaller required lengths. As shown in FIGS. 12A and 12B, a Tape Reading Action 212E is invoked to initiates the GUIs that monitor and evaluate the user as he/she determines a proper measurement on a representation 380 of a tape measure. Similarly, as shown in FIGS. 13A and 13B, generally at 384, a Measure & Cut Action 212F initiates the GUIs that monitor and evaluate the user as he/she determines a proper length at which to cut a board 386.

Figure 14A:
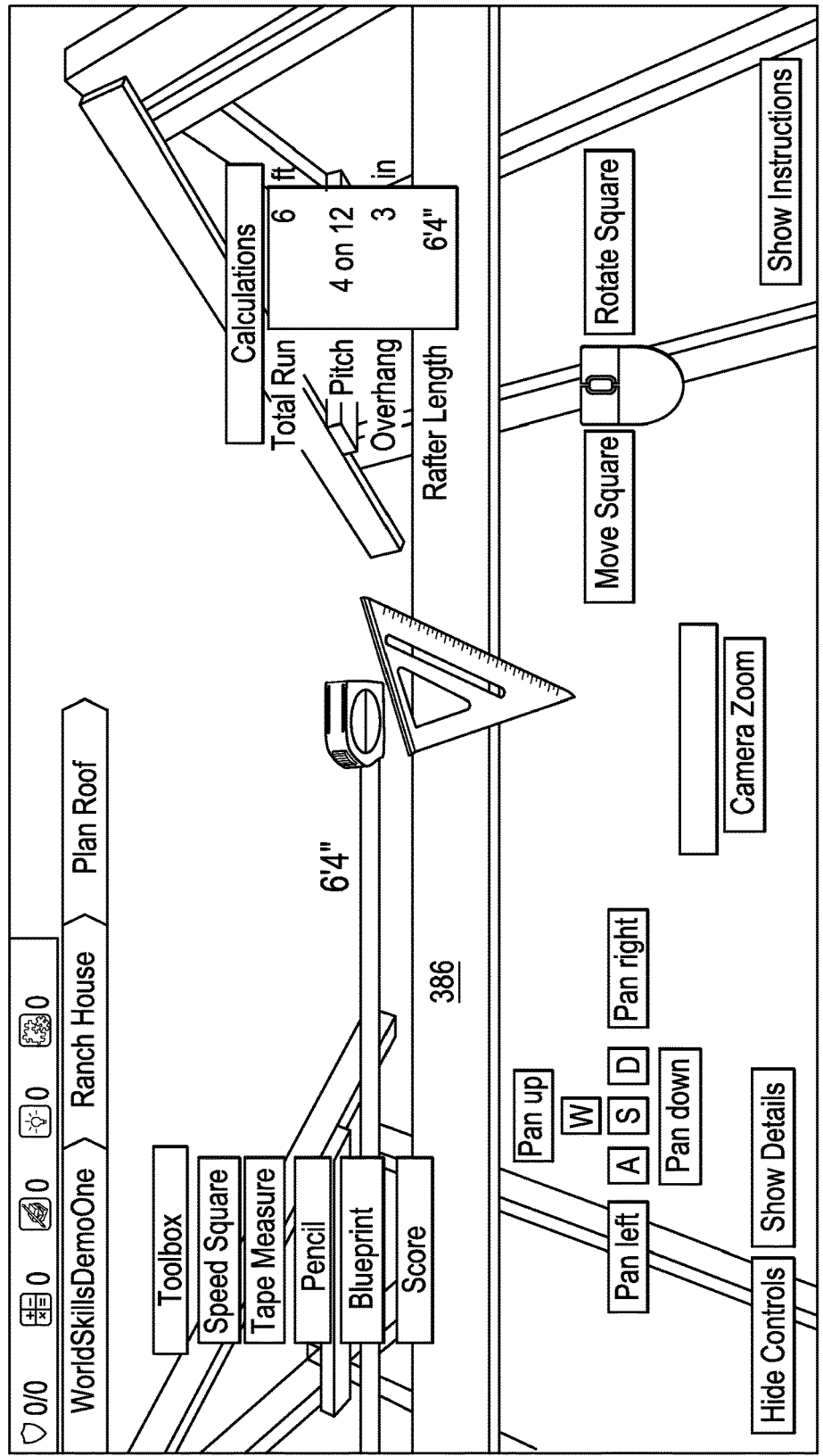
Figure 14B:
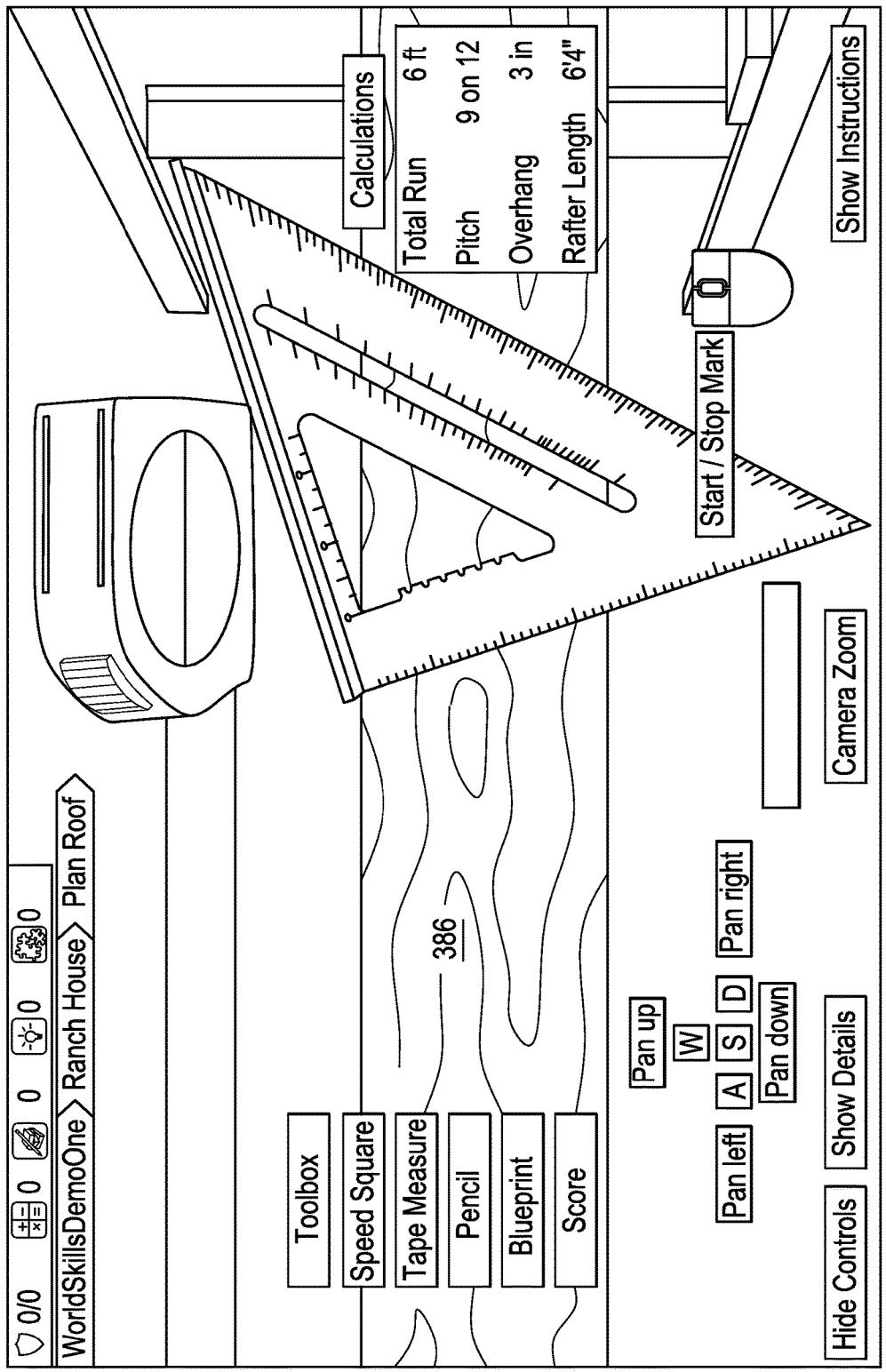
Figure 14C:
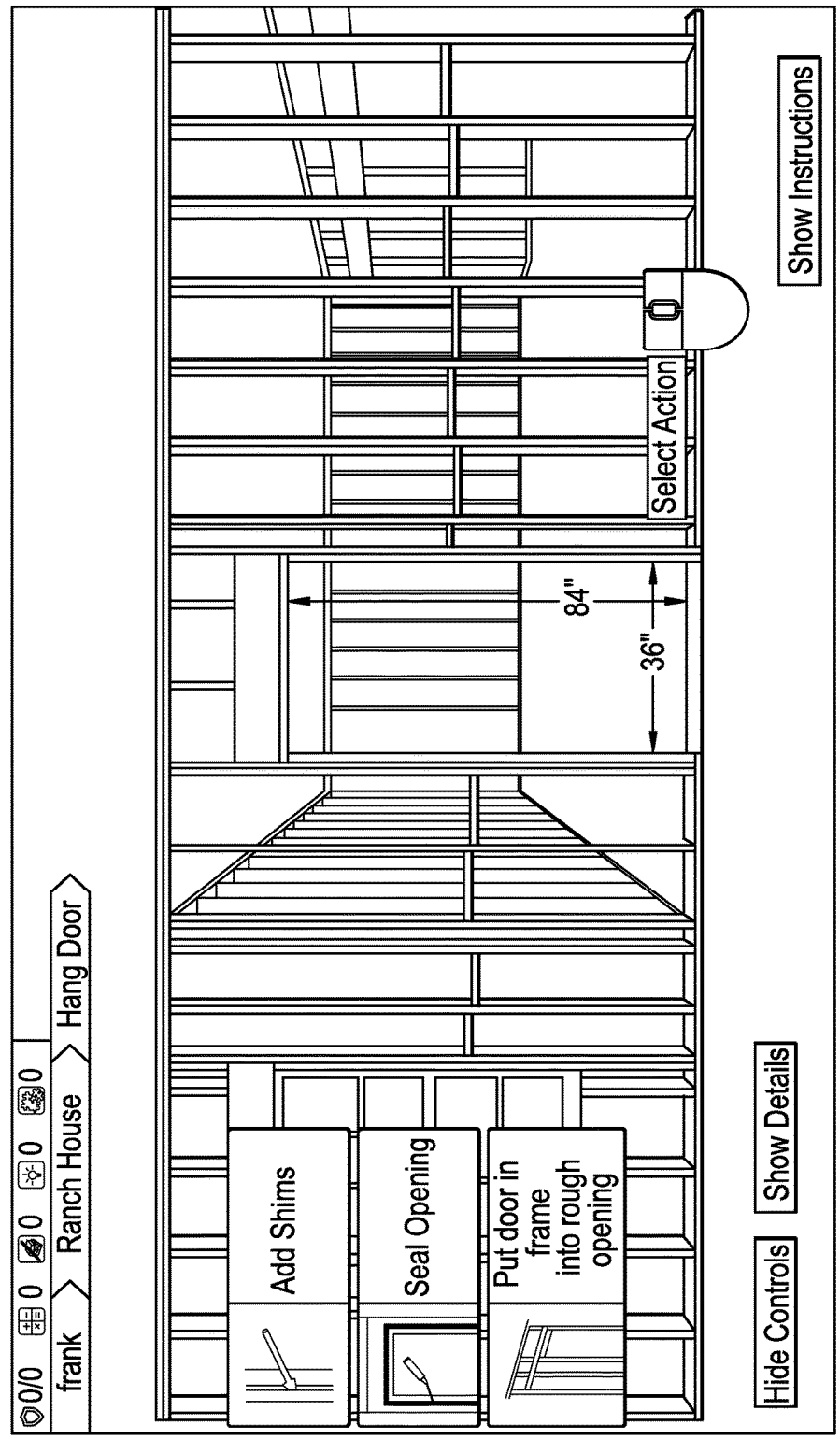
Figure 14D:
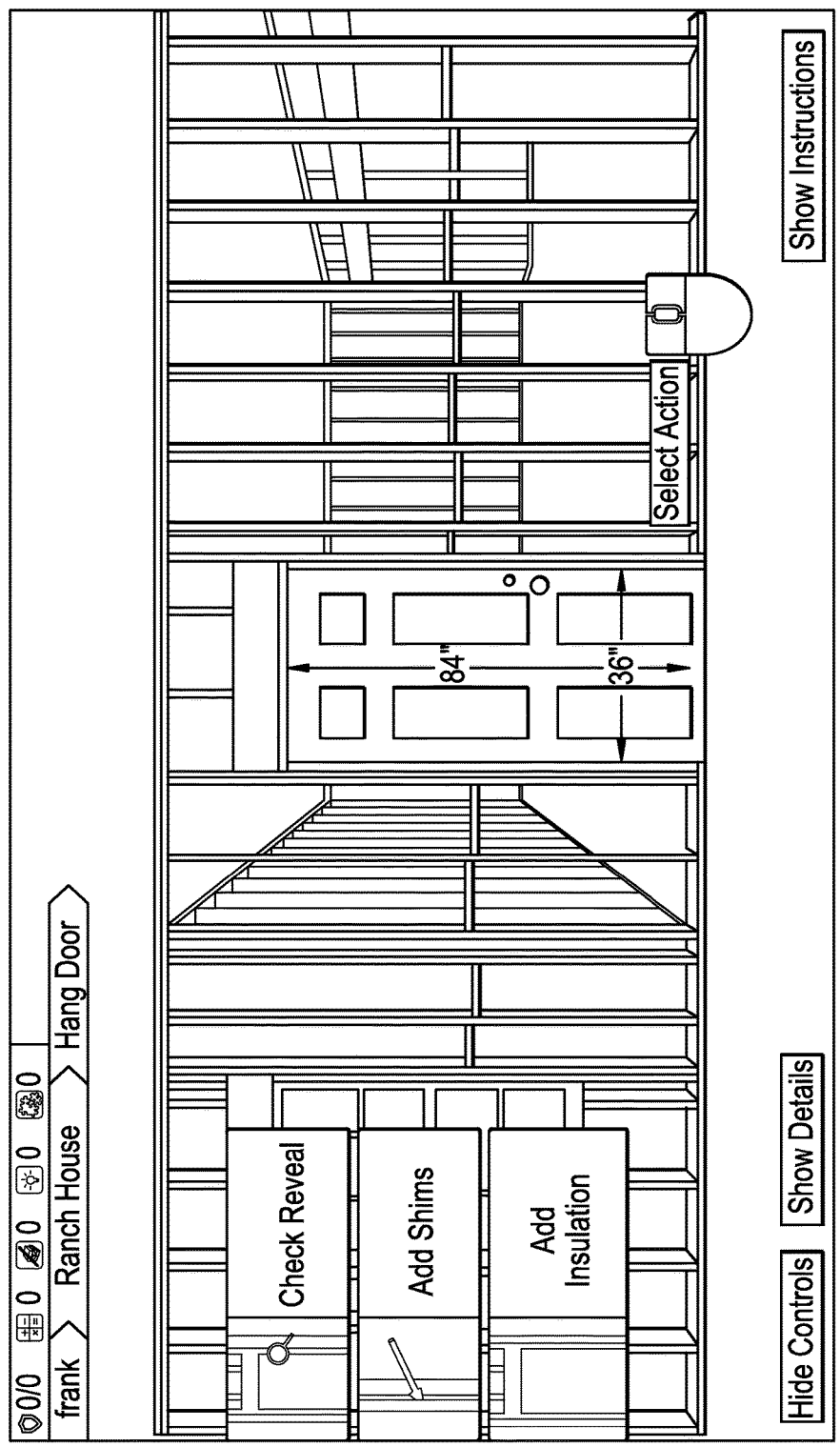
Figure 14E:
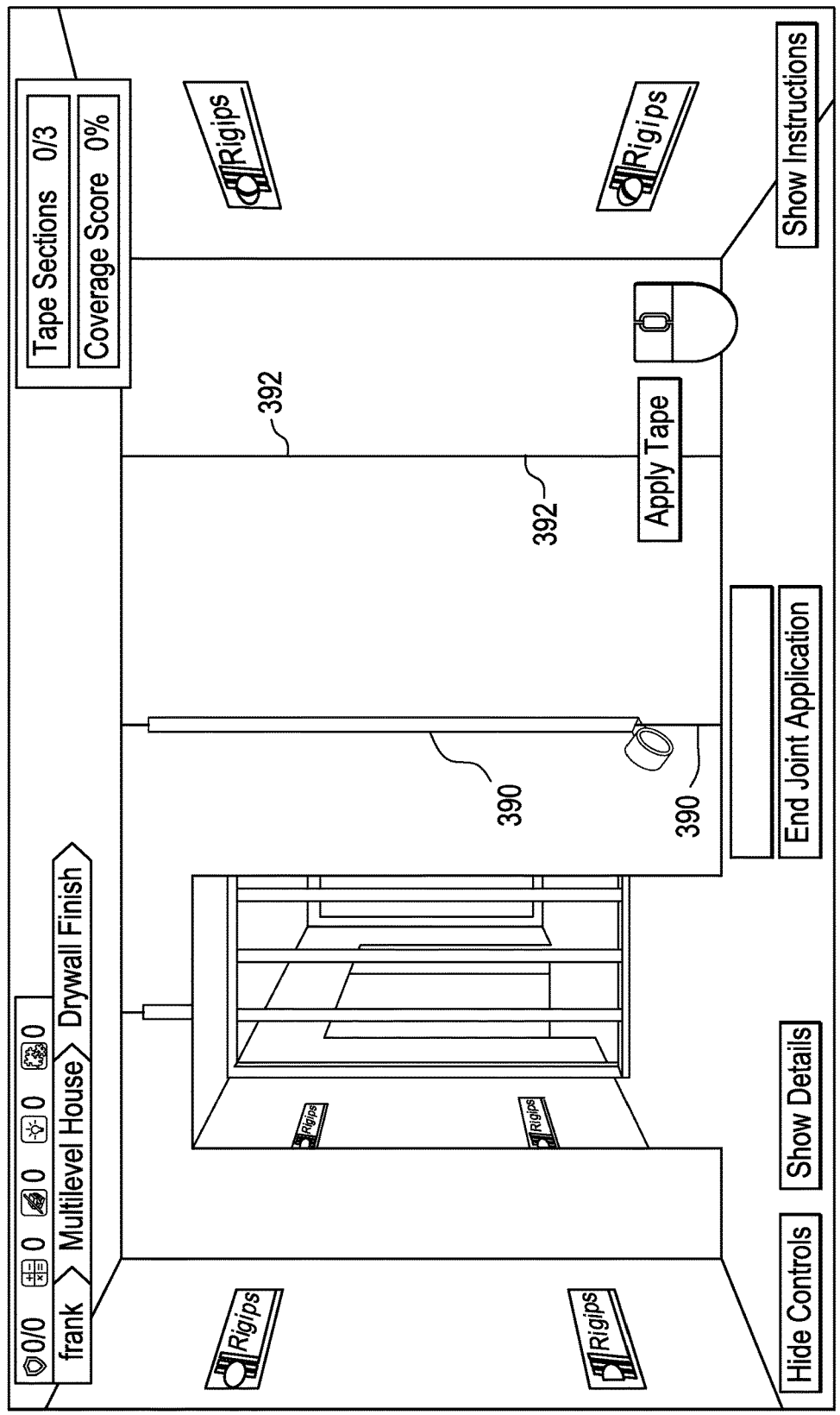
Figure 14F:
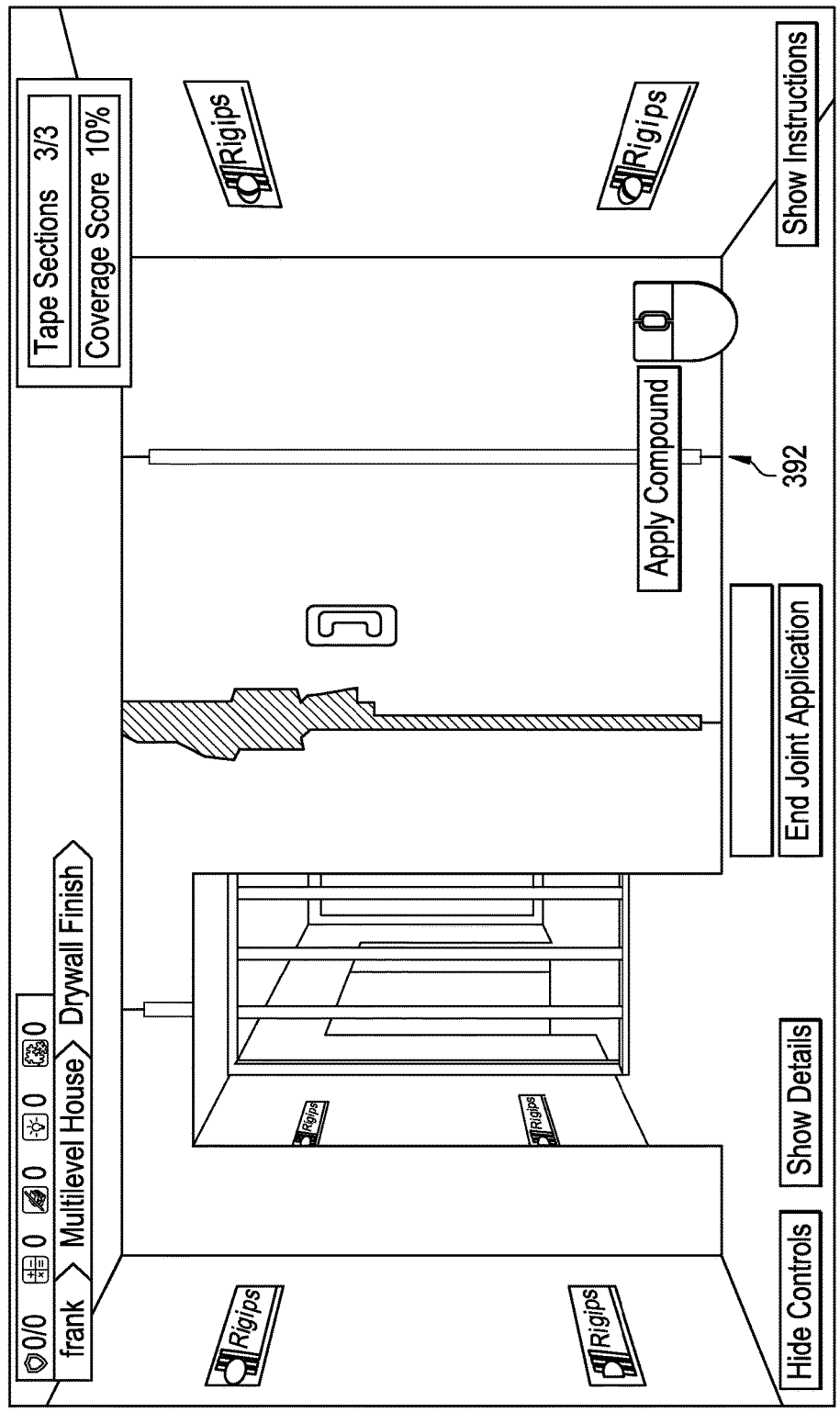
Figure 14G:
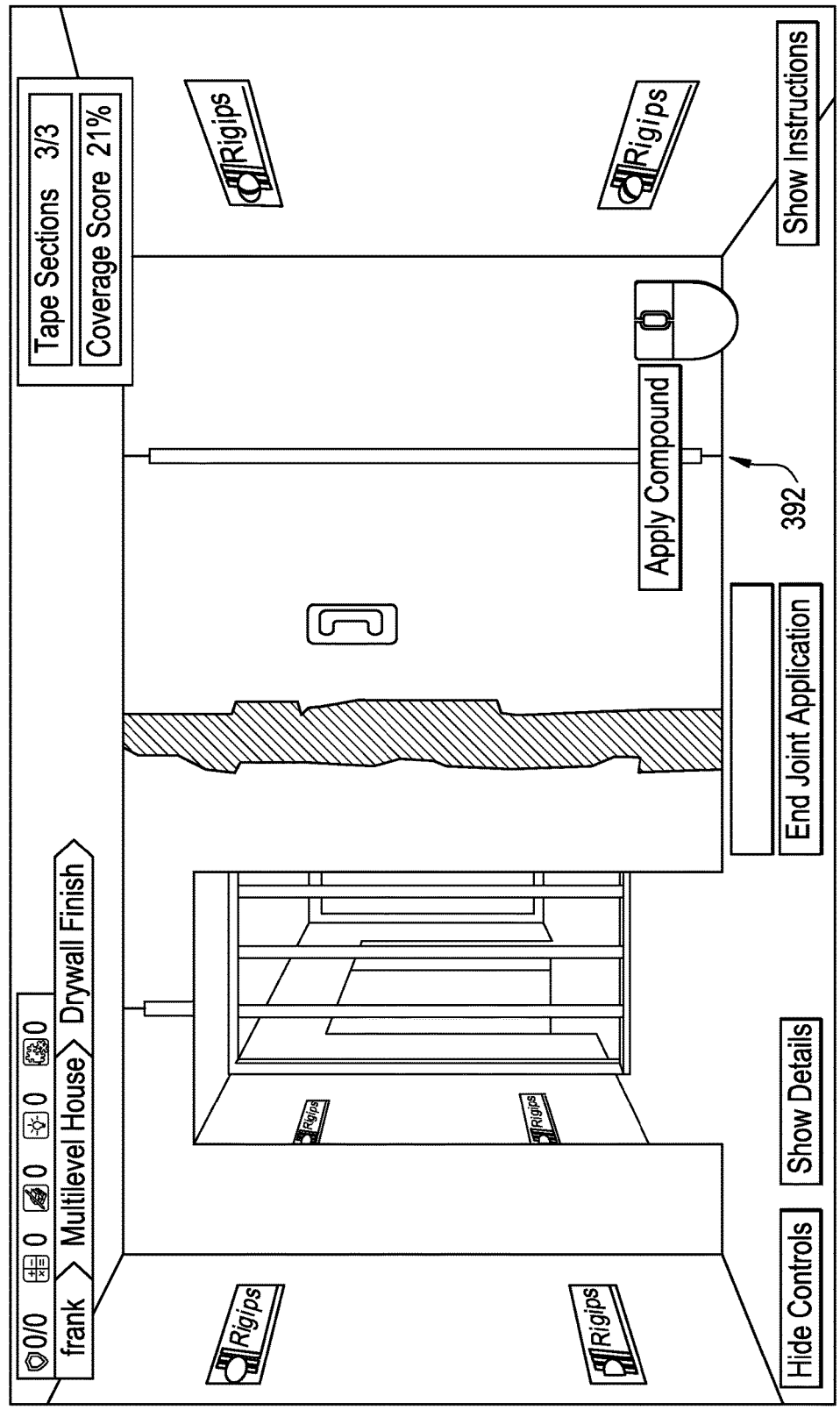
Figure 14H:
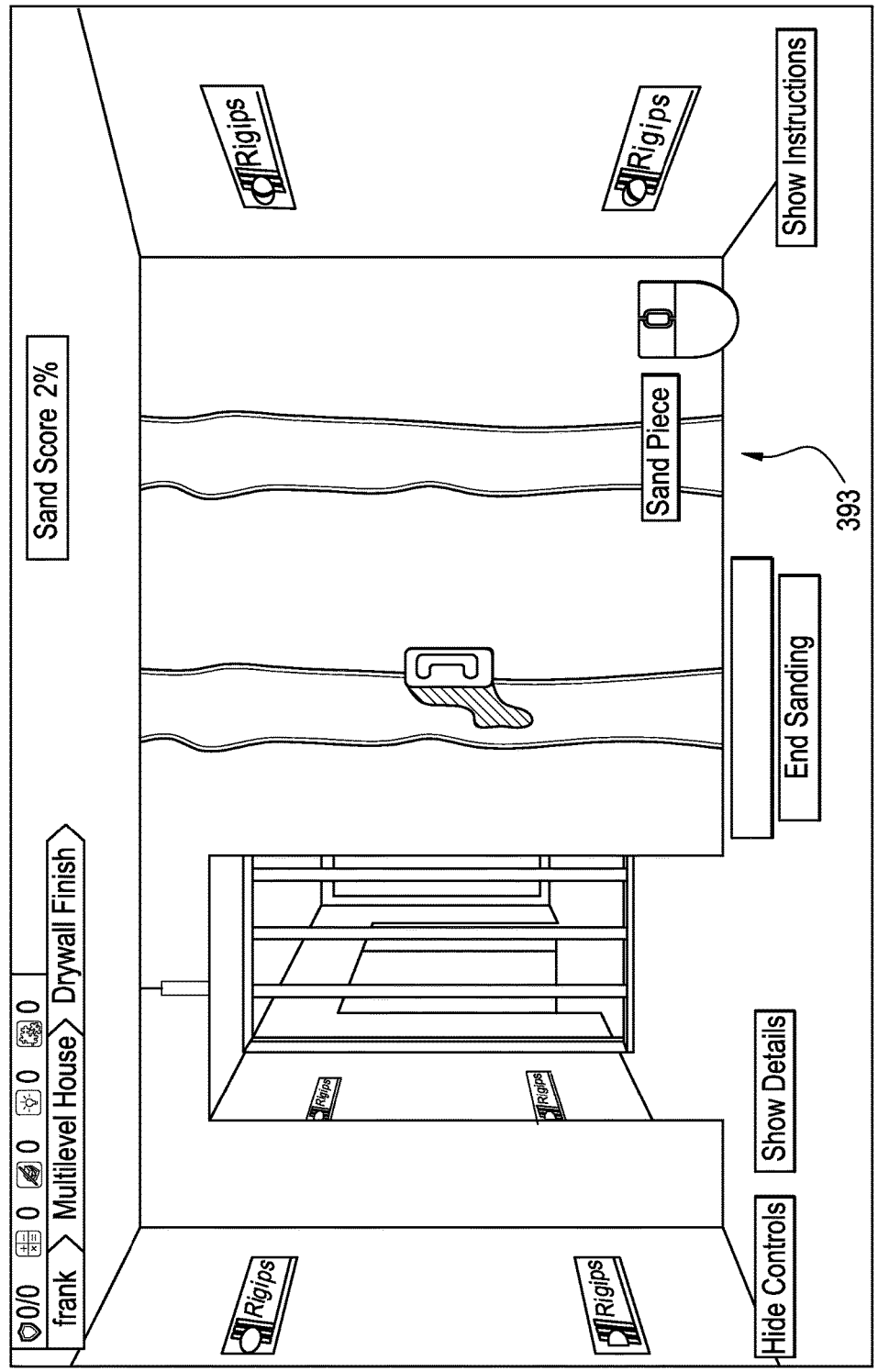

As noted above, activities become increasingly more complex and require increasingly greater skills as the user/student advances through the work orders 132 and work sites 120. For example, FIGS. 14A to 14H illustrate more complex activities being performed in the Ranch House work site 124 including, for example, as shown in FIGS. 14A and 14B, measuring and calculating cuts to form a roof rafter 386 to yield a desired run, pitch, overhang and length of the rafter. Similarly, more advanced activities for installing a door in the Ranch House work site 124 add activities such as shimming and sealing the door frame, shown generally at 387 and 388 in FIGS. 14C and 14D, respectively. In the Multi-level house work site 126 even more complex activities are performed including, for example, as shown in FIGS. 14E, 14F, 14G and 14H, installing drywall 390 and applying tape and joint compound to joints 392 therebetween, and sanding 393 the compound to achieve a surface ready for finishing.

Figure 15A:
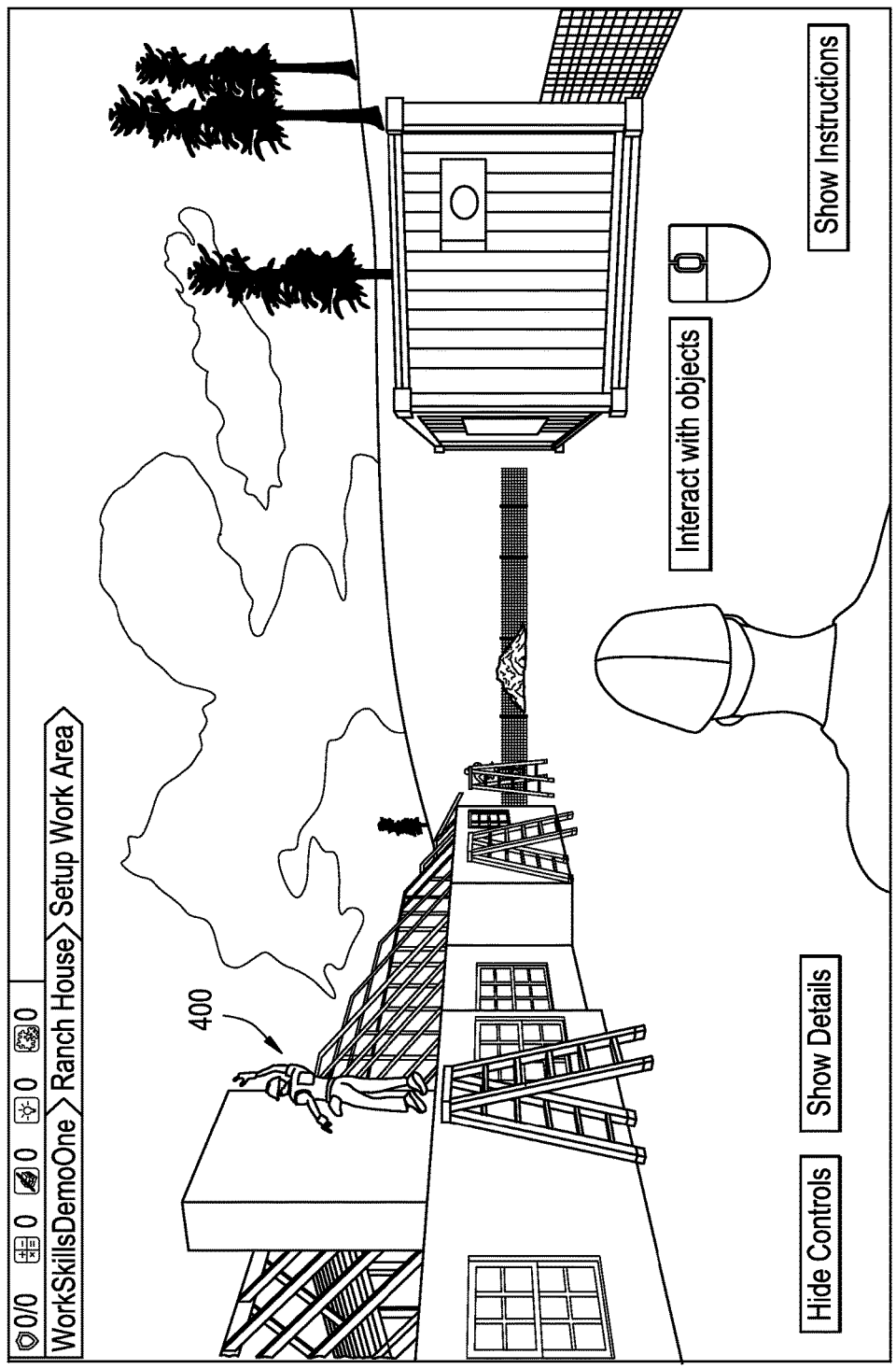
Figure 15B:
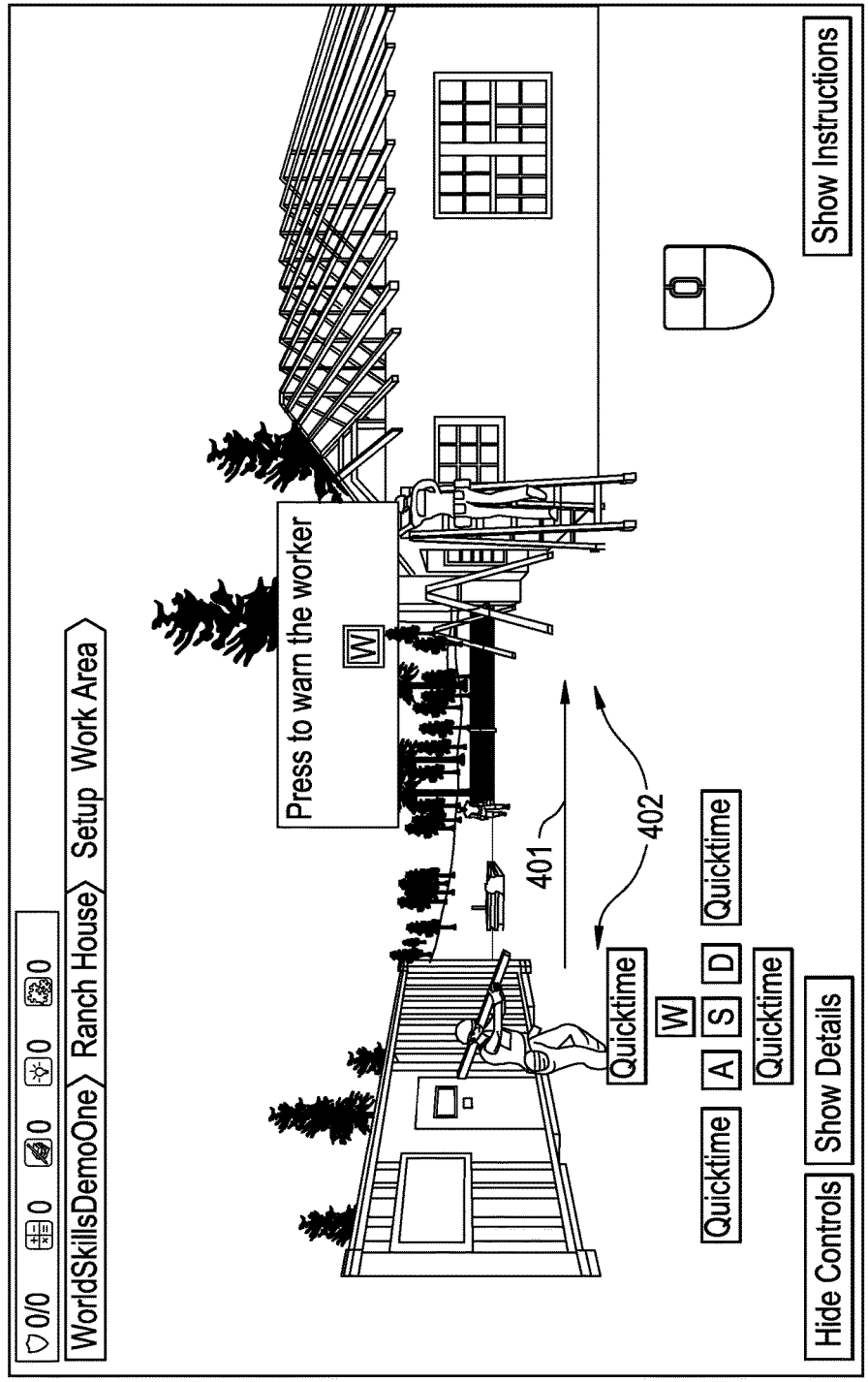
Figure 15C:
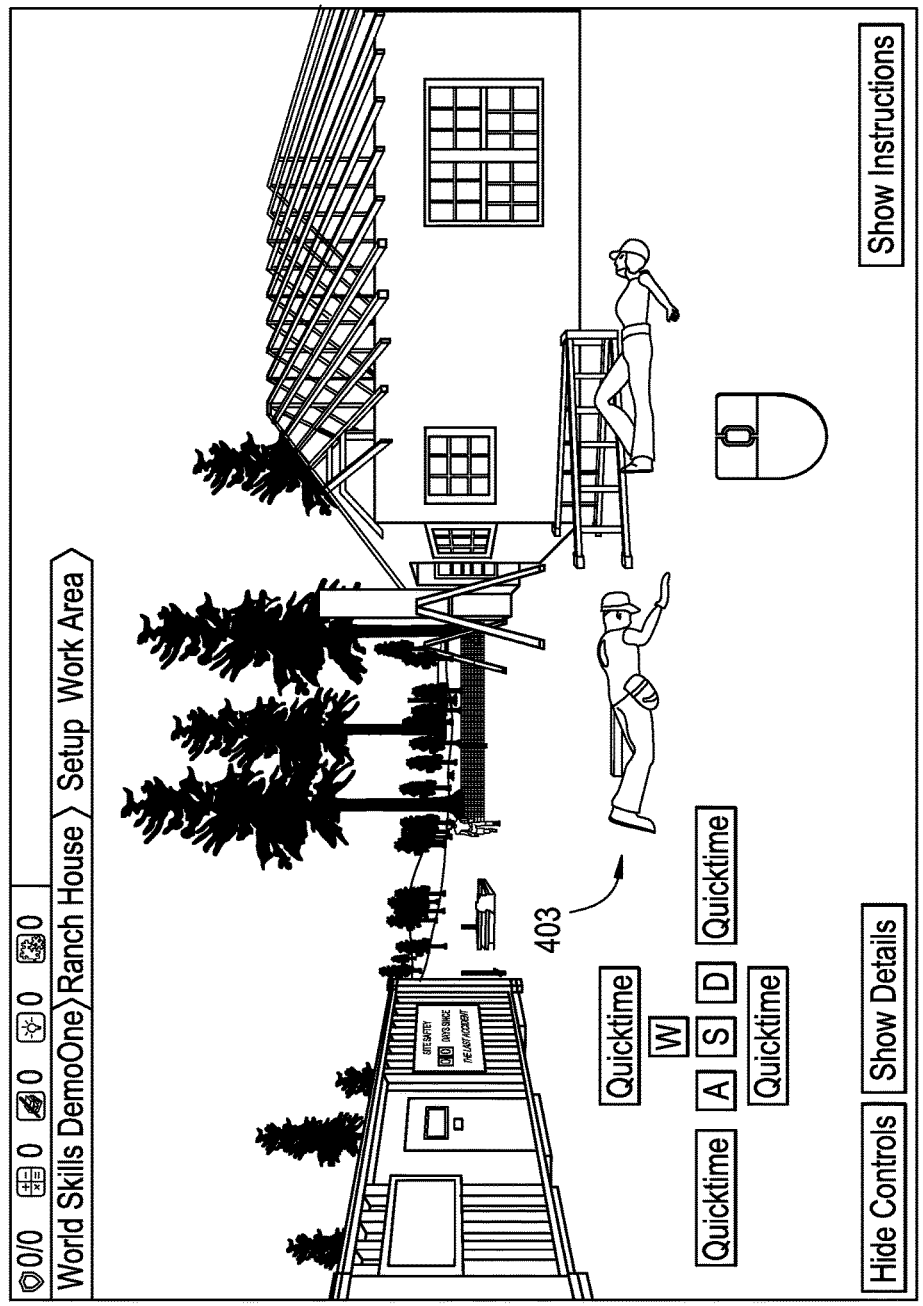
Figure 16A:
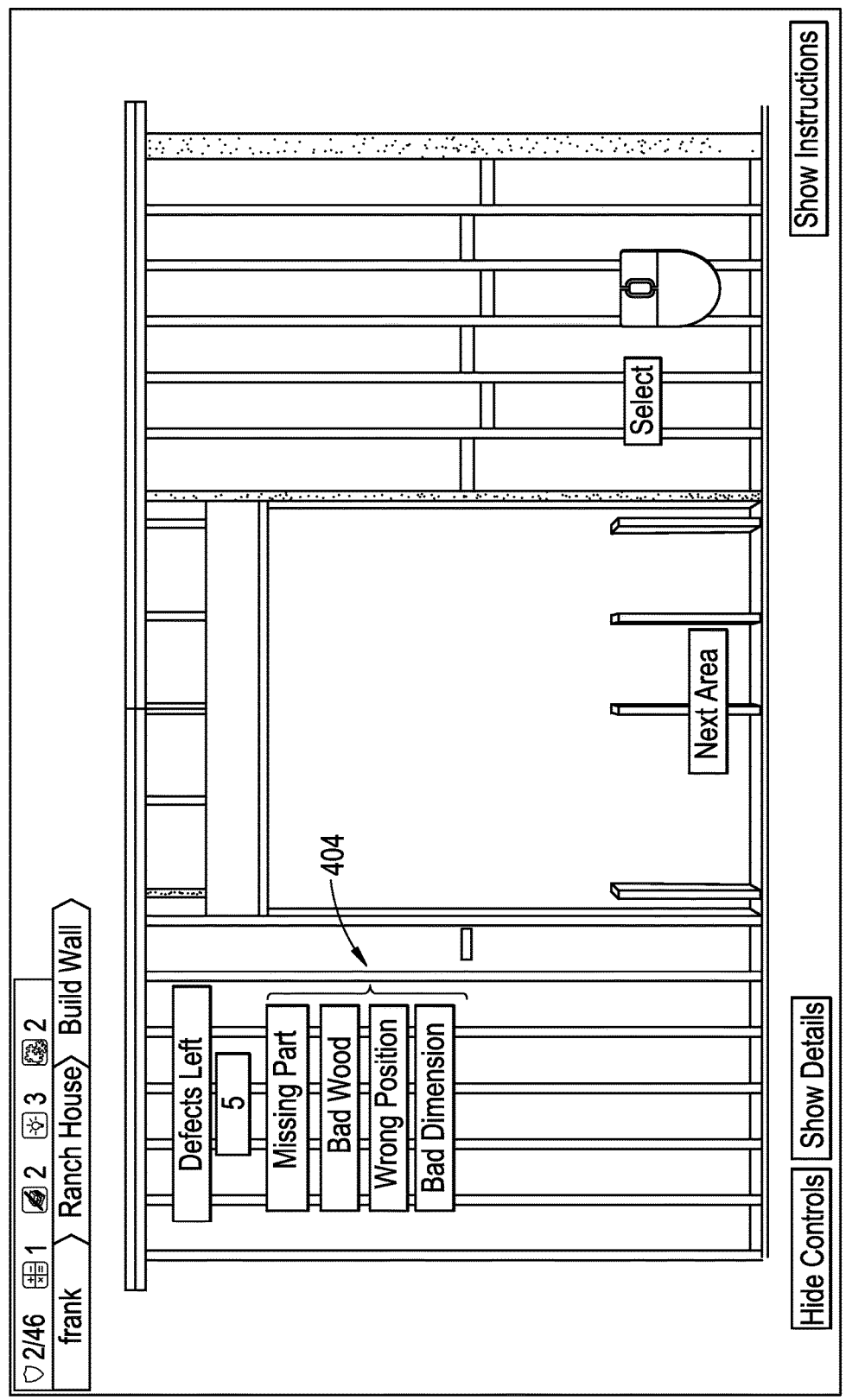
Figure 16B:
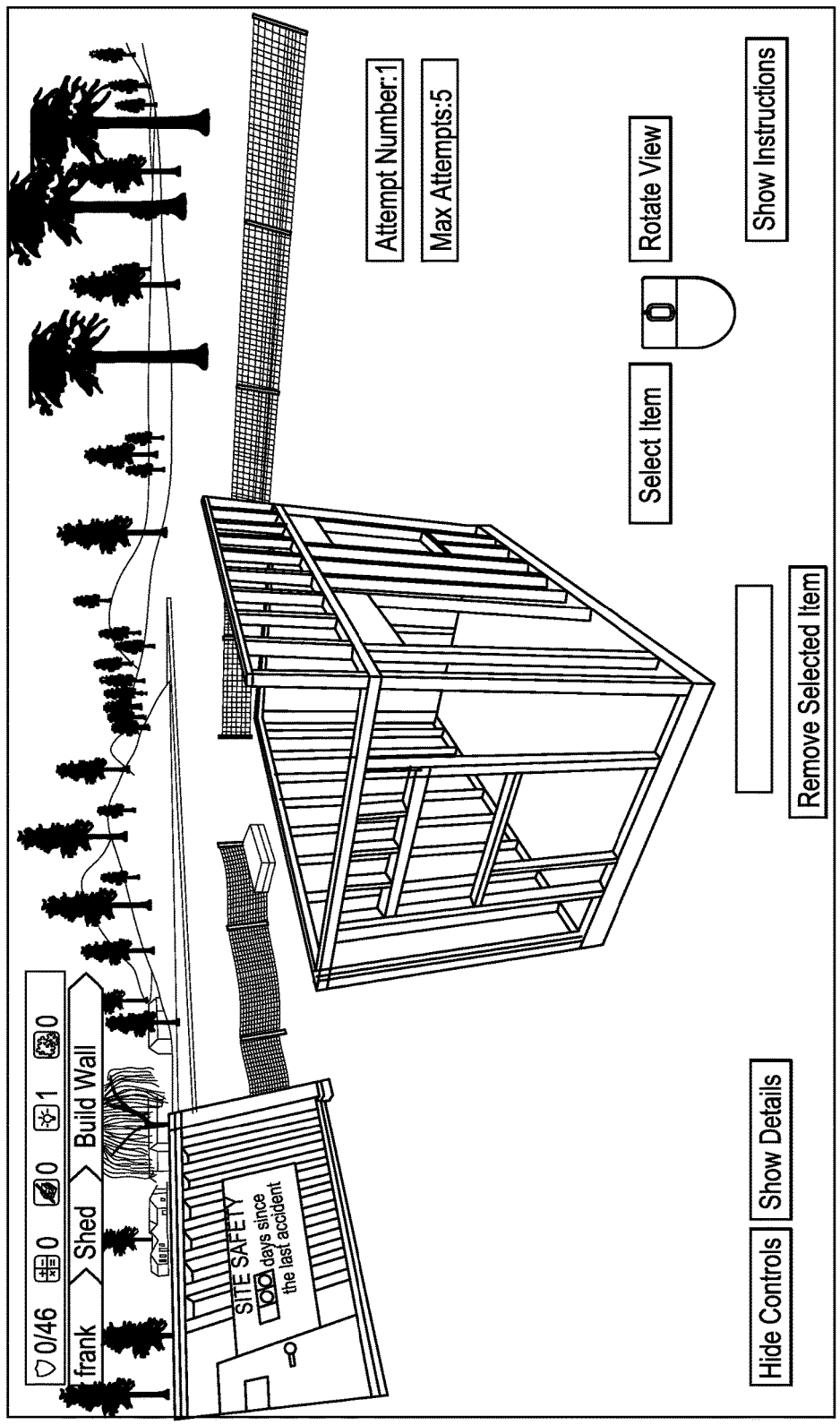
Figure 16C:
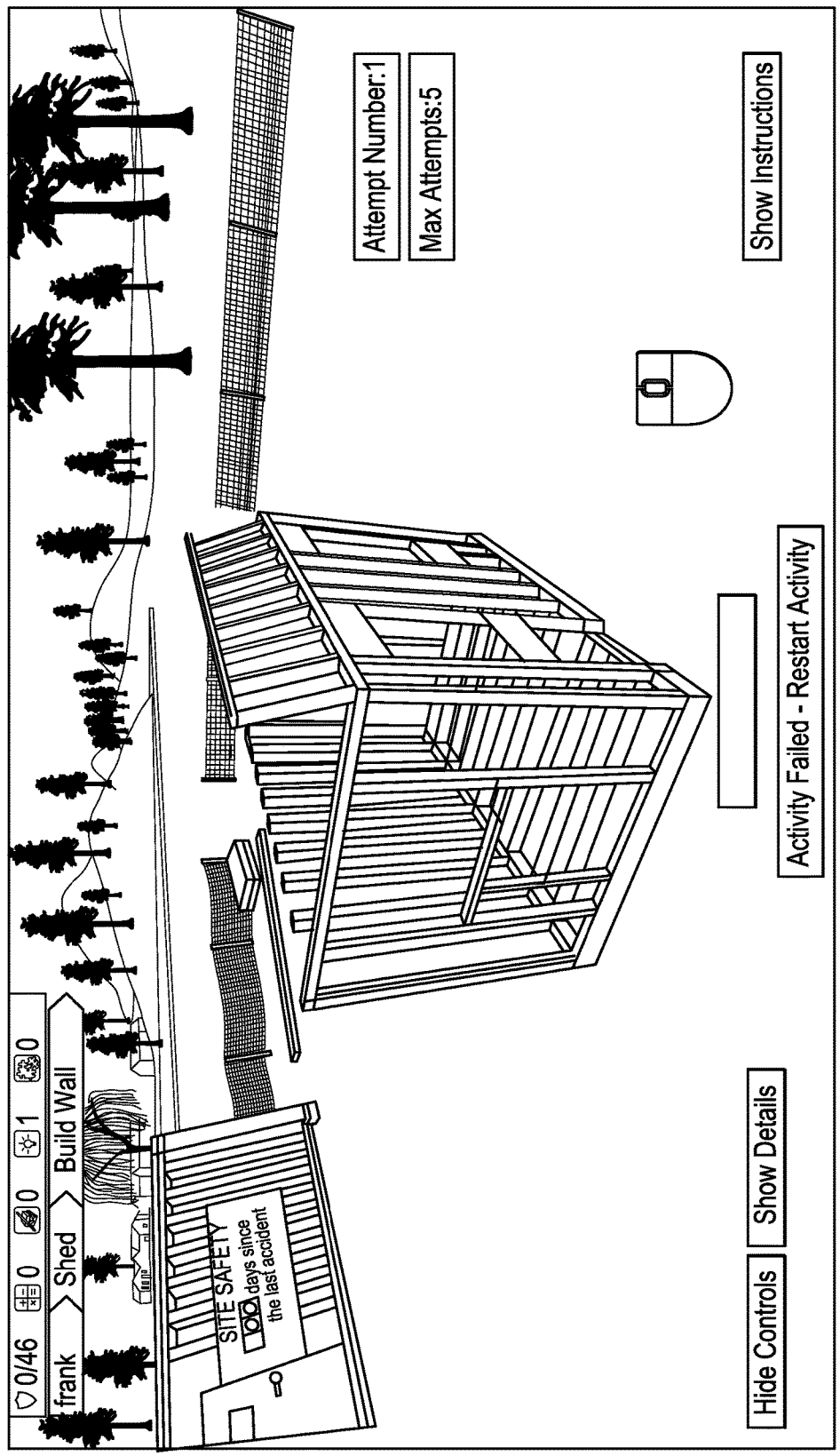
Figure 16D:
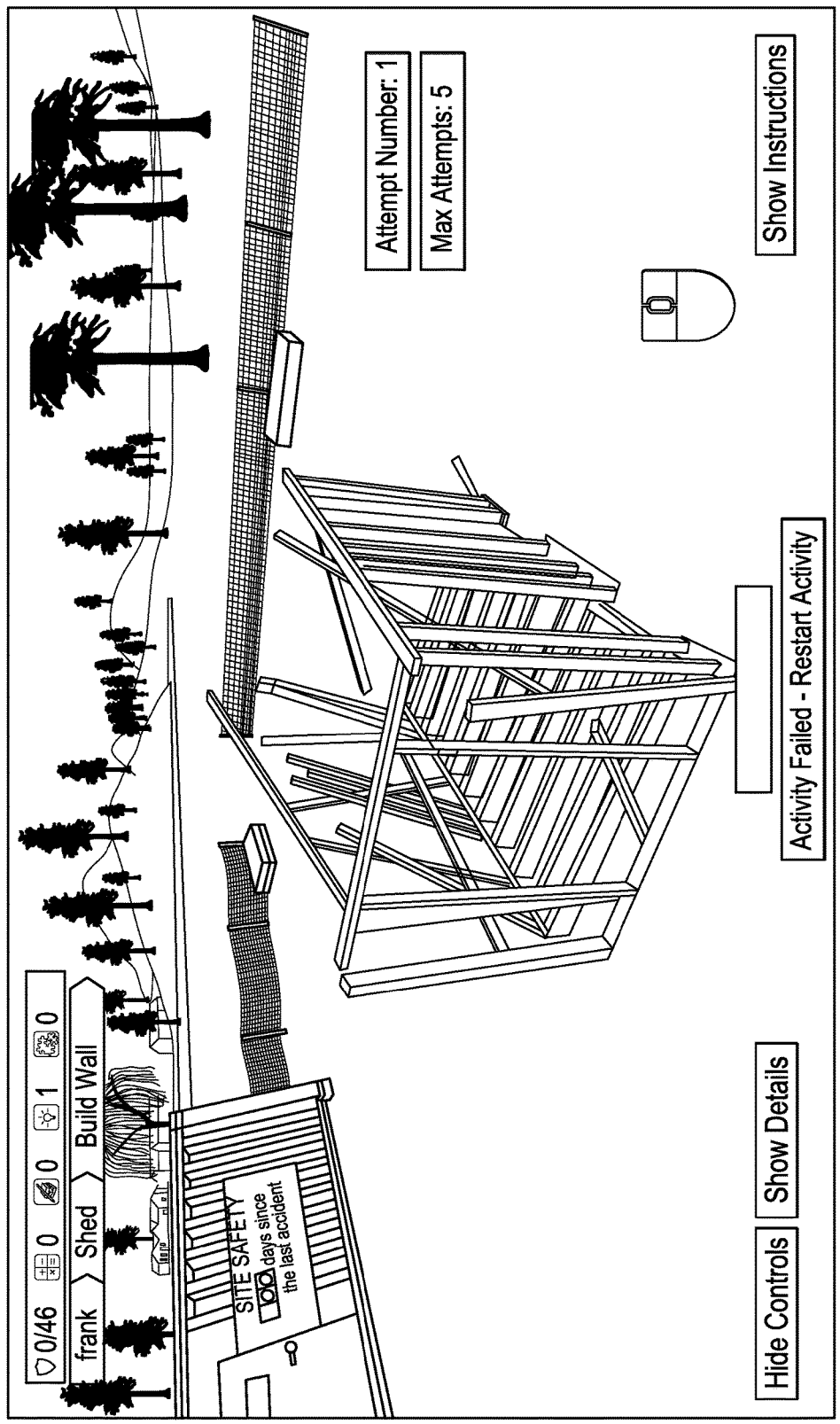

Additionally, the SBC system 100 instructs and/or reinforces safe personal and work site practices. While safety "credits" are earned in the performance of all activities by, for example, the proper operation of tools 115, placement of materials and the like, in one embodiment, shown in FIGS. 15A, 15B and 15C, some safety practices are specifically tested and performance evaluated such as, for example, using correct equipment 400, for example, using a correct height ladder to prevent standing on a top rung and jumping to reach a work area or surface (FIG. 15A), paying attention while transporting materials 402 (FIG. 15B) to ensure that your path of travel 401 does not impinge in the work area of other striking or otherwise disrupting their performance of a task, and the like, as shown at 403 (FIG. 15C). Similarly, as shown in FIGS. 16A, 16B, 16C and 16D, an Inspection Action 212G (FIG. 4D) is invoked to initiate the GUIs that monitor and evaluate the user as he/she determines proper attributes and/or defects therein, of construction, for example, bad material (bad wood), incorrect dimensions, missing or misplaced components, and the like, shown at 404 of FIG. 16A. As shown in FIGS. 16B, 16C and 16D, the inspection may include specific attributes of the construction such as, for example, proper placement and/or load bearing capabilities as a result thereof. In one embodiment, the user is challenged to remove one or more components of the structure, such as non-essential components, without causing failure of the structure. The challenge is seen as a fun way to reinforce knowledge of load bearing capabilities as well as proper placement of components.

As should be appreciated, users/students learn how to perform various skill-oriented tasks and activities while operating the SBC system 100. For example, the user/student learns to mark a "toe plate" so they know where to place cut lumber when assembling a wall. Specific portions of the SBC system 100 may stop on the first piece of each type of cut to identify which symbol is needed, for example, symbols indicating placement of single or double framing lumber components within a run of a wall and/or at corners and rough openings for doors, windows and the like, on rafters, or the like. Moving along the toe plate, the student selects the correct symbol without help from the system. This reinforces terminology of the trade and the proper marking operation prepares the student for other activities. Throughout the activities, performance is scored on, for example, a four-star point system. It should be appreciated that while a four-star scoring system is described, the present invention includes other scoring systems and methods, for example, a numeric point system from one to ten, one to one hundred or the like, a system that establishes threshold for pass-fail or qualify-not qualify conditions, or additional threshold that establish a high pass-pass-fail system or beginner, intermediate or advanced tradesman system, or the like. Students can repeat activities as much as they need or desire to. If they do "poorly," then they can go back until they get a more favorable score, for example, 3 or 4 stars out of the 4 star point scoring system. Repetition reinforces learning basic skills. In the aforementioned to plate example, once the toe plate is marked, the lumber needs to be placed. First, the student chooses where to place the wall. The symbol knowledge from the marking activity and interpretation of the blueprint on the work order serves as a guide. He/she optimizes his/her score by using fewer moves to properly place the cuts and by doing so in less time. Once everything is in place, the lumber needs to be nailed together. A nail gun tool is selected and pushed in to the center of the guide for correct placement. As each the structure collapses or otherwise is misaligned, the student loses points. Besides efficiency, this activity reinforces safety as students need to be sure they are properly nailing the lumber and taking caution in hand placement. They must always be aware of obstacles that might appear on a work site. The work order is finished by erecting the wall. The consequential activity shown in the simulation keeps the student engaged.

As noted above, the user/students may walk around the work site to complete odd jobs at any time. For example, the student may walk around the worksite and spot worksite hazards such as, for example, improperly stored tools and any workers without the proper personal protection equipment. Safety is threaded (e.g., measured) through every activity they are doing as a way of building awareness. Students need to learn to control the work site. If accidents occur, score and work site morale typically goes down so students are incentivized to ensure safety in their activities as well as others working on the site.

Figure 17A:
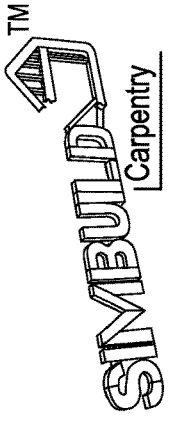
Figure 17C:
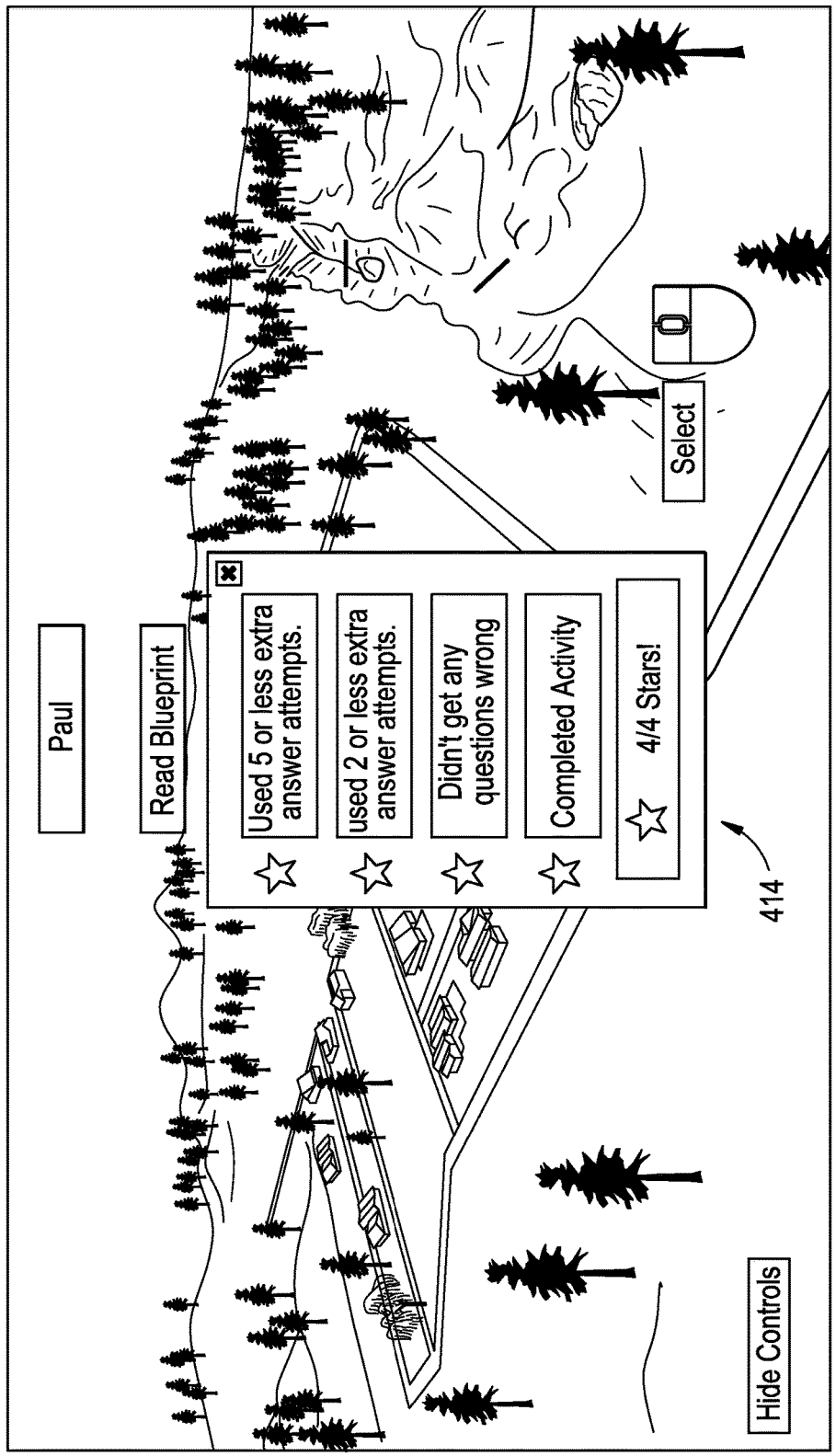
Figure 18A:
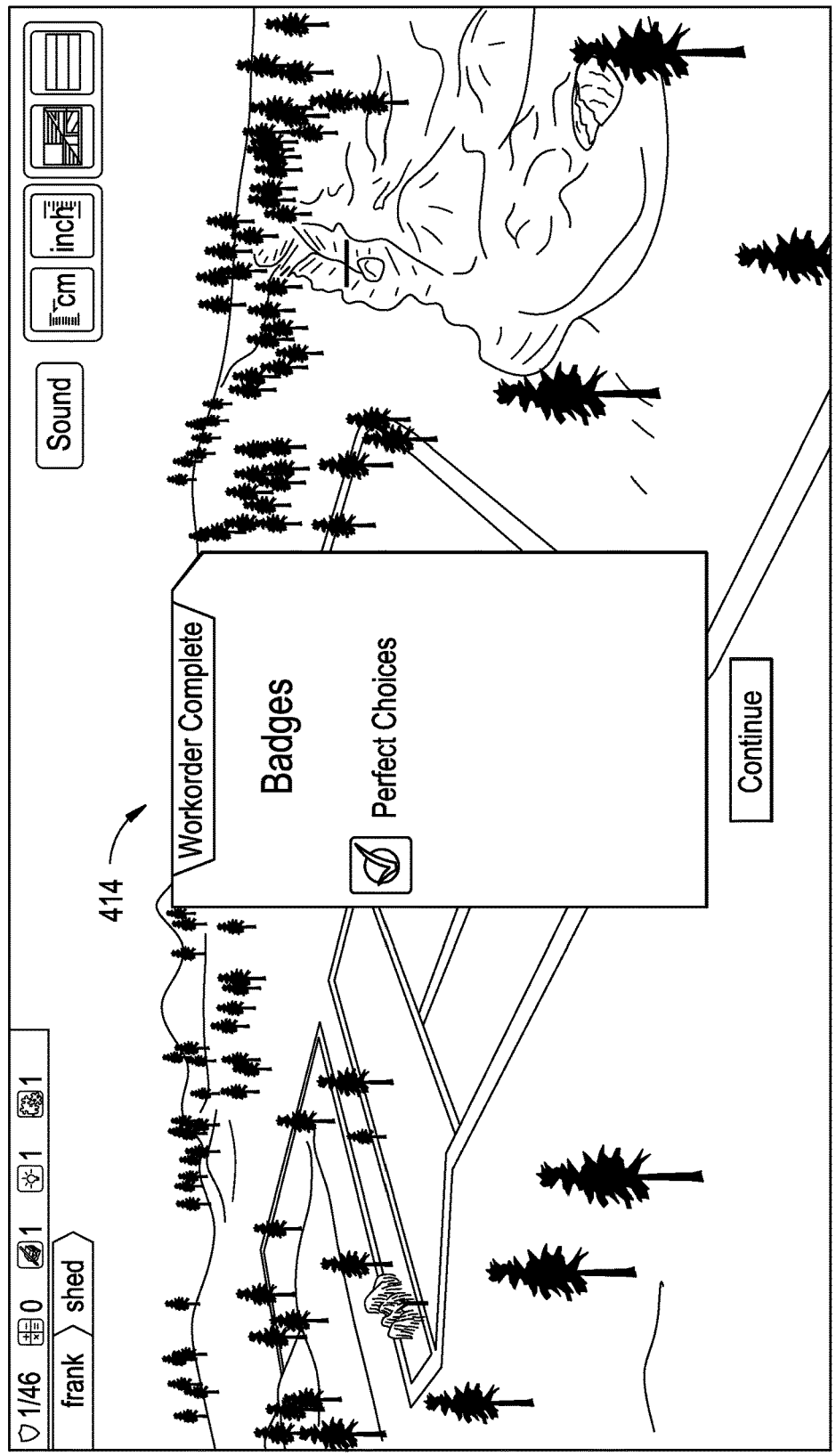
Figure 18C:
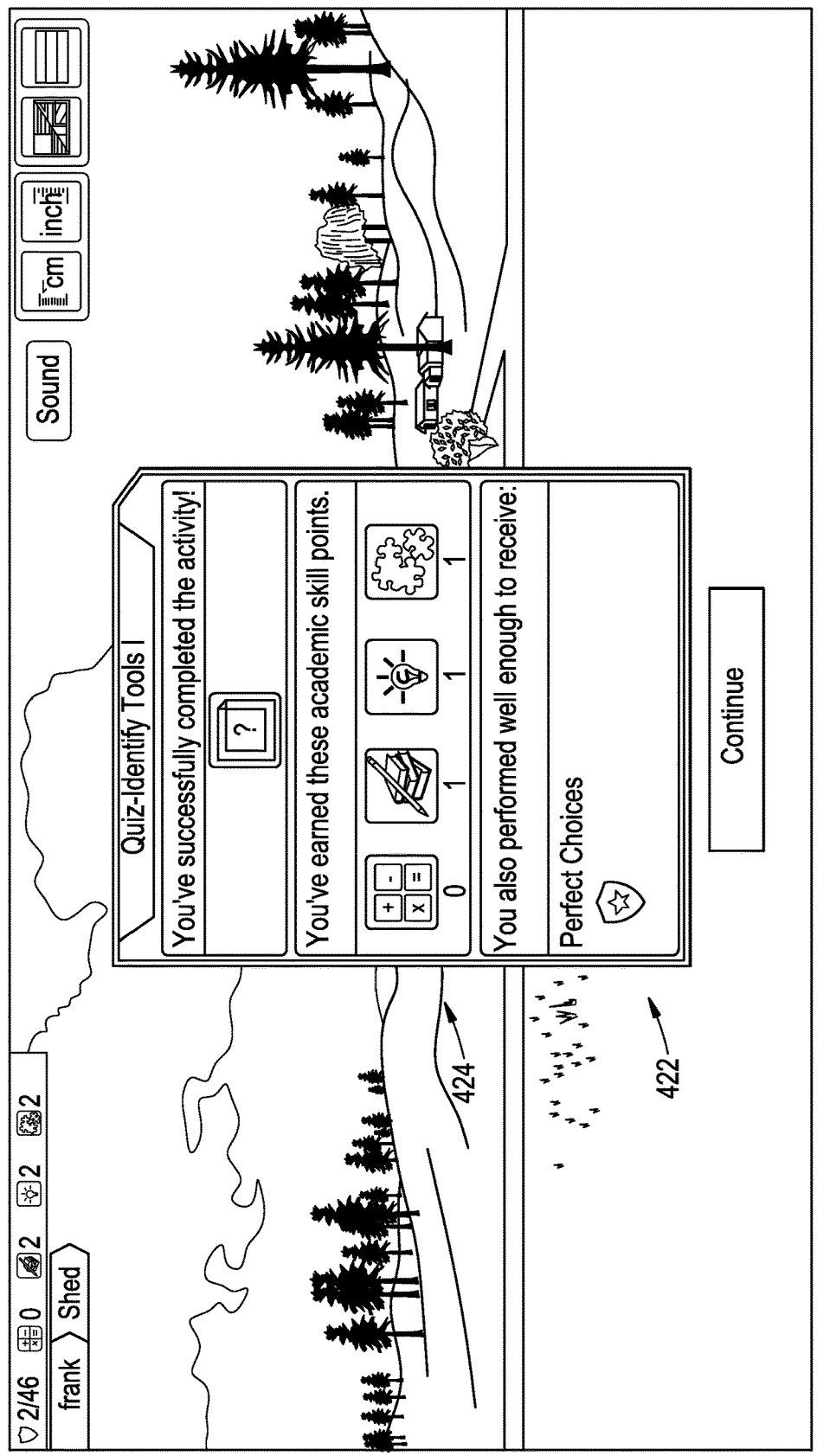

When the user completes a work order 132, the user and his/her instructor can evaluate his/her performance. In one embodiment, in addition to an overall score of one to four stars or the like, the user receives individual scores for each activity. The scoring system is designed to incentivize the user to replay each activity as many times as he/she wants to get a better score. The users are also evaluated on their ability to complete a work order on a predetermined budget or a budget established by the student in, for example, an estimating task, and with an eye towards work site morale. In one embodiment, a work order recap GUI 410 is shown in FIG. 17A, a user/student report GUI 412 is shown in FIG. 17B, and a GUI 414 that provides a representation of the 4-star scoring method is shown in FIG. 17C. As shown in the GUIs 410, 412 and 414, the student's performance is evaluated and presented in a number of ways of, for example, total performance (e.g., budget and morale) at 410A, task performance 410B, with progress illustrated numerically and graphically, for example, by progress bar charts or graphs 413. The recap, student report and 4-star scoring GUIs are used within the learning management system (LMS) 70 and provided as output for a student, teacher, or the like, to track the student's progress. In one embodiment, the student's customized avatar 116 is included to customize or individualize the presentation with all completed work orders. The GUIs 410, 412 and 414 may also show any awards, commendations or badges that he/she has been earned while performing the activities of the SBC system 100. In one embodiment, a student may "earn" an award, commendation and/or badge when the student's score in performing an activity meets or exceeds one or more predetermined thresholds. As such, the awards, commendations and badges are in recognition for superlative performance, e.g., performance at or above the one or more predetermined threshold. As shown in FIG. 17B, the performance graph 413 provides a real time view of the student's progress towards, for example, national and state competency requirements as well as other regulatory and/or certifying agencies or the like.

Figure 1B:
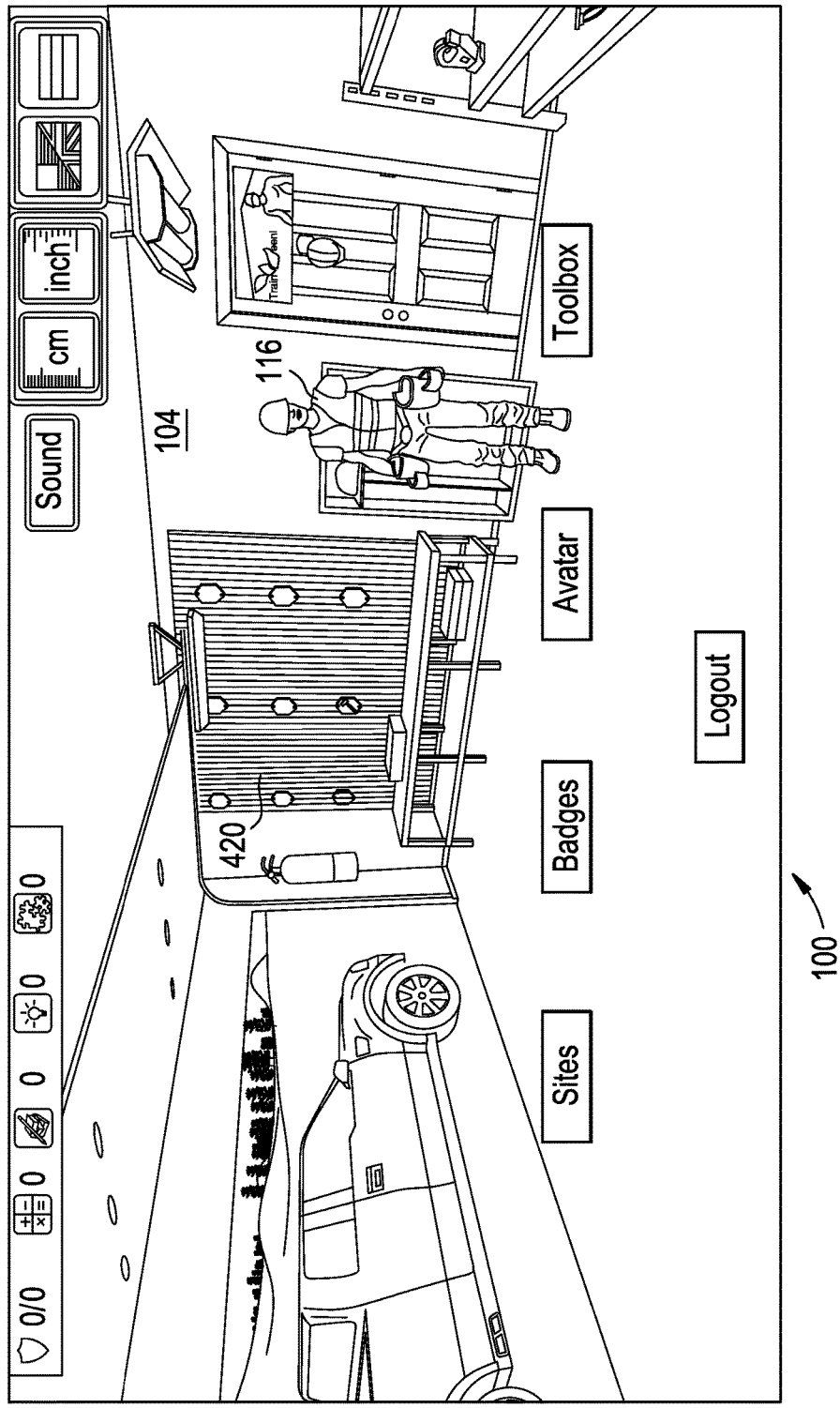

In one embodiment of the present invention, students can upload and publish their scores and student reports via the network 40 to, for example, social networking websites such as, for example, Facebook®, Twitter®, or the like. The publication is seen to enhance student interest, engagement and, further, foster a level of competition that may drive students to build advanced skills in order to obtain a "leader" position among his/her classmates and/or peers. As shown in FIGS. 1B, 17D and 17E, a badge area 420 exhibits the awards, commendations and badges 422 earned by the user. In one embodiment, the awards, commendations and badges 422 available to be earned are also displayed, for example, in shadows, dashed lines or the like, to encourage the user to work for advanced achievement within the SBC system 100. As should be appreciated, the awards, commendations and badges 422 indicate achievement in the general academic skills such as, for example, reading comprehension and mathematics, knowledge interpretation and retention, and complex thinking and problem solving, shown generally at 424 of FIG. 17F, as well as successful completion of skill-oriented task including, for example, construction-specific skills like blueprint reading, use of a tape measure, and safe use of power and/or pneumatic tools such as, for example, saws, drills, nail gun, and the like, that were acquired and/or reinforced by users/students of the SBC system 100. In one embodiment, the awards, commendations and badges 422 may be earned for successfully completing groups of activities and/or using, for example, specialized or predetermined tools 115 and/or materials, and/or to encourage superior performance as compared to other students, for example, competing for a fastest time, highest score or the like. Exemplary exhibitions of awards, commendations or badges 422 within the SBC system 100 are illustrated in FIGS. 17D to 17F and 18A to 18D.

Figure 19B:
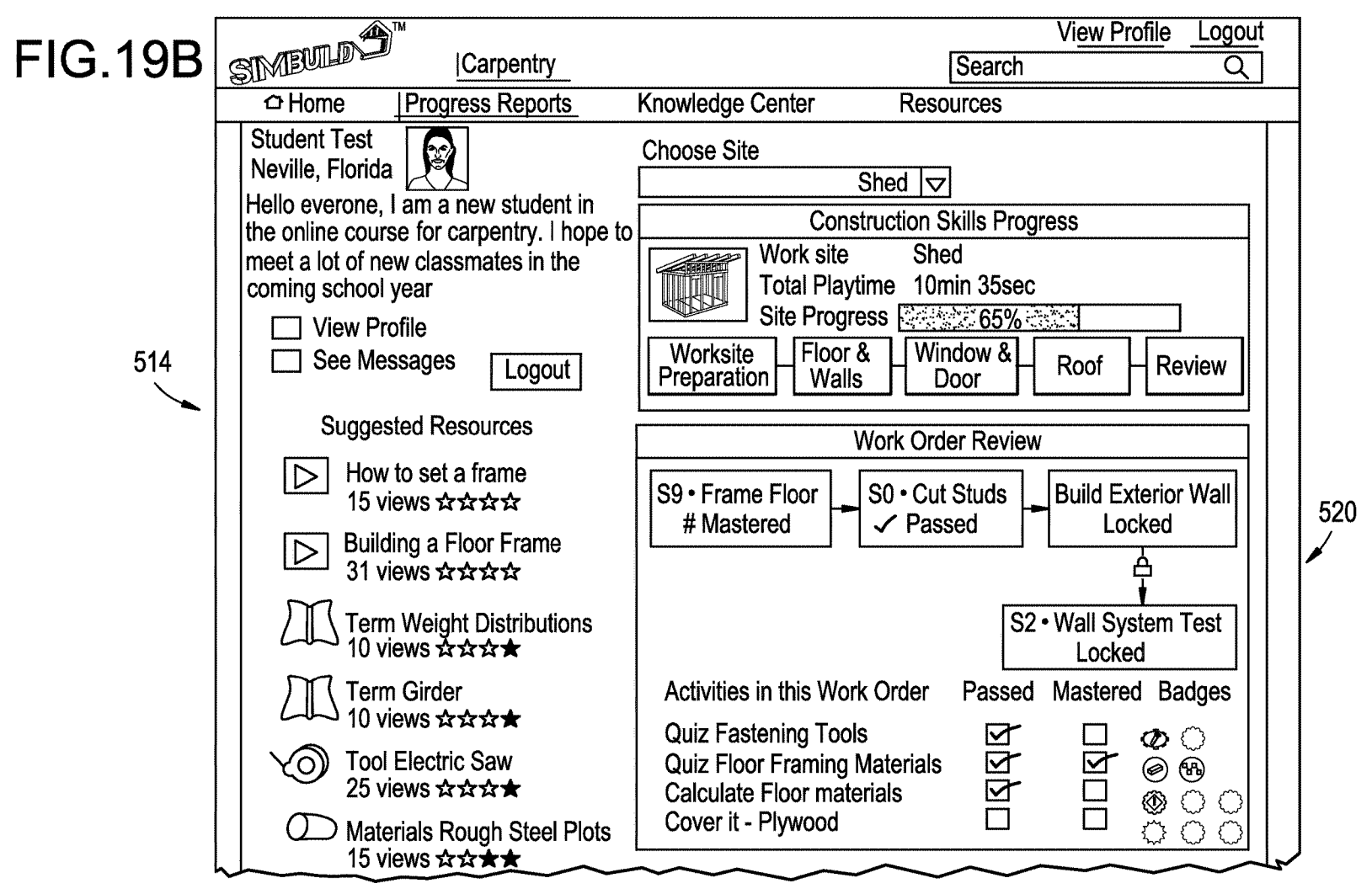
Figure 19C:
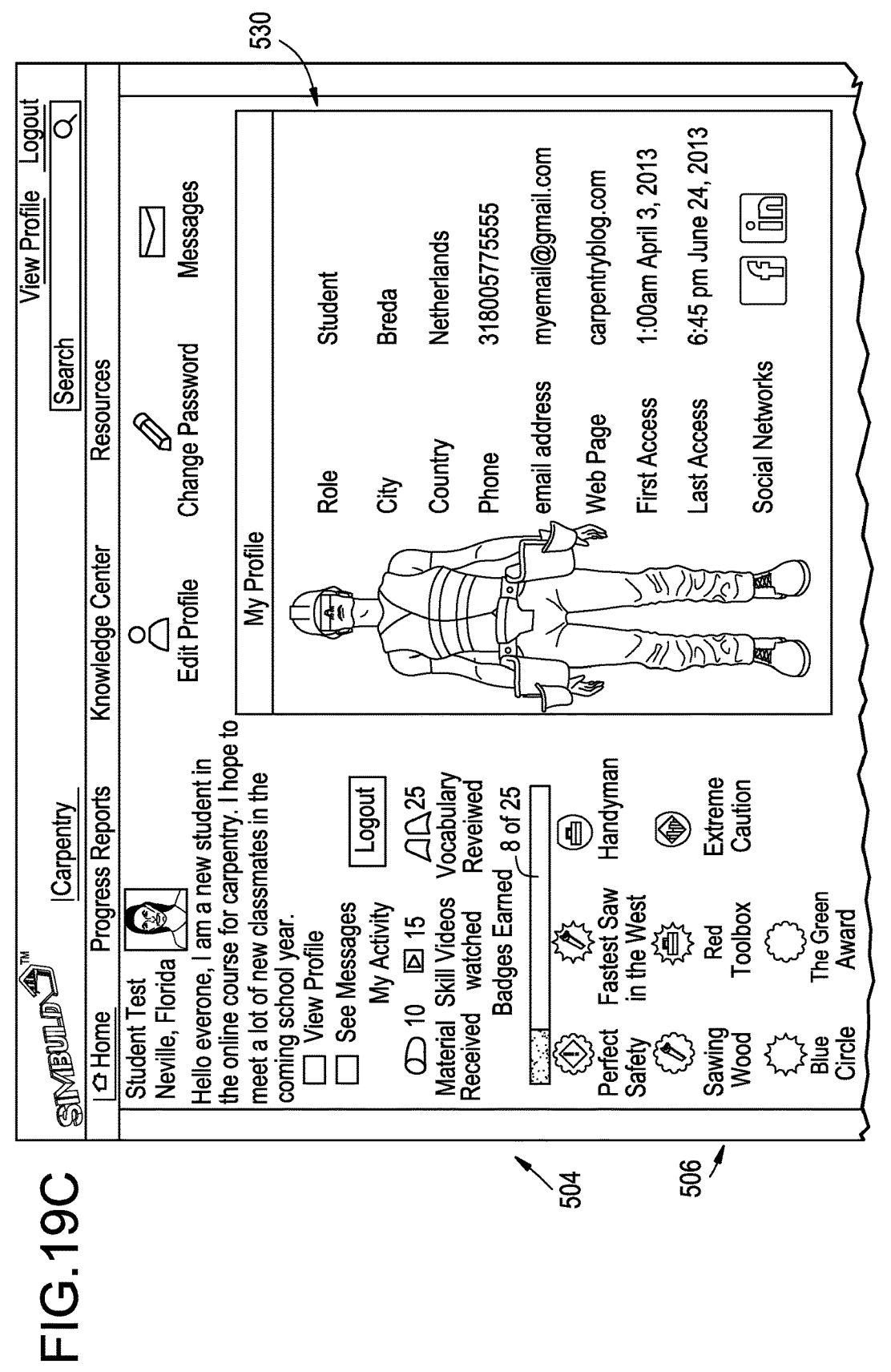
Figure 19E:
Figure 19G:
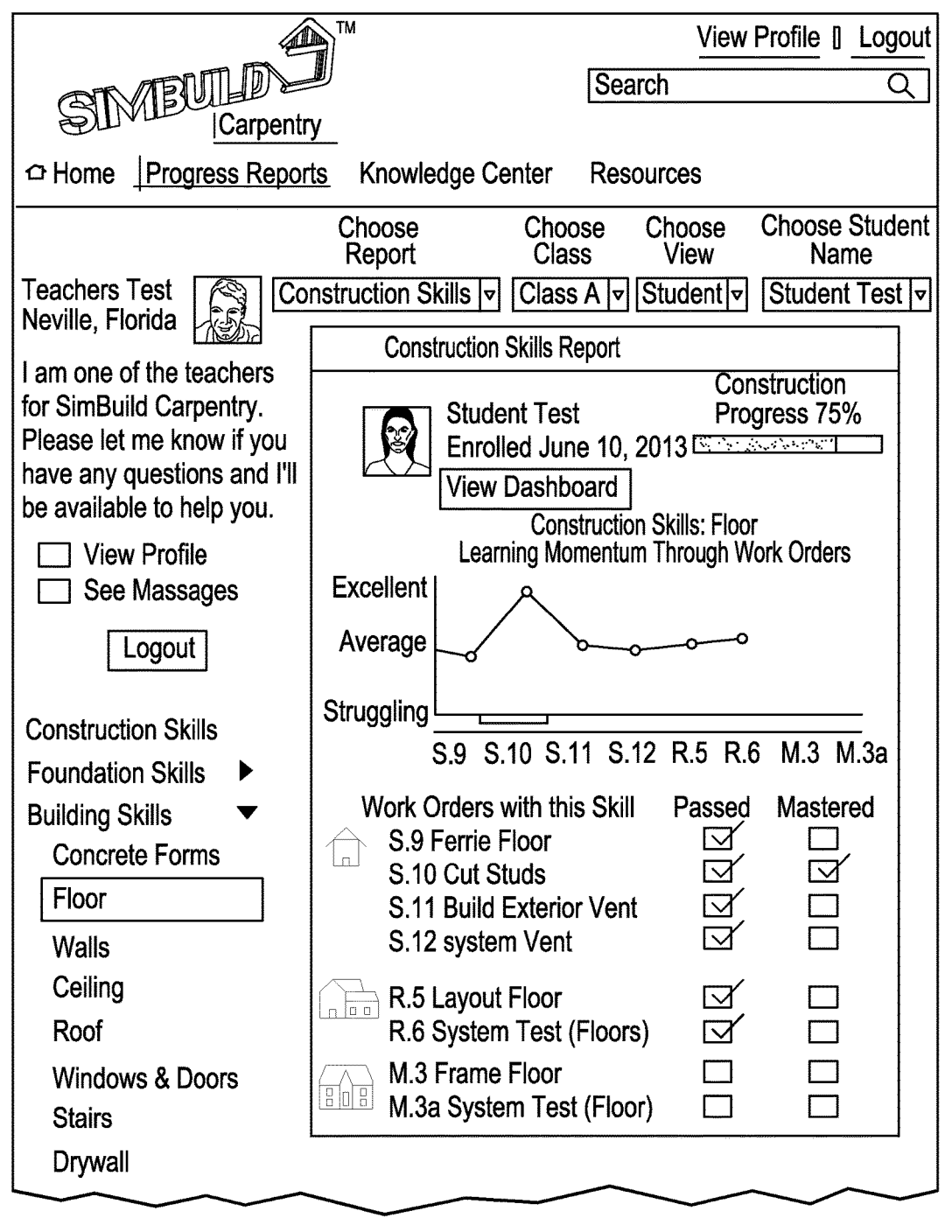
Figure 19H:
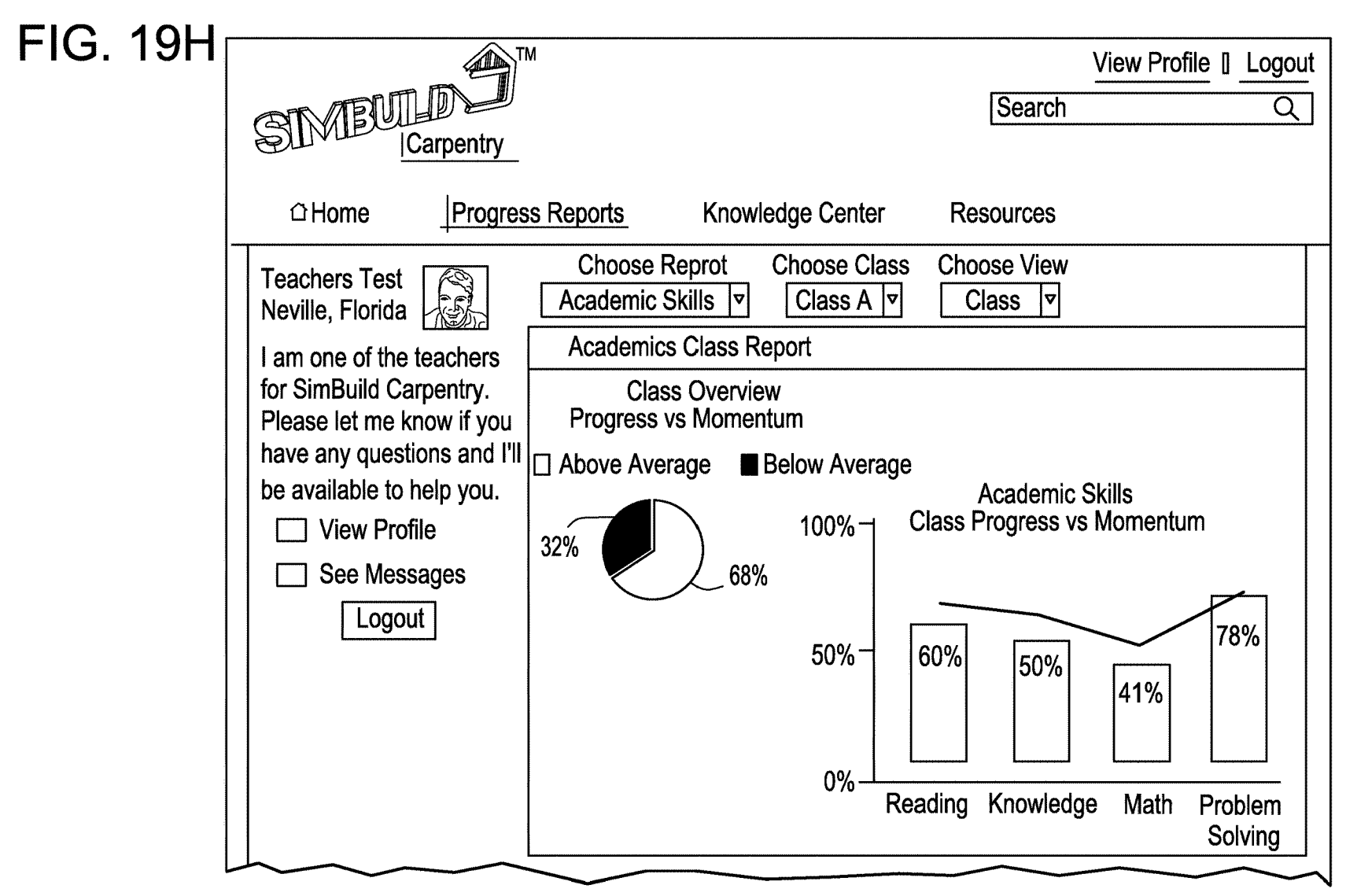
Figure 19I:
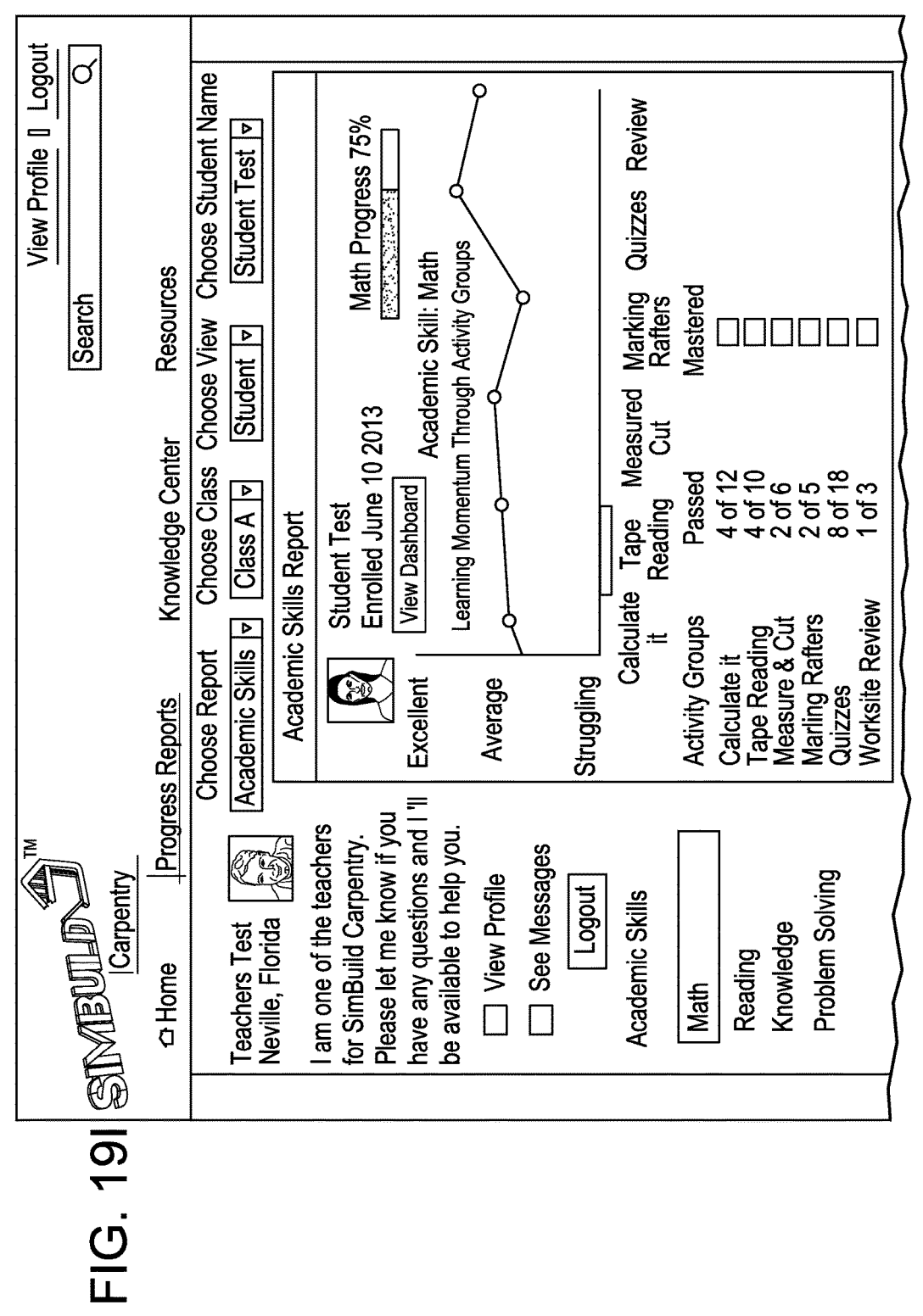

One embodiment the learning management system (LMS) 70 of the present invention exhibits GUIs to present the data and information 82 to students, teachers, and other authorized persons. Embodiments of the GUIs are illustrated in FIGS. 19A to 19I. As shown in FIGS. 19A, 19B, and 19C, a user/student's view 500 provides an overview of the user's performance in the SBC system 100. As shown in FIG. 19A, the overview includes, for example, a description of the user 502 that may be user-defined or defined by an administrator, the user's activity within the SBC system 100 at a My Activity 504 section, an achievement awards, commendations or badges 422 in a Badges Earned section 506, overall progress 508 in completing work orders 132, and progress in attaining construction-specific skills 510 and academic skills 512. As shown in FIG. 19B, the user/student may view their performance on a work site basis 520. In one embodiment, the SBC system 100 recommends resources for the student at, for example, a Suggested Resources section 514 (FIG. 19B). Similarly, the LMS 70 may be used as a platform for editing the user/student's profile at 530. In one embodiment, the LMS 70 presents a teacher's view 540 as shown in GUIs of FIGS. 19D to 19I. As shown in FIG. 19D, the teacher's view 540 may include a class progress report 550 that highlights completion 554 and learning momentum 556 of each student 552 in a class. As shown in FIGS. 19E and 19F, a progress report 560 of an individual student (FIG. 19E) and a progress report 570 of the entire class (FIG. 19F) may be presented. In one embodiment, illustrated in FIGS. 19G, 19H and 19I, the progress reports may highlight progress and competency at an activity and skill level, both individually for a user/student and for an overall class.

Additional Embodiments of the SBC Scoring System

Figure 20:
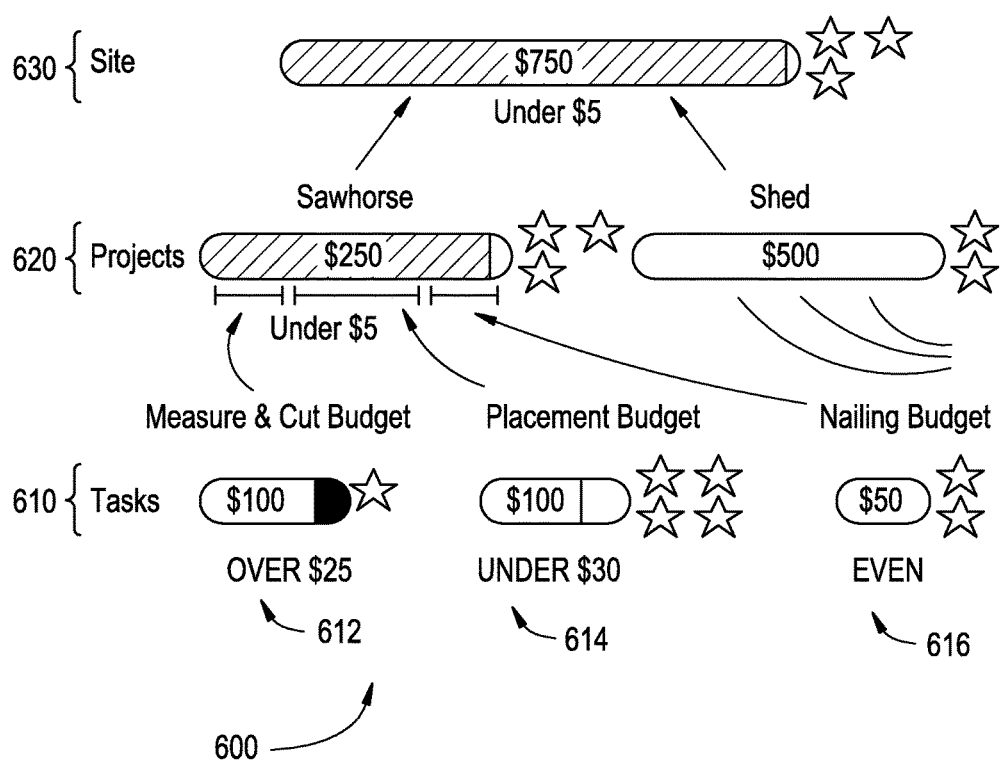
FIG. 20 is a schematic diagram of an exemplary method for scoring user/student performance, in accordance with one embodiment of the present invention.

There may be several factors that go into determining a "score" for a user in the SBC system 100. The user of the SBC system 100 may be acting as a "foreman" for various job Sites, and for each of those Sites, they manage a Budget, as well as maintain high Morale. In one embodiment, Budget and Morale are at the center of this scoring system, and they are detailed in their own sections. Everything that the user does on the job Site can affect the Budget, the Morale or both, for that Site. At the highest level, the user is trying to get maintain a Site Budget, that is, the score for a particular job Site, but there are several different "tiers" for Budgets in the SBC system 100, with lower tiers affecting the higher ones. Here is an exemplary general structure:

Site Budget—This is the highest tier score, representing how well the user performed for a particular job Site. There are multiple job Sites. The Site Score is affected by the following:

Project Budget—This represents how well the user performed on a particular Project within a work Site. Projects are collections of Tasks that need to be performed to complete a certain piece or goal on the job Site, such as completing a sawhorse, or a wall. There may be multiple Projects per job Site. FIG. 20 illustrates one method of scoring 600 in the SBC system 100 at a "Tasks" level 610, a "Projects" level 620 and a "Site" level 630.

Task Budget—This represents how well the user performed on a particular task within a Project. Tasks in SimBuild may include, for example, Measuring & Cutting 612, Placing 614, and Nailing 616.

Budget—The purpose of Budget in the scoring system is to be the final "grade" for the user. Each job Site may have a set Budget, and after all of the Projects within that Site are complete, they see where they stand against that Budget, with poor performance ending up over the set Budget, and excellent performance ending up under the set Budget.

Morale—The purpose of Morale in the scoring system is really to force the user into doing Odd Jobs, which can be any of the Tasks that would normally be inside of a Project. These Odd Jobs exist for a number of reasons: reinforcing the learning through repetition, giving the user a way to practice Tasks that they may not be good at without affecting the Budget (directly), and encouraging the user to help others that may be on the job Site with them to encourage teamwork.

The inventors have discovered that Morale works best when it has an impact on a student's final grade. Without the relationship to scoring, there will be a chance that the user ignores Morale altogether. To this end, Morale will be constantly draining, and will affect Budget in a negative way based on how low it is. There are a few ways that we can approach the specifics of how Morale affects Budget, but that will be better determined through iteration. The general idea is that low Morale affects Budget in a negative way, presumably because low Morale causes workers on the job site to perform poorly, making mistakes and wasting materials.

Morale is affected by a number of things. First and foremost it is affected by time. The Morale will drain over time (whether this is actual time or "number of actions taken by the user" is up for debate), encouraging the user to perform Odd Jobs, which also affect Morale, but they affect it in a positive way, giving a boost to Morale when completed. Identifying Safety Issues on the work Site also increases Morale. Safety Issues are hazards or improper techniques that may be present on the work Site. Failing to identify Safety Issues means that there may be a chance of a Safety Incident occurring when you leave the Site for the day. If a Safety Incident occurs, the user may take a large hit to Morale.

Site Budget: In one embodiment, this is the "final grade" for the user, based on their overall performance on a job Site. The actual "grade" that is given the user may use a star-based system (although the present invention is not limited to the star icon), where excellent performance gives 4 stars, and poor performance gives 1. Excellent performance equates to coming in under Budget, and poor performance equates to coming in over Budget. The final Budget may be determined by scores from all Projects within the Site. The Budget Target for the Site is equal to the total of all Project Budget Targets within the Site.

Project Budget: This represents how well a user did in a Project, with the end result being an adjustment to the Budget for the Site. A Project may have a Budget Target, and their performance within the Tasks for that Project may cause them to come in under or over this Budget Target, and the difference between this Budget Target and their result may determine the adjustment that is made to the Site Budget.

Task Budget—This represents how well a user did in a Task, with the end result being an adjustment to the Budget for the Project. A Task can be any of the mini-games that are included in the SBC system 100 (e.g., Measuring & Cutting, Placing, and Nailing). The user's performance in a Task may be determined by their score for the following parameters: Accuracy, Efficiency, and Safety.

SBC Lexicography

Academic Skills—Standard educational skills reinforced by performing the SBC system 100. The SBC system 100 reinforces, for example, four categories of Academic Skills, including Reading, Math, Knowledge Integration and Problem Solving. In one embodiment, each Academic Skill is represented by an Icon (e.g., see FIG. 17F).

Activity—An intuitive and easy to navigate task designed to assist the user in gaining practical building industry skills and knowledge. Activities include single challenges that the user must complete to make progress. This is a fun and engaging challenge that teaches or improves 1 or more competencies. This has a goal, and the user will be evaluated against this goal. Examples of Activities: Woodcutting, Placement, and Nailing.

Activity Types—In one embodiment, the SBC system 100 is built around groups of learning mechanics, such as Calculate, Identify, Study, Decisions, and the like, used to convey construction-specific content. Each Activity group is represented by an Icon (e.g., see FIG. 4G).

Avatar—An Avatar is a graphical representation of the user within the SBC system 100. Users can customize certain parts of their Avatar like gender, hair, clothing, footwear, skin tone, and gloves to enhance their experience.

Badges—Indicators of performance and progress in the SBC system 100 awarded for achievement in specific Activities, completion of Activity Types and progress through Worksites.

Building Systems—Work Orders are grouped to provide learning and skills related to portions of the building structure.

Construction Skills—Construction specific competencies taught by the SBC system 100 through the use of Work Orders 132. Skills are grouped by building system, and knowledge is expanded as the student progresses from one Worksite to the others 122, 124 and 126.

Foundation Skills—Accumulation of core construction-related content used throughout all building systems, specifically related to Tools, Materials, Blueprint Plans and Safety.

Garage—An entry point into the SBC system 100. Go here to personalize your Avatar, check in on your Toolbox, and view your Badges.

Hints—Guidance offered to assist the student in understanding the goals and operations of Activities and other SBC system features.

Icon—Symbols used in the SBC system 100 to indicate an Activity or Skill.

Knowledge Skills—Learned by performing Activities that require integration and application of content related to building systems, regulations, safety, tool use and terminology.

Learning Management System—The Learning Management System (LMS) 70 is a robust tool that provides both the student and instructor a complete picture of each student's mastery of activities performed and the academic skills each student develops as a result. Instructors can track student mastery as well as overall class performance.

Learning Momentum—Relationship between the student's exposure to the SBC system's content and understanding of that material.

Locks—Used to identify those Worksites, Work Orders and Activities that the student has not yet unlocked and performed. When something is locked, it means the student has not yet completed all unlocked Activities required in order to perform the locked Activity.

Mastered—Indication that the student has earned at least one Badge 422 for an Activity.

Math Skills—Learned by performing Activities that teach the student to estimate, model problems, reason and use formulas and tools.

Multilevel House Worksite—In one embodiment, a third of three Worksites in the SBC system 100. It introduces the student to complex Building Systems and Construction Skills.

Odd Job—An Activity that does not affect any Work Order. Example: find the handsaw for worker Joe.

Passed—Indication that the student successfully completed an activity.

Problem Solving Skills—Learned by performing Activities that incorporate integrating information and following procedures to perform tasks and achieve specific outcomes.

Profile—Information about the student that the SBC system 100 uses to keep track of the student's results as he/she "works" in the system.

Ranch House Worksite—In one embodiment, a second of three Worksites. It introduces the student to more detail about core Building Systems and Construction Skills.

Reading Skills—Learned by performing Activities that teach the student vocabulary and strengthen his/her ability to follow instructions, analyze situations and interpret results.

Shed Worksite—In one embodiment, a first of three Worksites in the SBC system 100. It introduces the student to core terminology and basic Construction Skills.

Skill Points—Credit for Academic Skills accumulated when the student completes an Activity.

Spacebar—Keyboard key used to start and exit an activity, or snap an object. Displayed as "Space" within the SBC system 100.

Tooltips—Information about purpose, use, physical characteristics, and safe handling of items in the Toolbox.

Toolbox 119—Where the student may go to learn about tools, materials and fasteners. Can be accessed from the Garage 104 or from any Work Order environment by moving to the Toolbox Icon.

Tools 115—Items used to perform Activities on a Worksite. Found, along with materials and fasteners, in the student's Toolbox.

Work Order—One or more Activities grouped into a unit that provides knowledge required to perform particular jobs, such as building a wall, framing a roof, and installing windows and doors. Example: build a wall section. In one embodiment, there are approximately five (5) Work Orders for the Shed, about thirty (30) work orders for the Ranch House, and about fifteen (15) work orders for the Multi-level House.

Work Order Tree 132—A way of presenting the depth and breadth of learning content within the SBC system 100, how this learning content is organized within the system and the academic skill sets targeted through each Work Order Activity. A Work Order Tree shows how mastering a particular work order activity unlocks additional work order activities for the student to perform.

Work Site—A collection of Work Orders. In one embodiment, the Work Sites in the SBC system 100 include: Shed 122, Ranch House 124, Multi-level House 126. Each construction project is made up of a group of Building Systems that are put together in the building's unique environment.

Worksite Selection Page—The Work Site Selection page, one embodiment illustrated in FIG. 4A, displays all Worksites 122, 124 and 126, and is where the student selects the system Work Orders.

Exemplary Activities Include, for Example:

Woodcutting—Activity involving measuring, marking, and cutting wood.

Placement—Activity combining referencing a blueprint and placing cut wood into the proper 3d locations.

Nailing—Activity where the uses a virtual hammer or nailgun to nail pieces of wood together.

Exemplary Work Sites include, for example:

Shed—A training ground where the user learns basic competencies. Think of this as the tutorial at the beginning of a game. The user works with walls and a floor system. The focus is on basic interactions, basic tools, precut parts, and safety. The focus is not on math skills.

Ranch House—Unlocked when the user completes all Work Orders of the Shed. The focus is on more complicated interactions than the Shed. The user completes Work Orders involving roofing, walls, window placement, door placement, and ceiling construction. The user completes Activities involving cutting, measuring, and part selection. The Ranch House does not have stairs nor a basement.

Multi-Level House—Unlocked when the user completes specific Work Orders of the Ranch House. The user completes Work Orders involving a complex roof and complex materials. The user completes Activities involving measuring and placement.

Additional Notes on an Exemplary Implementation:

In its broadest sense, in one embodiment the SBC system 100 includes essentially four chapters designed to teach the basics of construction, namely, activities performed to build a structure or interest, including carpentry, plumbing, masonry, electrical, and the like. Along the lines of and in conformance with state, town or other construction codes so a student goes through the entire process and should develop a basic understanding of everything that has to do with qualifications in carpentry. This may not be a replacement for traditional training; instead, it may be designed as an augmentation and a self paced learning activity. The difference is it uses a whole lot more of a "game-feel" environment and a whole lot more of a structure that is designed to be an engaging experience for the student and less of a straight pedagogical exercise of a bunch of things laid out end to end. It still covers all of the same material, but it covers it in a very different way. Some of the basics are divided into three (3) worksites which are a shed, a ranch house, and a multilevel house. The concept is that each one becomes a stepping stone for greater knowledge, greater complexity, and a greater understanding of the basic skills So the student finishes the shed which is essentially basic construction along with getting familiarity to the SBC system 100, then moves on to the ranch house which has some interior work and some exterior work and builds upon the basic tools, then the student ends in the multilevel house which has some more complex construction aspects such as joists and roof construction.

So a student goes through and looks at the sample orders, there is a series of about sixty (60) work orders in the simulation. The idea is to go through these work orders and give some basic concepts. The work orders present a number of icons that represent basic skill areas that are need to be qualified. For example, areas include safety, critical thinking, academic skills such as math and reading, and activities. One component includes tying these activities together with odd jobs, which are activities that occur inside the simulation that are not specific to an individual work order. One goal of odd jobs is to teach cooperation and activities that fall outside of a linear path of understanding, including job safety and cooperation with other people. The inventors have determined that cooperation is an important learning tool in the gaming environment. Each time a work order is completed; the SBC system 100 evaluates the completed order and the student's performance and provides a score. The Budget and Morale score are collective. The morale score has to do with the student's interactions with other people, not necessary, but a benefit. The budget represents the student's performance through the entire simulation. So if the student wastes material, they are going to run over budget and if you don't have enough you'll run under, and if you do things that are cooperative you tend to get a bonus on budget—it's not a dollar for dollar exchange, it's designed to keep them in a collective understanding of what they're doing with that particular work order, hence the score may be three (3) out of four (4) stars at the end. Everyone is scored individually. The SBC system 100 preferably scores activities on a one to four (1 to 4) star system, where one (1) star for an activity indicates minimally exposure to the activity and not really able to complete it, and four (4) stars for an activity includes that the student is doing great. The SBC system 100 also identifies safety issues and presents them to the user to highlight hazards on the job site.

So each student at the end of the day is graded and a student report generated. The skill assessment layout is based on state standards so as he/she completes work orders he/she gets the bars filled up and when he/she gets to the end of all sixty (60) work orders he/she should be competent on all skills and activities in the SBC system 100. This gives the student exposure to everything the state mandates that he/she needs to understand. This is the way the student looks at it. There is a small section for student commendations so student performance can be compared against other students. This encourages the students to compete just like in a video game, e.g., highest score, most safety, coolest outfit. As he/she completes certain tasks he/she gets different things to change his/her avatar and experience, thus motivating the student.

The students go through and fill each lesson. Although there is some repetition in things like nailing, for example, each lesson has a unique space to fill. Sometimes it's safety, sometimes it's blueprint reading. Once a student is here, he/she can enter the work site and start at the trailer. Interactions with the SBC system 100 are controlled by an input device, e.g., a mouse or joystick, and the student moves around the environment. There are people and some level of activity throughout the environment. As the student walks around the environment, he/she tries to complete the work orders. For example, the student picks up a work order from the trailer, then moves around the worksite through activities required to construct an exterior wall of a shed. Always follow safe worksite practices and pay attention to minimizing waste and working efficiently to keep within you project budget.

In one embodiment, the first activity is highlighted in a green area of the screen (e.g., output display device). One order has an objective to identify how much wood is needed in order to make all of the parts for the wall in the assigned work order. What the student needs to do is to estimate the number of logs that is needed based on the number of cuts needed. The idea is that the student has to go in and do the math to calculate the most efficient way to perform the cuts. The objective beyond this is to find and collect the lumber needed. "Estimate it" is the SBC system 100 function to determine how many logs to pick up to cut the needed boards. So following the work order the student moves to a next activity, measuring and cutting. What the student is trying to do now is take fourteen foot (14') planks and optimize the lumber to fill the required cuts. Keep in mind that you can re-cut the lumber to fill smaller required lengths. "Measure and Cut it" is the SBC system 100 function to measure and cut the lumber to yield the list of required cuts. The student is taught to optimize his/her cuts to minimize waste.

The next piece is where we are going to learn how to mark the toe plate. The point is for the student to mark the toe plate so he/she knows where things will go later on. The SBC system 100 may stop on a first piece of each type of cut (e.g., stud, blocking, cripple stud, jack stud) to help identify which symbol that is needed to choose to mark it with, and as it goes on, it won't stop and the student needs to select the correct symbol. This method reinforces terminology as the student learns the symbols. The student properly marks each spot to prepare the student for other activities. "Mark it" is the SBC system 100 function to mark the toe plate with correct symbols to identify where the wall sections should be placed. Students can repeat these activities as much as they need to, so if they do poorly, they want to go back until they get a preferred score, e.g., four out of four stars. Once the student marks his/her your toe plate, he/she needs to assemble it. In theory, the student now knows a little bit about toe plate markings and has an image to work off of. First thing is to choose the placing of the wall. Since this is the shed; it's a simplistic version. The same activity on the multilevel house site 126, is more complicated. Now the student can follow the markings on a map and assemble all of the pieces, using the work order and symbols that he/she learned in the last activity as a guideline. The student can optimize his/her score by using less moves to properly place the cuts, and by doing so in less time. "Place it" is the SBC system 100 function to select the location to build the wall, and then place wall sections properly as indicated with the toe plate markings.

Now that the student has laid out a wall, he/she has to nail the component parts together. Each guide is collapsing, and the student wants to push the nail gun in to the center of the guide for correct placement. As each guide collapses, the student is losing points. There is also a hard level that removes guides, enforcing proper nailing locations which are dependent on cuts of lumber. Besides efficiency, an important thing that the SBC system is enforcing is safety, making sure the students are properly nailing the lumber and taking caution in hand placement and other obstacles that might appear on the work site. The inventors have recognized that that proper placement, even when mimicked, allows the student to retain correct posture on the work site. For example, subconsciously the student picks up what the body posture and placement represent. "Nail it" is the SBC system 100 function to nail the wall together, putting nails in correct location and avoiding obstacles. Once you've completed the nailing exercise, and finished the work order, part of the theory is to show some consequential activity by, for example, erecting the wall.

As mentioned before, students can move around the work site to complete odd jobs. Again, this is not required to complete the work order. In this case, the student moves around and spot hazards such as a hammer lying on the ground, any workers without the proper personal protective equipment (PPE), but we are just trying to get to thinking about seeing what's out there. Safety is threaded through the entire SBC system 100, as a way of reinforcing and building awareness so that students come away from using the system 100 and to go into the real world saying "I have to have to control the work site" and in the larger context of what, morale goes down as accidents occur on the worksite. In one embodiment, the SBC system 100 provides a graphic display, e.g., a simulated worksite sign, counting days from a last accident. The sign keeps track of incidences and if a safe work site is not maintained, the system 100 automatically scores against it. This feature may also be included on the student report. So again, the idea is to reinforce a basic method, primarily through repetition with a variety of activities. Since its self paced, the idea is that the students can go in and do this and get them working towards earning perfect scores (e.g., four out of four stars) in everything. "Hazard Odd Job" is the SBC system 100 function where one of the workers has spotted safety hazards around the worksite, and he/she needs the student's help to find and remove them.

The several embodiments described herein are solely for the purpose of illustration. Persons in the art will recognize from this description that other embodiments may be practiced with modifications and alterations, limited only by the appended claim.

What is claimed is:

1. A skill-based training system, comprising:
   a processing system including:
   a processor;
   a memory operatively coupled to the processor with executable program instructions stored therein, the memory including a learning management system having lesson plans outlining skill-based tasks and activities therein within a plurality of increasing degrees of skill, a work order system including a plurality of work orders in accordance with at least one of the lesson plans, each work order of the plurality of work orders assigning at least one of the skill-based tasks and activities, each work order of the plurality of work orders including instructions specifying a plurality of intermediate steps within the at least one of the lesson plans for performing the at least one of the skill-based tasks and activities, the instructions configured to be graphically presented to the user, and predetermined performance criteria for the skill-based tasks and activities, the predetermined performance criteria including a first standard of acceptable performance set by at least one of an industry, a company, an educational institution, and a municipal or governmental certification authority; and
   an input-output controller operatively coupled to the processor and to one or more input and output devices, the input and output devices facilitating input and output of data and information to and from the processor;
   the processor configured, by the executable program instructions, to:
   present a plurality of graphical user interfaces (GUIs) on at least one of the output devices simulating an immersive virtual reality training environment;
   present an avatar within the immersive virtual reality training environment, the avatar graphically representing a user within the immersive virtual reality training environment, the user operating at least one of the input devices to control a position of the avatar within the immersive virtual reality training environment and at least one action of the avatar within the immersive virtual reality training environment;
   present graphically to the avatar one of the plurality of work orders and simulate a real life work site by requesting the avatar perform the instructions included in the presented work order;
   receive input signals from the at least one of the input devices, the input signals representative of the user navigating the avatar's position through the immersive virtual reality training environment and manipulating the avatar to cause the at least one action of the avatar thereby performing within the immersive virtual reality training environment the presented instructions to complete the at least one of the skill-based tasks and activities as assigned by the presented work order;
   monitor and evaluate the user's performance of the presented instructions as the user completes the presented work order and the at least one of the skill-based tasks and activities, by comparing the performed at least one of the tasks and activities to the predetermined performance criteria;
   monitor and evaluate the user's performance in terms of the user's progress in completion of the performed at least one of the skill-based tasks and activities as assigned by each presented and performed work order and specified by the instructions included in each presented and performed work order, and in terms of the user's progress in completion of the plurality of work orders in accordance with the at least one lesson plan;
   monitor and evaluate the user's performance in terms of the user's progress toward acceptable performance of the performed at least one of the skill-based tasks and activities in accordance with the predetermined performance criteria and the first standard;
   determine a score based on the user's performance in terms of the user's progress toward acceptable performance of the at least one of the skill-based tasks and activities, in terms of the user's progress in completion of each presented and performed work order, and in terms of the user's progress in completion of the plurality of work orders in accordance with the at least one lesson plan;
   provide the determined score to the learning management system; and
   present on the at least one of the output devices, within the learning management system, the score of the user's progress toward acceptable performance of the performed at least one of the skill-based tasks and activities, of the user's progress in completion of each presented and performed work order and of the user's progress in completion of the plurality of work orders in accordance with the at least one lesson plan, as an indication of the user's activity in the system and of the knowledge retained by the user and to motivate the user to seek continuing improvement of their skills.

2. The skill-based training system of claim 1, wherein:
   the predetermined performance criteria further includes a plurality of second standards for accuracy, elapsed time, material usage, personal safety and work area safety measures; and
   determining the score includes determining the user's progress toward acceptable performance under the first standard and at least one of the plurality of second standards.

3. The skill-based training system of claim 1, wherein:
   the predetermined performance criteria further includes at least one of a predetermined or calculated budget for performance of the at least one of the plurality of work orders and each of the at least one of the skill-based tasks and activities included therein; and the processor is further configured, by the executable program instructions, to monitor and evaluate the user's performance of the performed at least one of the skill-based tasks and activities and of each presented and performed work order within the budget.

4. The skill-based training system of claim 1, wherein the plurality of work orders and the lesson plans include the skill-based tasks and activities defined within an increasing progression of a degree of at least one of skill, knowledge, critical thinking and problem solving needed to complete the tasks and activities.

5. The skill-based training system of claim 4, wherein the lesson plans and the work order system are implemented within a plurality of work areas exhibited on one or more of the plurality of graphical user interfaces (GUIs) including a basic-skills work area, an intermediate-skills work area and an advanced-skills work area.

6. The skill-based training system of claim 5, wherein the lesson plans and the plurality of work areas are defined within a residential construction environment.

7. The skill-based training system of claim 6, wherein the plurality of work orders and the skill-based tasks and activities included therein demonstrate, teach and reinforce skills within at least one of a carpentry, plumbing, electrical, masonry, heating, cooling and air conditioning (HVAC), flooring, painting, roofing, and other skill-based trade disciplines.

8. The skill-based training system of claim 4, wherein the plurality of work orders further includes tools to be used in performing the skill-based tasks and activities.

9. The skill-based training system of claim 4, wherein the lesson plans, the plurality of work orders and the skill-based tasks and activities included therein reinforce general academic skills including reading comprehension, mathematics, knowledge interpretation and retention, and complex thinking.

10. The skill-based training system of claim 4, further including a plurality of odd job activities as supplements to the instructions.

11. The skill-based training system of claim 1, wherein the first standard is an academic standard set by at least one of an industry, a company, an educational institution, and a municipal or governmental certification authority.

12. The skill-based training system of claim 11, wherein the score includes an indication of progress in successfully obtaining the academic standard.

13. The skill-based training system of claim 1, wherein when the score at least one of meets or exceeds one or more predetermined thresholds, the processor is further configured, by the executable program instructions, to issue at least one of an award, a commendation and a badge.

14. The skill-based training system of claim 13, wherein the at least one of an award, commendation and badge is exhibited in an area of the learning management system on one or more of the plurality of graphical user interfaces (GUIs) associated with a user of the training system.

15. The skill-based training system of claim 13, wherein at least one of the score and the at least one of an award, commendation and badge is published by the user on a social networking website operatively coupled to the training system.

16. The skill-based training system of claim 1, wherein the learning management system further includes data and information associated with a user of the training system and the user's performance of each presented and performed work order including an indication of the number of lesson plans and work orders completed by the user, an indication of the number of lesson plans and work orders completed for which an acceptable score was received by the user, an indication of learning momentum of the user performing each presented and performed work order, wherein the learning momentum is indicative of frequency and/or regularity of the user's activity in the system and the knowledge retained by the user, an indication of the number and types of tools used by the user in performing each presented and performed work order, and an indication in progress of the user toward receiving an accreditation for successfully completing the at least one of the plurality of work orders.

17. The skill-based training system of claim 1, wherein during the performance of the at least one of the skill-based tasks and activities, the processor is further configured, by the executable program instructions, to exhibit on one of the plurality of graphical user interfaces (GUIs) at least one of a visual aid and a tip to guide and instruct the user of the training system as the user performs the presented instructions to complete the presented work order and the at least one of the skill-based tasks and activities.

18. The skill-based training system of claim 17, wherein the at least one visual aid and tip includes at least one of a proper placement of a component, a proper alignment in terms of height, pitch and angle of the component, a proper speed and angle of a tool used in performance of the presented instructions, and a movement of the component being worked.

19. The skill-based training system of claim 18, wherein the visual aid includes at least one of a phantom and a shaded representation of the component or tool exhibited on the one of the plurality of graphical user interfaces (GUIs), and the tip includes at least one of an audio, video, text, graphics, one or more hyper-links, for communicating information to the user, the information exhibited on the one of the plurality of GUIs.

20. The skill-based training system of claim 1, the processor further configured, by the executable program instructions, to:
analyze the performance of a plurality of users of the presented instructions to complete the presented work order and the at least one of the skill-based tasks and activities by identifying deficiencies in the users' performance; and
recommend modifications to at least one of the lesson plans.

21. The skill-based training system of claim 1, the processor further configured, by the executable program instructions, to:
introduce a random interruption during performance of the presented instructions to complete the presented work order and the at least one of the skill-based tasks and activities; and
further monitor and evaluate the user's performance of the at least one of the skill-based tasks and activities during and after the interruption.

22. The skill-based training system of claim 9, wherein the odd jobs include one or more tasks not specified by the plurality of work orders.

23. The skill-based training system of claim 9, wherein the odd jobs include tasks related to job safety.

24. The skill-based training system of claim 1, wherein the score is based on a number of safety hazards in the immersive virtual reality training environment identified by the user.

25. The skill-based training system of claim 22, wherein the processor is configured to determine the score based on a number of the odd jobs completed by the user.

26. The skill-based training system of claim 1, wherein the training environment includes a plurality of worksites, each of the plurality of worksites having a respective lesson plan associated with a different degree of difficulty.

27. The skill-based training system of claim 25, wherein each of the plurality of worksites are located at a different location within the immersive virtual reality training environment.

28. The skill-based training system of claim 1, wherein the score is determined based on an amount of waste generated by the user in performing the presented instructions to complete the presented work order and the at least one of the skill-based tasks and activities.

29. A skill-based training system, comprising:
a processing system including a processor and a memory operatively coupled to the processor with executable program instructions stored therein, the processing system including:
a learning management system having one or more lesson plans outlining skill-based tasks and activities therein; and
a work order system including a plurality of work orders in accordance with at least one of the lesson plans, each work order of the plurality of work orders assigning at least one of the skill-based tasks and activities and including instructions specifying a plurality of intermediate steps within at least one of the lesson plans for performing the at least one of the skill-based tasks and activities, the instructions configured to be graphically presented to the user;
the processor configured, by the executable program instructions, to:
simulate an immersive virtual reality training environment;
present an avatar within the immersive virtual reality training environment, the avatar graphically representing a user within the immersive virtual reality training environment, the user operating at least one of the input devices to control a position of the avatar and at least one action of the avatar within the immersive virtual reality training environment, thereby performing within the immersive virtual reality training environment at least one of the skill-based tasks and activities;
present graphically to the avatar one of the plurality of work orders and simulate a real life work site by requesting the avatar perform the instructions included in the presented work order;
monitor and evaluate the user's performance of the presented instructions assigned by each presented work order, as the user performs the at least one of the skill-based tasks and activities, by comparing the performed at least one of the skill-based tasks and activities to predetermined performance criteria, the predetermined performance criteria including a standard of acceptable performance of the skill-based tasks and activities and the intermediate steps specified by each presented and performed work order, the standard of acceptable performance set by at least one of an industry, a company, an educational institution, and a municipal or governmental certification authority;
monitor and evaluate the user's performance in terms of the user's progress in completion of the performed at least one of the skill-based tasks and activities as assigned by each presented and performed work order and specified by the presented instructions included in each presented and performed work order, and in terms of the user's progress in completion of the plurality of work orders in accordance with the at least one lesson plan;
generate a result of the monitoring and evaluating of the user's performance of the at least one of the skill-based tasks and activities, the user's progress in completion of the presented and performed at least one of the skill-based tasks and activities and the user's progress in completion of the plurality of work orders in accordance with the at least one lesson plan, as an indication of the user's activity in the system and to motivate the user to seek continuing improvement of their skills.

* * * * *